(12) United States Patent
Kuroi et al.

(10) Patent No.: US 8,043,918 B2
(45) Date of Patent: Oct. 25, 2011

(54) SEMICONDUCTOR DEVICE AND ITS MANUFACTURING METHOD

(75) Inventors: Takashi Kuroi, Tokyo (JP); Katsuyuki Horita, Tokyo (JP); Masashi Kitazawa, Tokyo (JP); Masato Ishibashi, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/840,430

(22) Filed: Jul. 21, 2010

(65) Prior Publication Data

US 2010/0285651 A1 Nov. 11, 2010

Related U.S. Application Data

(62) Division of application No. 11/577,878, filed as application No. PCT/JP2005/019141 on Oct. 18, 2005, now Pat. No. 7,791,163.

(30) Foreign Application Priority Data

Oct. 25, 2004 (JP) ................................. 2004-310151

(51) Int. Cl.
*H01L 21/336* (2006.01)
(52) U.S. Cl. ................. 438/296; 438/437; 257/E21.546
(58) Field of Classification Search .................... 438/437
See application file for complete search history.

(56) References Cited

U.S. PATENT DOCUMENTS

| 4,661,202 A | 4/1987 | Ochii |
| 4,833,098 A | 5/1989 | Kato |
| 6,133,116 A | 10/2000 | Kim et al. |
| 6,777,307 B1 * | 8/2004 | Ramkumar et al. .......... 438/437 |
| 6,794,468 B1 | 9/2004 | Wang |
| 2003/0209776 A1 | 11/2003 | Desko et al. |

FOREIGN PATENT DOCUMENTS

| CN | 1241027 A | 1/2000 |
| JP | 6-232248 | 8/1994 |
| JP | 2000-31268 | 1/2000 |
| JP | 2001-148418 | 5/2001 |
| JP | 2002-43534 | 2/2002 |

* cited by examiner

*Primary Examiner* — Chandra Chaudhari
(74) *Attorney, Agent, or Firm* — Oblon, Spivak, McClelland, Maier & Neustadt, L.L.P.

(57) ABSTRACT

To manufacture in high productivity a semiconductor device capable of securely achieving element isolation by a trench-type element isolation and capable of effectively preventing potentials of adjacent elements from affecting other nodes, a method of manufacturing the semiconductor device includes: a step of forming a first layer on a substrate; a step of forming a trench by etching the first layer and the substrate; a step of thermally oxidizing an inner wall of the trench; a step of depositing a first conductive film having a film thickness equal to or larger than one half of the trench width of the trench on the substrate including the trench; a step of removing a first conductive film from the first layer by a CMP method and keeping the first conductive film left in only the trench; a step of anisotropically etching the first conductive film within the trench to adjust the height of the conductive film to become lower than the height of the surface of the substrate; a step of depositing an insulating film on the first conductive film by the CVD method to embed the upper part of the first conductive film within the trench; a step of flattening the insulating film by the CMP method; and a step of removing the first layer.

19 Claims, 46 Drawing Sheets

SEMICONDUCTOR DEVICE AND ITS MANUFACTURING METHOD

REFERENCE TO RELATED APPLICATION

The present application is a Divisional of U.S. Ser. No. 11/577,878, filed Apr. 25, 2007, pending, the entire contents of which are hereby incorporated by reference.

TECHNICAL FIELD

The present invention relates to a semiconductor device and a manufacturing method thereof, and more particularly, to a semiconductor device having a trench-type element isolation structure and a manufacturing method thereof.

BACKGROUND ART

In a semiconductor integrated circuit, to control individual elements in a completely independent state by avoiding electrical interference between the elements during the operation, an element isolation structure having an element isolation region needs to be formed. As one of methods of forming such an element isolation region, trench isolation is widely known, and various improved methods have been devised.

The trench isolation method is a method of forming a trench on a substrate and filling the trench with an insulator. Because a bird's beak hardly occurs, this method can be an effective element isolation method in miniaturizing a semiconductor integrated circuit. On the other hand, it is pointed out that along the miniaturization of elements, potentials of adjacent elements affect other nodes via an embedded oxide film. To cope with this problem, a method of embedding a conductive film into the trench has been proposed.

A conventional semiconductor device and a conventional manufacturing method having a conductive film embedded in the trenches are explained with reference to FIG. 39 to FIG. 44. As shown in FIG. 39 and FIG. 40, in the conventional semiconductor device, a polysilicon film 104 is filled in a trench 102 formed in a semiconductor substrate 101, via a silicon oxide film 103. A cap oxide film 111 is formed on the polysilicon film 104 inside the trench 102. A gate electrode 107 is formed in an active region of an element via a gate insulating film 106, and a source/drain diffusion layer 108 is formed via a channel region beneath the gate electrode 107. A sidewall 115 is formed on a side surface of the gate electrode 107.

The conventional method of manufacturing a semiconductor device is explained next. A silicon oxide film 109 and a silicon nitride film 110 are formed in this order on the semiconductor substrate 101. The silicon nitride film 110 and the silicon oxide film 109 are patterned, using a photoengraved pattern as a mask formed by a photoengraving technique and a dry etching technique, to form the trench 102 on the semiconductor substrate 101 as shown in FIG. 40.

After the trench 102 is formed, the surface of the inner wall of the trench 102 is thermal oxidized to remove the inner wall of the trench 102, that is, damaged parts of the inner surface and a bottom surface. The silicon oxide film 103 is formed on the inner wall of the trench 102 as shown in FIG. 41. Further, the polysilicon film 104 doped with phosphor is deposited on the entire surface of the semiconductor substrate 101 according to a CVD (chemical vapor deposition) method. A part of the polysilicon film 104 on the silicon nitride film 110 and in the trench 102 is removed by the anisotropic etching as shown in FIG. 42.

The polysilicon film 104 in the trench 102 is oxidized by thermal oxidation to form the cap oxide film 111 as shown in FIG. 43. The silicon nitride film 110 is removed, and the silicon oxide film 109 is removed to complete a trench-type element isolation structure as shown in FIG. 44. Thereafter, a well region, a channel cut region, and a channel impurity layer to control a threshold voltage are formed by the ion implantation method, following the known MOSFET (Metal Oxide Semiconductor Field Effect Transistor) formation process. The gate insulating film 106 is formed on the semiconductor substrate 101, and the gate electrode 107 is formed on the gate insulating film 106. The source/drain diffusion layer 108 is formed by the ion implantation method, and the sidewall 115 is formed to complete the semiconductor device as shown in FIG. 39.

Patent Document 1: Japanese Patent Application Laid-open No. H6-232248
Patent Document 2: Japanese Patent Application Laid-open No. 2001-148418

DISCLOSURE OF INVENTION

Problem to be Solved by the Invention

However, according to the above conventional technique, to avoid an electrical short-circuit between the polysilicon film 104 filled in the semiconductor substrate 101 and the gate electrode 107, the surface of the polysilicon film 104 is oxidized to form the cap oxide film 111. In this oxidation process, oxidation is progressed not only on the surface of the polysilicon film 104 but also in a lateral direction, which is in a direction approximately parallel with an in-plane direction of the semiconductor substrate 101. As a result, the semiconductor substrate 101 is also oxidized. The oxidation in the lateral direction of the semiconductor substrate 101 causes what is called bird's beak which decrease the width of the active region of the element, and decreases a contact margin between the contact and the active region, thereby decreasing the driving capacity of transistors.

The thermal oxidation changes the volume of the semiconductor substrate 101 and the polysilicon film 104, and generates stress in the semiconductor substrate 101 and the polysilicon film 104. The occurrence of this stress generates a crystal defect, generates a junction leak current due to a change in a band gap, and decreases productivity of the elements.

According to the conventional technique, in the area having a large trench width of the trench 102, the polysilicon film 104 of the bottom of the trench is also removed at the time of performing the anistropic etching of the polysilicon film 104. As a result, this shape is reflected to generate a gap at the time of performing post-oxidation process. This gap generates an etching residual at the time of forming a gate electrode at a later sage, thereby decreasing productivity. To avoid this problem, a layout of not forming a trench of a large width becomes necessary, and this limits the layout.

In fixing the potential of the conductive film, the conductive film needs to be connected to a wiring layer via the contact, and the trench 102 requires an area of a large trench width. However, because of the above reason, it is difficult to form a trench having a large trench width. In the region having a large trench width, the polysilicon film 104 remains on only the sidewall in the trench. In the post-oxidation process, the sidewall of the polysilicon film 104 is also oxidized, and the polysilicon film 104 becomes thin or is lost.

Depending on the element isolation method such as a method of combining a field oxide film with an element isolation trench, for example, polysilicon is embedded in the trench (for example, see Patent Document 1). However, because this semiconductor device is combined with a field oxide film, this semiconductor device is not suitable for miniaturization and cannot be used for the current semiconductor circuit having high integration. Further, volume expansion due to the oxidation of the cap layer generates a crystal defect, and has a problem similar to the above. To prevent expansion of bird's beak, a silicon nitride film needs to be formed and removed. Due to the increase in the number of steps, cost increases.

A conventional semiconductor device using the trench isolation method includes a trench isolation structure including a trench formed on the surface of a semiconductor substrate, a conductor disposed in the trench and having a crest at a position deeper than a deepest part of a source/drain layer, an insulating film disposed between a side surface of the conductor and the trench, and an insulator that fills the trench at an upper part of the conductor (for example, see Patent Document 2). However, in this semiconductor device, on the sidewall of the trench, the upper end of the conductor becomes lower than the lower end of the source/drain region. Therefore, interference of potentials between high-concentration regions cannot be sufficiently suppressed. Further, the Patent Document 2 does not refer to the problem at all that the conductor becomes thin or is lost in the element isolation region having a large trench width.

The present invention has been achieved to solve the above problems, and it is an object of the present invention to provide a semiconductor device capable of securely isolating elements by a trench-type element isolation structure and effectively preventing potentials of adjacent elements from affecting other nodes, and a method of manufacturing a semiconductor device capable of manufacturing the semiconductor device with high productivity.

Means for Solving Problem

To solve the problems and achieve the object mentioned above, according to the present invention, a method of manufacturing a semiconductor device for forming a trench-type element isolation structure on a semiconductor substrate, includes a first-layer forming step of forming a first layer on the substrate, a trench forming step of forming a trench by etching the first layer and the substrate, a thermal oxidizing step of thermally oxidizing an inner wall of the trench, a conductive-film depositing step of depositing a first conductive film having a film thickness equal to or larger than one half of trench width of the trench on the semiconductor substrate including the trench, a conductive-film removing step of removing the first conductive film from the first layer by a CMP method such that the first conductive film remains in only the trench, an adjusting step of anisotropically etching the first conductive film in the trench to adjust height of the conductive film to be lower than height of a surface of the substrate, an insulating film depositing step of depositing an insulating film on the first conductive film by a CVD method to cover an upper part of the first conductive film in the trench, a flattening step of flattening the insulating film by the CMP method, and a removing step of removing the first layer.

According to the present invention, an insulating film is formed on the conductive film by not thermal oxidation but by the CVD method. Further, in the present invention, a conductive film of one half or more of a minimum trench width is deposited on the substrate including the inside of the trench. With this arrangement, a bird's beak does not occur, and stress of the substrate and the conductive film attributable to thermal oxidation does not occur. Accordingly, a decrease in the width of the active region due to bird's beak is prevented. Further, occurrence of a crystal defect and occurrence of a junction leak current attributable to the occurrence of the stress in the substrate and the conductive film can be decreased. A conductive film can be reliably secured along the inner wall of the trench having a large trench width, and the thinning or loss of the conductive film due to oxidation can be prevented. As a result, potentials of adjacent elements can be prevented from affecting other nodes.

According to the present invention, an oxide film is deposited by the CVD method to form an insulating film, and a flattening technique according to the CMP method is used. Therefore, the surface of the insulating film is securely flattened, without generating a gap.

EFFECT OF THE INVENTION

According to the present invention, it is possible to obtain a semiconductor device capable of stably and securely performing element isolation and capable of effectively preventing potentials of adjacent elements from affecting other nodes, and a method of manufacturing this semiconductor in high productivity.

EXPLANATIONS OF LETTERS OR NUMERALS

Figure 1:
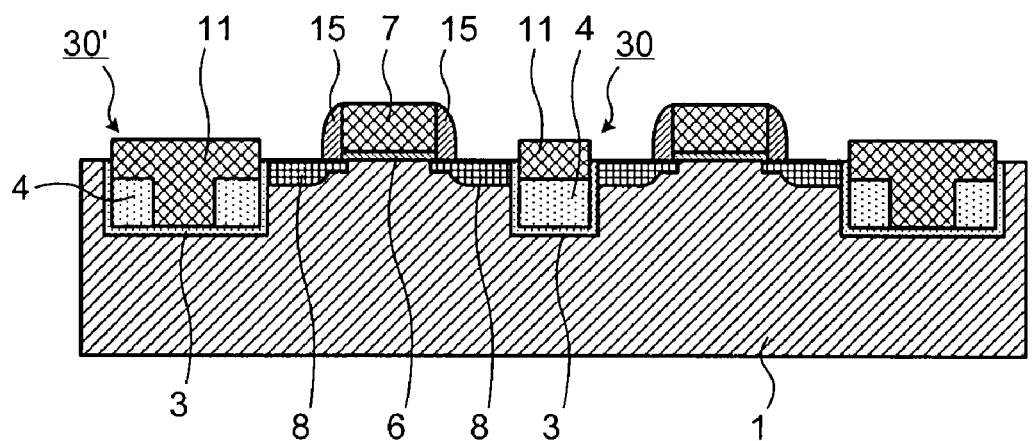
FIG. 1 is a cross-sectional view of a schematic configuration of a semiconductor device according to a first embodiment.

1 Silicon substrate
2 Trench
3 Silicon oxide film
4 Polysilicon film
5 Silicon oxide film
6 Gate insulating film
7 Gate electrode
8 Source/drain diffusion layer
9 Silicon oxide film
10 Silicon nitride film
11 Cap oxide film
12 Interlayer insulating film
13 Contact hole
14 wiring layer
15 Sidewall
30 Trench-type element isolation structure
30' Trench-type element isolation structure
40 Trench-type element isolation structure
101 Semiconductor substrate
102 Trench
103 Silicon oxide film
104 Polysilicon film
106 Gate insulating film
107 Gate electrode
108 Source/drain diffusion layer
109 Silicon oxide film
110 Silicon nitride film
111 Cap oxide film
115 Sidewall

BEST MODE(S) FOR CARRYING OUT THE INVENTION

Exemplary embodiments of a semiconductor device and a manufacturing method thereof according to the present invention will be explained below in detail with reference to the accompanying drawings. Note that the present invention is not limited to the embodiments, and modifications can be appropriately made without departing from the scope of the present invention.

First Embodiment

FIG. 1 is a cross-sectional view of a schematic configuration of a semiconductor device according to a first embodiment of the present invention. The semiconductor device includes thin trench-type element isolation structures 30, 30' having a polysilicon film 4 as a conductive film disposed, via a silicon oxide film 3, in a trench 2 formed in a silicon substrate 1 as a semiconductor substrate. The trench-type element isolation structure 30 includes the polysilicon film 4 formed in the trench 2 on the entire bottom surface of the trench 2 over the total trench width. The trench-type element isolation structure 30' includes the polysilicon film 4 formed in the trench 2 only on the sidewall sides on the bottom surface of the trench 2. The polysilicon film 4 is not present near an approximate center of the bottom surface of the trench 2.

In the trench-type element isolation structure 30, the height of the polysilicon film 4 is lower than the surface of the silicon substrate 1. In the trench-type element isolation structure 30', a film thickness of the polysilicon film 4 in a lateral direction is constant, and a height of the polysilicon film 4 is lower than the surface of the silicon substrate 1. In the trench-type element isolation structure 30', the film thickness of the polysilicon film 4 in a lateral direction is at least equal to one half of the minimum trench width of the trench 2. In the trench-type element isolation structures 30, 30', the height of the polysilicon film 4 is substantially constant in the entire trench-type element isolation structures 30, 30', regardless of the width of the trench-type element isolation structure or the trench width of the trench 2. However, the height of the remaining polysilicon film 4 usually varies by about ±10% due to a variation in a manufacturing method such as a film formation, CMP, and etching described later.

In the trench-type element isolation structures 30, 30', a cap oxide film 11 including a silicon oxide film formed by the CVD method is formed on the polysilicon film 4. Therefore, in the trench-type element isolation structures 30, 30', a bird's beak is not present in the cap oxide film 11.

In the active region of elements, a gate electrode 7 is formed on the silicon substrate 1 via a gate insulating film 6. In the active region, there is also formed a source/drain diffusion layer 8 including a low-concentration impurity diffusion layer self-aligned with the gate electrode 7 via a channel region beneath the gate electrode 7, and a high-concentration impurity diffusion layer formed at a deeper position self-aligned with the gate electrode and the sidewall. The surface of the polysilicon film 4 filled in the trench is lower than the surface of the substrate, and is higher than the lower end of the high-concentration source/drain diffusion layer 8 on the sidewall of the trench.

In the semiconductor device according to the present embodiment, the cap oxide film 11 is formed by the CVD method and not by thermal oxidation. Therefore, a bird's beak is not present in the cap oxide film 11. Accordingly, a reduction in the width of the active region due to the expansion of the cap oxide film 11 to a lateral direction can be prevented. As a result, a conversion difference between a preset shape pattern of a semiconductor device and an actual shape pattern of a manufactured semiconductor device becomes very small. A reduction in the contact margin of a contact between the contact and the active region and a reduction in the driving capacity of transistors can be prevented, which improves the operation speed and productivity. Therefore, a high-quality semiconductor device can be provided.

In the semiconductor device according to the present embodiment, the cap oxide film 11 is formed without using oxidation process. Therefore, there is no stress in the semiconductor substrate 1 and the polysilicon film 4 attributable to the oxidation process in the semiconductor substrate 1 and the polysilicon film 4. Consequently, in the semiconductor device according to the present embodiment, it is possible to prevent the occurrence of a crystal defect due to the oxidation process of the semiconductor substrate 1 and the polysilicon film 4, and the occurrence of a junction leak current due to a change in band gap attributable to the occurrence of the stress. Therefore, in this semiconductor device, productivity of semiconductor elements can be improved. In other words, a semiconductor device excellent in quality and productivity can be realized.

In the semiconductor device according to the present embodiment, the cap oxide film 11 is formed by depositing an oxide film by the CVD method. Therefore, it is possible to prevent thinning or loss of a polysilicon film that is present on the inner wall of the trench having a large trench width. Consequently, reduction in the element isolation capacity attributable to the thinning or loss of the polysilicon film in the trench can be securely prevented. Accordingly, a high-quality semiconductor device capable of stably and effectively performing element isolation can be realized.

In the trench-type element isolation structure 30', the polysilicon film 4 has a film thickness in a lateral direction at least equal to one half of the minimum trench width of the trench 2. Therefore, thinning or loss of the polysilicon film present on the inner wall of the trench having a large trench width can be prevented. Consequently, reduction in the element isolation capacity attributable to the thinning or loss of the polysilicon film in the trench can be securely prevented. Accordingly, a high-quality semiconductor device capable of stably and effectively performing element isolation can be realized.

In the semiconductor device according to the present embodiment, the surface of the polysilicon film 4 is higher than the lower end of the source/drain diffusion layer 8 on the sidewall of the trench. Therefore, when potentials of adjacent high-concentration source/drain diffusion layers are different, it is possible to effectively suppress the electric field of one diffusion layer from changing the potential of the other diffusion layer. In the present embodiment, high concentration means the concentration in which the impurity diffusion layer functions as a source and drain. For example, the high concentration means that the concentration of arsenic and phosphor in the case of an NMOS and the concentration of boron in the case of a PMOS are equal to or higher than $1 \times 10^{20}/cm^3$. Low concentration is lower than this level by about one digit.

A method of manufacturing a semiconductor device according to the present embodiment is explained with reference to the drawings.

Figure 2:
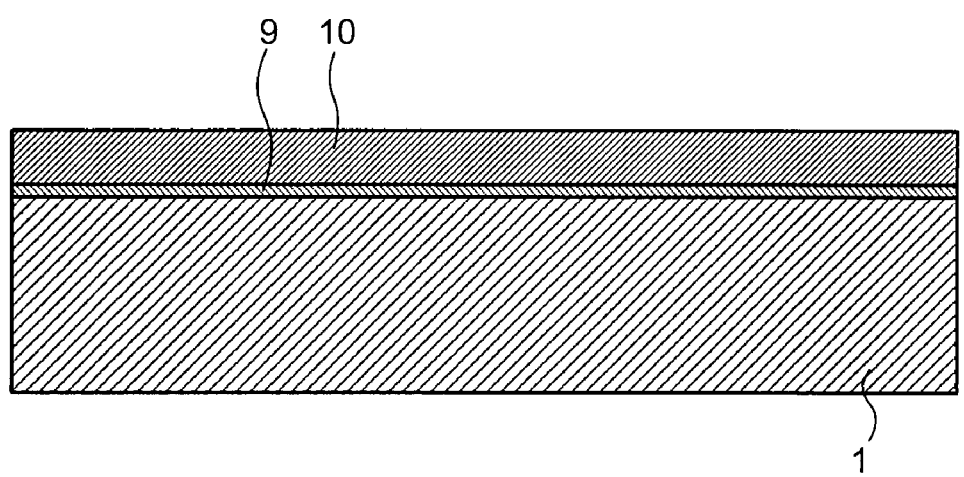
FIG. 2 is a cross-sectional view for explaining a process of manufacturing the semiconductor device according to the first embodiment.
Figure 3:
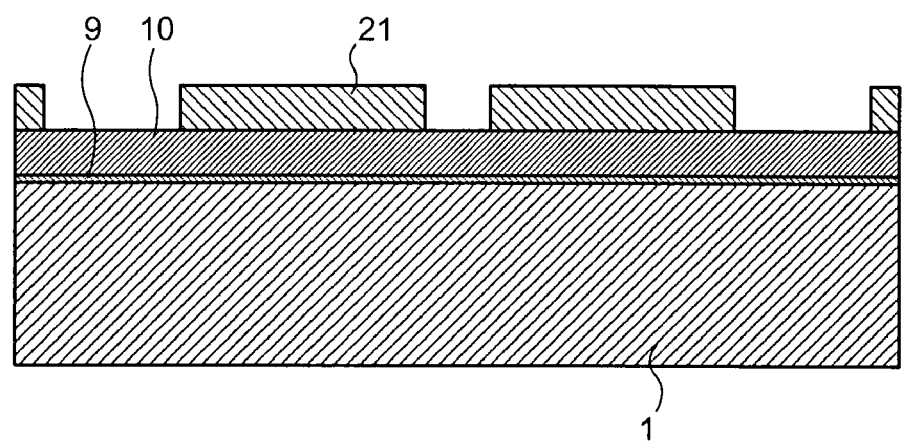
FIG. 3 is a cross-sectional view for explaining a process of manufacturing the semiconductor device according to the first embodiment.
Figure 4:
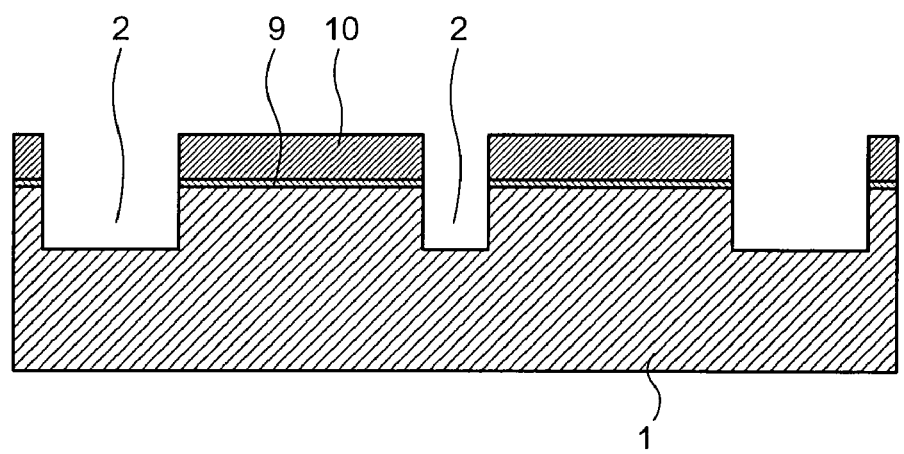
FIG. 4 is a cross-sectional view for explaining a process of manufacturing the semiconductor device according to the first embodiment.

First, as shown in FIG. 2, the upper surface of the silicon substrate 1 is thermal oxidized to form a silicon oxide film 9 in a film thickness of about 5 nanometers to 30 nanometers. Next, as shown in FIG. 2, a silicon nitride film 10 is formed in a film thickness of about 50 nanometers to 200 nanometers, on the silicon oxide film 9. A photoresist 21 is patterned to form an opening in which a trench is to be formed, using a photoengraving technique and a dry etching technique, as shown in FIG. 3. The silicon nitride film 10, the silicon oxide film 9, and the silicon substrate 1 are anisotropically etched to form the trench 2, using the photoresist 21 as a mask, and the photoresist 21 is removed. FIG. 4 depicts a state after the photoresist 21 is removed. The trench 2 has a depth of about 150 nanometers to 500 nanometers from the substrate surface.

Figure 5:
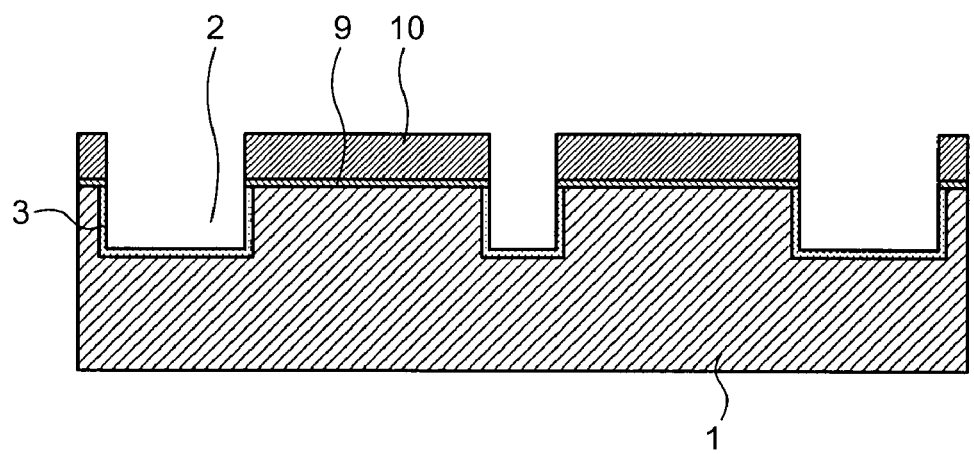
FIG. 5 is a cross-sectional view for explaining a process of manufacturing the semiconductor device according to the first embodiment.

After the trench 2 is formed, the surface of the inner wall of the trench 2 is thermal oxidized to remove damaged parts of the inner wall of the trench 2, that is, the inner surface and the bottom surface of the trench 2. At the same time, as shown in FIG. 5, the silicon oxide film 3 as an inner wall oxide film or as a protection film is formed on the inner wall of the trench 2. This silicon oxide film 3 is formed in a thickness of about 5 nanometers to 30 nanometers.

Figure 6:
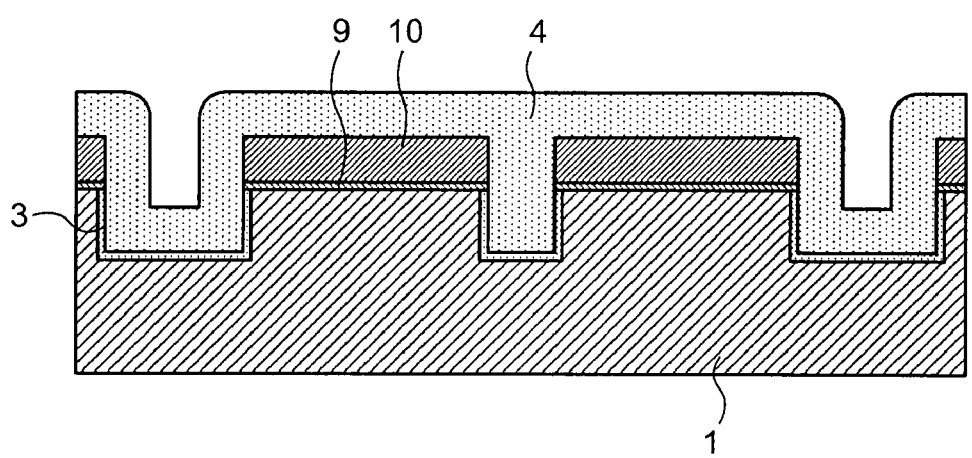
FIG. 6 is a cross-sectional view for explaining a process of manufacturing the semiconductor device according to the first embodiment.

As shown in FIG. 6, the polysilicon film 4 doped with phosphor is deposited in a film thickness of equal to or larger than one half of a minimum trench width of the trench 2, on the inner wall of the trench 2 and on the silicon nitride film 10, by the CVD method, for example. When a film thickness of the polysilicon film 4 is equal to or larger than one half of the minimum trench width, the polysilicon film 4 is completely filled in the region of the element isolation structure 30 having a small trench width of the trench, as shown in FIG. 6. On the other hand, in the region of the element isolation structure 30' in which the trench width of the trench is equal to or larger than two times the film thickness of the polysilicon film, the polysilicon film 4 is deposited on the bottom and the sidewall of the trench, as shown in FIG. 6. In the present embodiment, the polysilicon film 4 is deposited in a film thickness smaller than a total of the depth of the trench 2, the film thickness of the silicon nitride film 10, and the film thickness of the silicon oxide film 9. In this case, the polysilicon film 4 is not filled in an approximate center of the trench 2, and a space is formed at the center.

When the minimum trench width of the trench 2 is 200 nanometers, for example, the polysilicon film 4 doped with phosphor is deposited in a film thickness of about 120 nanometers to 200 nanometers. When a film thickness of the deposited polysilicon film 4 is 150 nanometers, the polysilicon film 4 is completely filled in a trench area of the trench 2 having a trench width equal to or smaller than 300 nanometers. On the other hand, when a film thickness of the polysilicon film 4 is 150 nanometers, the polysilicon film 4 is deposited on the bottom and the sidewall of the trench part in the trench 2 having a trench width equal to or larger than 300 nanometers. In this case, the polysilicon film 4 is not filled in the approximate center of the trench 2, and a space is formed at the center.

Figure 7:
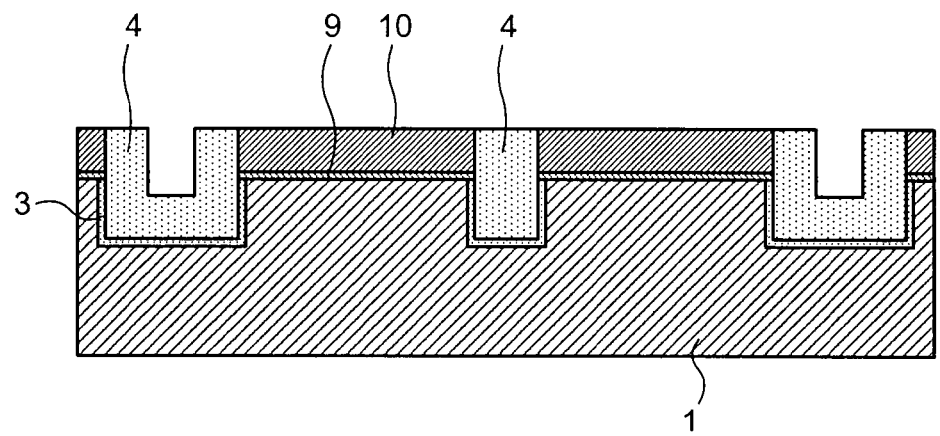
FIG. 7 is a cross-sectional view for explaining a process of manufacturing the semiconductor device according to the first embodiment.

After the polysilicon film 4 is deposited, the surface of the polysilicon film 4 is polished by the CMP method to remove the polysilicon film 4 on the silicon nitride film 10 as shown in FIG. 7.

Figure 8:
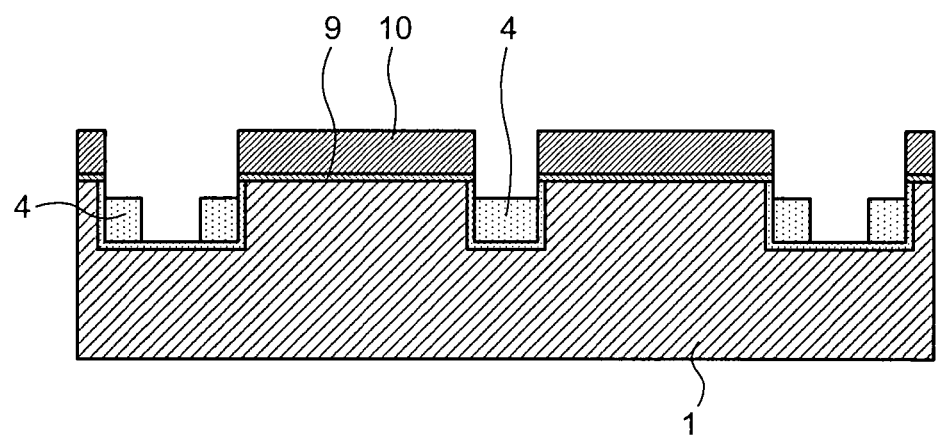
FIG. 8 is a cross-sectional view for explaining a process of manufacturing the semiconductor device according to the first embodiment.
Figure 9:
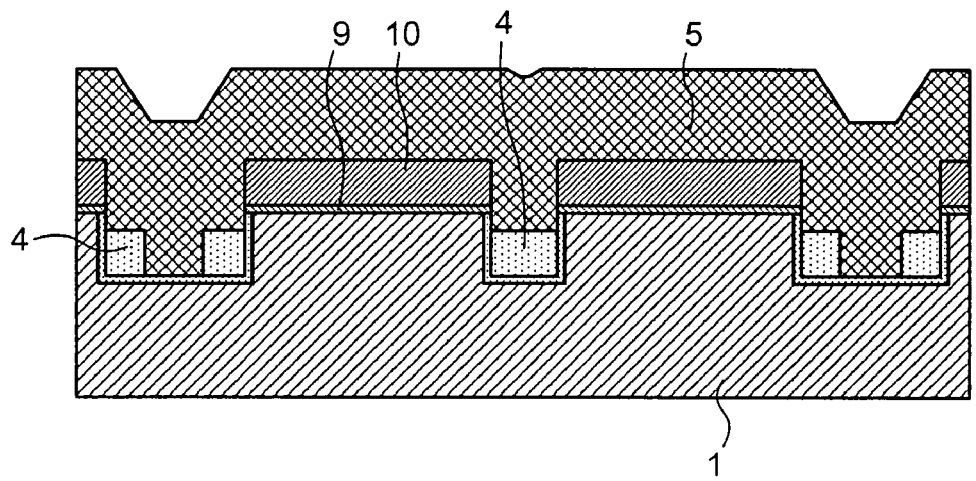
FIG. 9 is a cross-sectional view for explaining a process of manufacturing the semiconductor device according to the first embodiment.

Next, the polysilicon film 4 is etched back by the anisotropic etching to adjust the height of the surface of the polysilicon film 4 to be lower than the height of the surface of the silicon substrate 1 as shown in FIG. 8. In the present embodiment, the polysilicon film 4 is deposited in a film thickness smaller than a total of the depth of the trench 2, the film thickness of the silicon nitride film 10, and the film thickness of the silicon oxide film 9. With this arrangement, in the present embodiment, the polysilicon film 4 is not filled in the approximate center of the trench 2, and the silicon oxide film 3 on the trench bottom surface is exposed, in the region of the element isolation structure 30' in which a trench width of the trench is larger than two times the film thickness of polysilicon as shown in FIG. 8. A silicon oxide film 5 is deposited to fill the trench 2 by the CVD (chemical vapor deposition) method, as shown in FIG. 9. For the CVD method, the high-density plasma CVD (chemical vapor deposition) method (hereinafter, "HDP CVP method") can be used.

Figure 10:
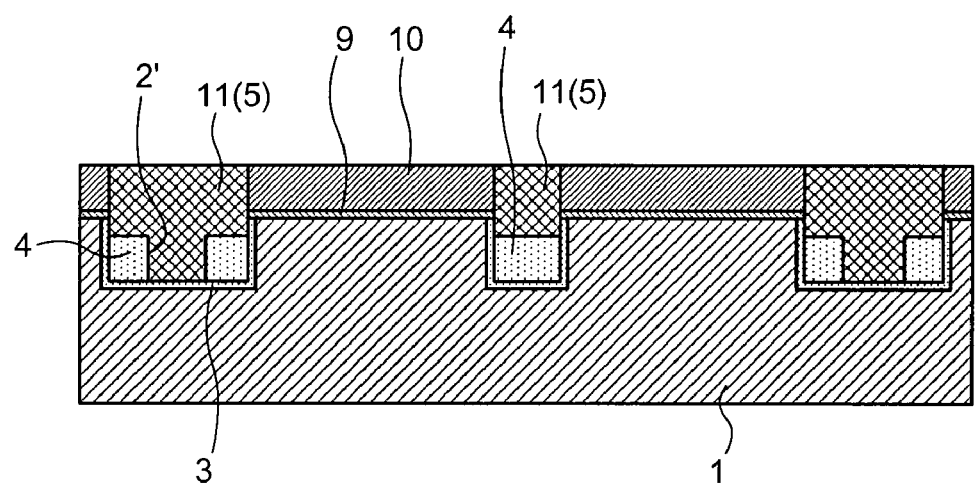
FIG. 10 is a cross-sectional view for explaining a process of manufacturing the semiconductor device according to the first embodiment.

After the silicon oxide film 5 is deposited, the entire surface of the silicon oxide film 5 is ground by the CMP method using the silicon nitride film 10 as a stopper. The cap oxide film 11 is formed by flattening the silicon oxide film 5 and by removing the silicon oxide film 5 formed on the silicon nitride film 10, as shown in FIG. 10. In this case, the cap oxide film 11 is also filled in a trench 2' formed by the polysilicon film 4 present on the inner wall of the trench 2, in the region of the element isolation structure 30' in which the trench width of the trench 2 is larger than two times the polysilicon film 4. In other words, the silicon oxide film 5 and the silicon oxide film 3 are brought into contact with each other at the approximate center of the bottom surface of the trench 2.

Figure 11:
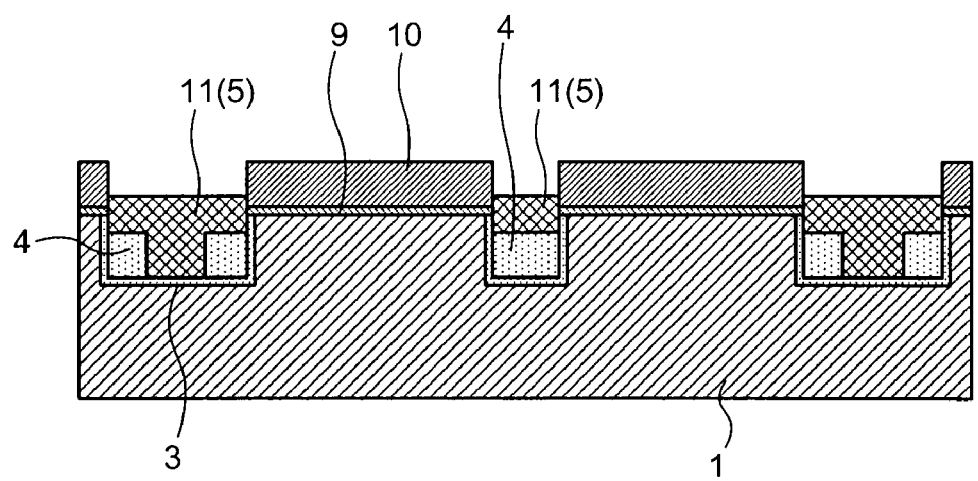
FIG. 11 is a cross-sectional view for explaining a process of manufacturing the semiconductor device according to the first embodiment.
Figure 12:
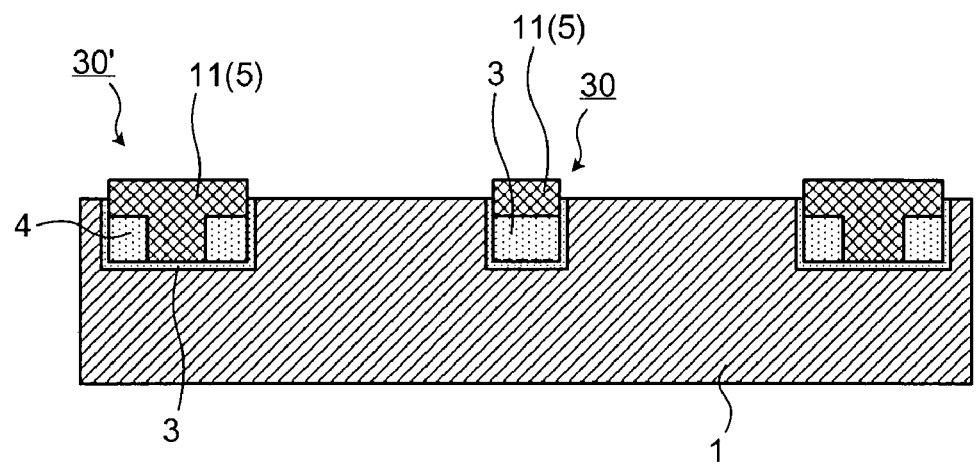
FIG. 12 is a cross-sectional view for explaining a process of manufacturing the semiconductor device according to the first embodiment.

Next, to adjust the height of the trench-type element isolation structures 30, 30', a part of the surface of the cap oxide film 11 (the silicon oxide film 5) in the trench 2 is removed using hydrofluoric acid, so that the height of the surface of the cap oxide film 11 (the silicon oxide film 5) is adjusted as shown in FIG. 11. The silicon nitride film 10 is removed using thermal phosphoric acid, for example. Further, the silicon oxide film 9 is removed using hydrofluoric acid to complete the trench-type element isolation structures 30, 30' as shown in FIG. 12.

After the trench-type element isolation structures 30, 30' are completed, a well region, a channel-cut region, and a channel impurity layer to control a threshold voltage are formed by the ion implantation method, following the conventionally known MOSFET (Metal Oxide Semiconductor Field Effect Transistor) formation process. Thereafter, the gate insulating film 6 is formed on the silicon substrate 1, and a gate electrode material such as polysilicon or tungsten silicide is deposited and patterned on the gate insulating film 6 to form the gate electrode 7. An implantation amount and implantation energy are adjusted using the ion implantation method to form a low-concentration impurity diffusion layer self-aligned with the gate electrode 7. Further, a sidewall 15 is formed on the sidewall of the gate electrode 7, and a high-concentration impurity diffusion layer is formed at a position deeper than a low-concentration impurity diffusion layer to form the source/drain diffusion layer 8. In the present embodiment, the lower end of the source/drain region is adjusted to become lower than the height of the surface of the polysilicon film 4 filled in the trench on the sidewall of the trench. As a result, the semiconductor device as shown in FIG. 1 can be manufactured.

In the method of manufacturing a semiconductor device according to the present embodiment, the cap oxide film 11 (the silicon oxide film 5) is formed on the polysilicon film 4 by the CVD method and not by thermal oxidation. With this arrangement, occurrence of a cap oxide film in a lateral direction, that is in a direction approximately parallel with the in-plane direction of the silicon substrate 1 processing can be avoided, unlike in the case of forming a cap oxide film using the conventional oxidation, and a reduction in the width of the active region due to the oxidation of the cap oxide film in the lateral direction can be prevented. Accordingly, a conversion error between a preset shape pattern of a semiconductor device and an actual shape pattern of a manufactured semiconductor device becomes very small. Consequently, a reduction in the contact margin between the contact and the active region and a reduction in the driving capacity of transistors can be prevented, and the operation speed can be improved and the productivity can be improved. Accordingly, a semiconductor device with excellent quality and excellent productivity can be manufactured.

In the method of manufacturing a semiconductor device according to the present embodiment, oxidation process is not used to form the cap oxide film 11. Therefore, stress is not generated in the semiconductor substrate 1 and the polysilicon film 4 due to a change in their volumes, and stress is not generated in the semiconductor substrate 1 and the polysilicon film 4 due to oxidation. In the method of manufacturing a semiconductor device according to the present embodiment, a crystal defect does not occur in the semiconductor substrate 1 and the polysilicon film 4 due to the occurrence of stress, and the occurrence of a junction leak current due to a change in the band gap attributable to the occurrence of stress can be prevented. Therefore, in the method of manufacturing a semiconductor device according to the present embodiment, the occurrence of a crystal defect can be suppressed, and the occurrence of a junction leak can be decreased, resulting in an improvement in the productivity of semiconductor elements. In other words, a semiconductor with excellent quality and excellent productivity can be manufactured.

In the method of manufacturing a semiconductor device according to the present embodiment, an oxide film is deposited by the CVD method to form the cap oxide film 11. Therefore, it is possible to prevent thinning or loss of a polysilicon film that is present on the inner wall of the trench having a large trench width. Consequently, reduction in the element isolation capacity attributable to the thinning or loss of the polysilicon film in the trench can be securely prevented. Accordingly, a high-quality semiconductor device capable of stably and effectively performing element isolation can be realized.

In the method of manufacturing a semiconductor device according to the present embodiment, an oxide film is deposited by the CVD method, and a flattening technique according to the CMP method is used, to form the cap oxide film 11. Therefore, the surface of the cap oxide film 11 is securely flattened, without generating a gap. Accordingly, occurrence of an etching residual attributable to a surface shape of the cap oxide film 11 can be securely prevented at the time of forming a gate electrode at a later stage, which effectively prevents the short-circuiting of the gate electrode. Consequently, a constraint of the layout of the trench 2 is not necessary to prevent the short-circuiting of the gate electrode, and a semiconductor device having a large degree of flexibility in the layout of the trench 2 can be realized.

In the method of manufacturing a semiconductor device according to the present embodiment, the CMP method and the anisotropic etching are used in combination to remove the polysilicon film 4. Accordingly, a removal amount of the anisotropic etching can be decreased from that achieved by the conventional method, which decreases damage due to the etching of the bottom surface of the trench 2. As a result, a highly reliable semiconductor device can be manufactured.

Further, in the method of manufacturing a semiconductor device according to the present embodiment, a film thickness of the polysilicon film 4 in the lateral direction is at least one half of the minimum trench width of the trench 2 in the trench-type element isolation structure 30'. Therefore, thinning and loss of a polysilicon film present on the inner wall of the trench can be prevented in the trench having a large trench width. Accordingly, a reduction in the element isolation capacity attributable to the thinning or loss of the polysilicon film in the trench can be securely prevented. Consequently, a high-quality semiconductor device capable of stably and effectively performing the element isolation can be manufactured.

Further, in the method of manufacturing a semiconductor device according to the present embodiment, the lower end of the high-concentration source/drain diffusion layer 8 is formed to be lower than the height of the surface of the polysilicon film 4 filled in the trench on the sidewall of the trench. Therefore, when potentials of adjacent high-concentration source/drain diffusion layers are different, it is possible to effectively suppress the electric field of one diffusion layer from changing the potential of the other diffusion layer.

A polysilicon film doped with phosphor is explained as a conductive film filled in the trench 2. However, in the present invention, the conductive film is not limited to this. Instead, it is also possible to use a conductive film such as a polysilicon film (a non-single crystal silicon film doped with a dopant) doped with boron, arsenic, or antimony, a metal film such as tungsten and titanium, and a metal nitride film such as titan nitride and tungsten nitride. In this case, the effect similar to the above can be also obtained.

Second Embodiment

Figure 13:
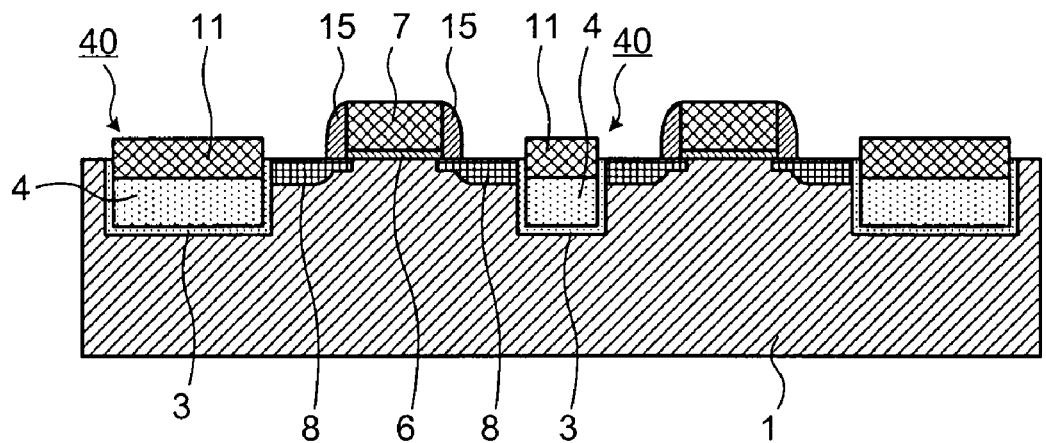
FIG. 13 is a cross-sectional view of a schematic configuration of a semiconductor device according to a second embodiment.

FIG. 13 is a cross-sectional view of a schematic configuration of a semiconductor device according to a second embodiment of the present invention. This semiconductor device includes a thin trench-type element isolation structure 40 having the polysilicon film 4 as a conductive film disposed, via the silicon oxide film 3, in the trench 2 formed in the silicon substrate 1 as a semiconductor substrate. The trench-type element isolation structure 40 includes the polysilicon film 4 formed in the trench 2 on the entire bottom surface of the trench 2 over the total trench width.

In the trench-type element isolation structure 40, the height of the polysilicon film 4 is lower than the surface of the silicon substrate 1. In the trench-type element isolation structure 40, a film thickness of the polysilicon film 4 is substantially constant, regardless of the width of the trench-type element isolation structure, that is, regardless of the trench width of the trench 2. However, the height of the remaining polysilicon film 4 usually varies by about ±10% due to a variation in a manufacturing method such as a film formation, CMP, and etching described later.

In the trench-type element isolation structures 40, the cap oxide film 11 including a silicon oxide film formed by the CVD method is formed on the polysilicon film 4. Therefore, in the trench-type element isolation structures 40, a bird's beak is not present in the cap oxide film 11.

In the active region of elements, the gate electrode 7 is formed on the silicon substrate 1 via the gate insulating film 6. In the active region, there is also formed the source/drain diffusion layer 8 including a low-concentration impurity diffusion layer self-aligned with the gate electrode 7 via a channel region beneath the gate electrode 7, and a high-concentration impurity diffusion layer formed at a deeper position self-aligned with the gate electrode and the sidewall. The surface of the polysilicon film 4 filled in the trench is lower than the surface of the substrate, and is higher than the lower end of the high-concentration source/drain diffusion layer 8 on the sidewall of the trench. In the subsequent drawings including FIG. 13, members that are the same as those of the semiconductor device shown in FIG. 1 explained in the first embodiment are denoted with like reference numerals and their detailed explanations will be omitted to facilitate the understanding.

In the semiconductor device according to the present embodiment, the cap oxide film 11 is formed by the CVD method and not by thermal oxidation. Therefore, a bird's beak is not present in the cap oxide film 11. Accordingly, a reduction in the width of the active region due to the expansion of the cap oxide film 11 to a lateral direction can be prevented.

As a result, a conversion difference between a preset shape pattern of a semiconductor device and an actual shape pattern of a manufactured semiconductor device becomes very small. A reduction in the contact margin of a contact between the contact and the active region and a reduction in the driving capacity of transistors can be prevented, which improves the operation speed and productivity. Therefore, a high-quality semiconductor device can be provided.

In the semiconductor device according to the present embodiment, the cap oxide film 11 is formed without using oxidation process. Therefore, there is no stress in the semiconductor substrate 1 and the polysilicon film 4 attributable to the oxidation process in the semiconductor substrate 1 and the polysilicon film 4. Consequently, in the semiconductor device according to the present embodiment, it is possible to prevent the occurrence of a crystal defect due to the oxidation process of the semiconductor substrate 1 and the polysilicon film 4, and the occurrence of a junction leak current due to a change in band gap attributable to the occurrence of the stress. Therefore, in this semiconductor device, productivity of semiconductor elements can be improved. In other words, a semiconductor device excellent in quality and productivity can be realized.

In the semiconductor device according to the present embodiment, the cap oxide film 11 is formed by depositing an oxide film by the CVD method. Therefore, it is possible to prevent thinning or loss of a polysilicon film that is present on the inner wall of the trench having a large trench width. Consequently, reduction in the element isolation capacity attributable to the thinning or loss of the polysilicon film in the trench can be securely prevented. Accordingly, a high-quality semiconductor device capable of stably and effectively performing element isolation can be realized.

In the semiconductor device according to the present embodiment, the polysilicon film 4 disposed in the trench 2 of the trench-type element isolation structure 40 is formed on the entire bottom surface of the trench 2 over the total trench width. As a result, thinning or loss of the polysilicon film present on the inner wall of the trench can be completely prevented.

In the semiconductor device according to the present embodiment, the surface of the polysilicon film 4 is higher than the lower end of the source/drain diffusion layer 8 on the sidewall of the trench. Therefore, when potentials of adjacent high-concentration source/drain diffusion layers are different, it is possible to effectively suppress the electric field of one diffusion layer from changing the potential of the other diffusion layer.

A method of manufacturing a semiconductor device according to the present embodiment is explained with reference to the drawings.

Figure 14:
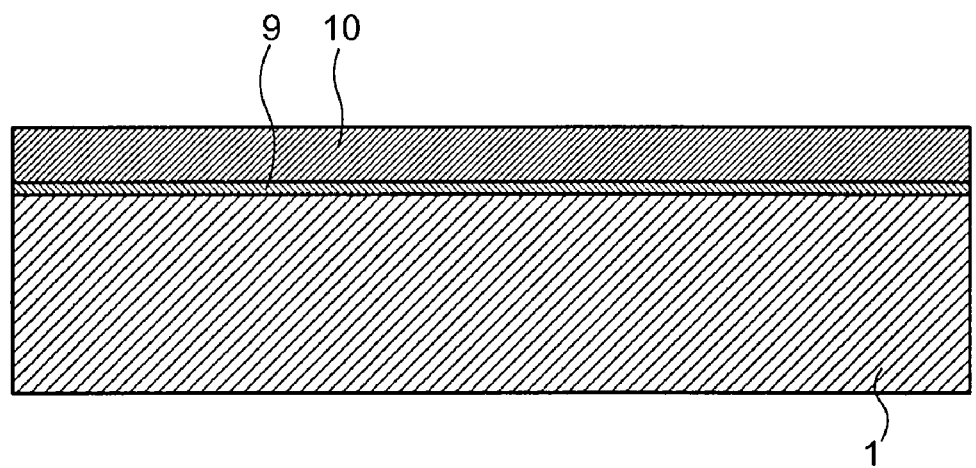
FIG. 14 is a cross-sectional view for explaining a process of manufacturing the semiconductor device according to the second embodiment.
Figure 15:
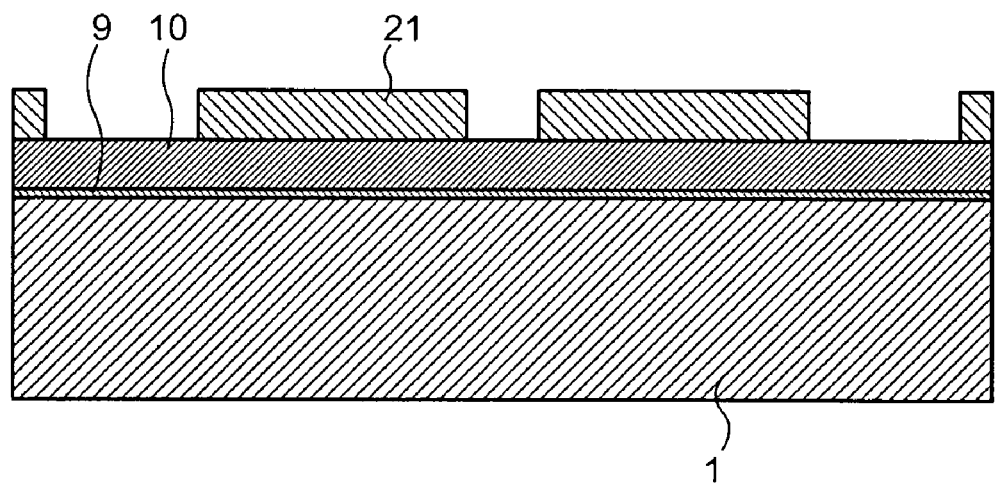
FIG. 15 is a cross-sectional view for explaining a process of manufacturing the semiconductor device according to the second embodiment.
Figure 16:
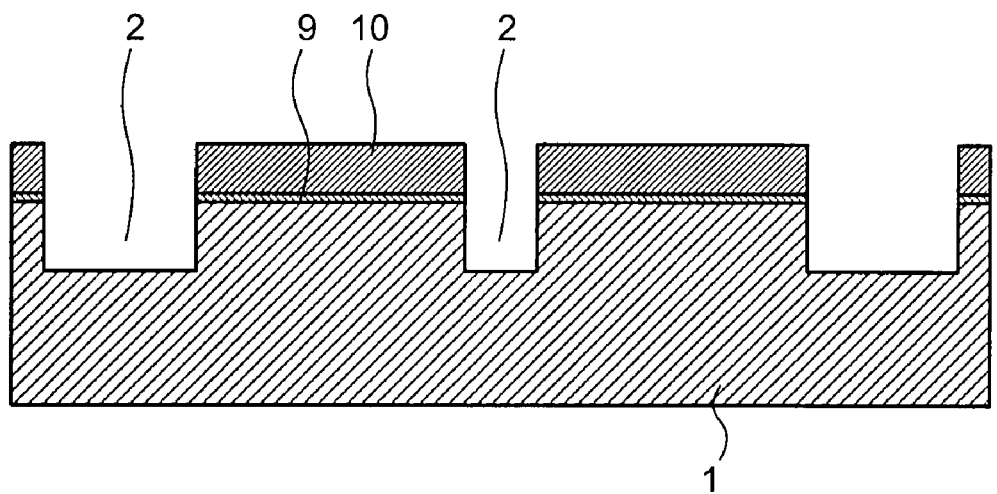
FIG. 16 is a cross-sectional view for explaining a process of manufacturing the semiconductor device according to the second embodiment.

First, as shown in FIG. 14, the upper surface of the silicon substrate 1 is thermal oxidized to form the silicon oxide film 9 in a film thickness of about 5 nanometers to 30 nanometers. Next, as shown in FIG. 14, the silicon nitride film 10 is formed in a film thickness of about 50 nanometers to 200 nanometers, on the silicon oxide film 9. The photoresist 21 is patterned to form an opening in which a trench is to be formed, using a photoengraving technique and a dry etching technique, as shown in FIG. 15. The silicon nitride film 10, the silicon oxide film 9, and the silicon substrate 1 are anisotropically etched to form the trench 2, using the photoresist 21 as a mask, and the photoresist 21 is removed. FIG. 16 depicts a state after the photoresist 21 is removed. The trench 2 has a depth of about 150 nanometers to 500 nanometers from the substrate surface.

Figure 17:
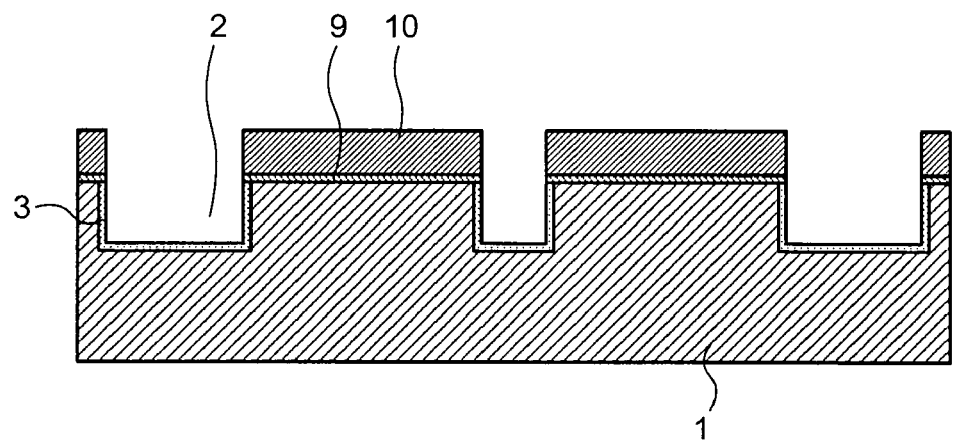
FIG. 17 is a cross-sectional view for explaining a process of manufacturing the semiconductor device according to the second embodiment.

After the trench 2 is formed, the surface of the inner wall of the trench 2 is thermal oxidized to remove damaged parts of the inner wall of the trench 2, that is, the inner surface and the bottom surface of the trench 2. At the same time, as shown in FIG. 17, the silicon oxide film 3 as an inner wall oxide film or as a protection film is formed on the inner wall of the trench 2. This silicon oxide film 3 is formed in a thickness of about 5 nanometers to 30 nanometers.

Figure 18:
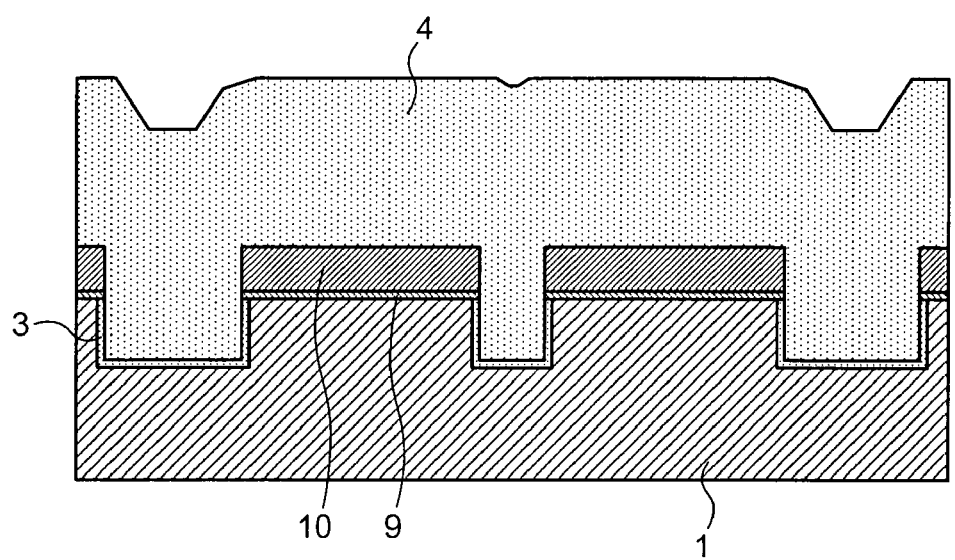
FIG. 18 is a cross-sectional view for explaining a process of manufacturing the semiconductor device according to the second embodiment.
Figure 19:
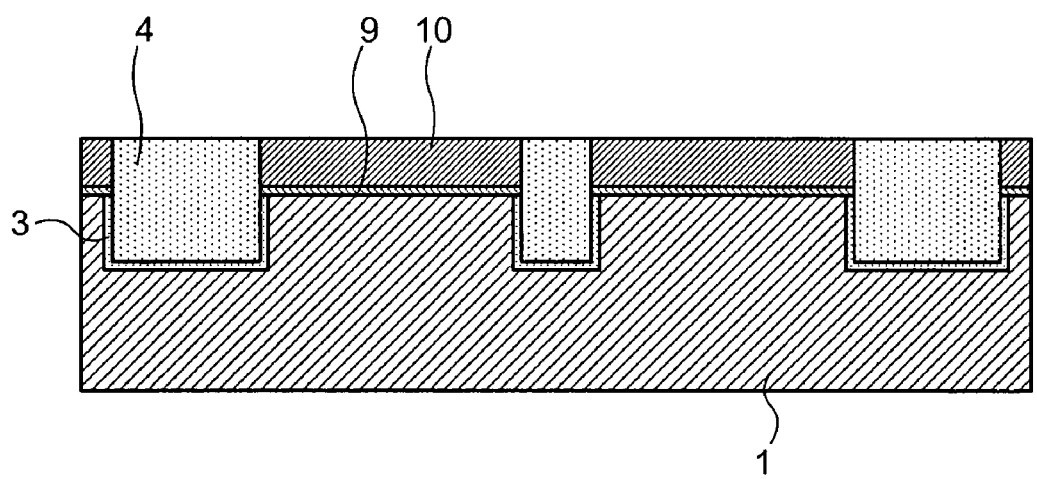
FIG. 19 is a cross-sectional view for explaining a process of manufacturing the semiconductor device according to the second embodiment.

The polysilicon film 4 doped with phosphor is deposited on the inner wall of the trench 2 and on the silicon nitride film 10, by the CVD method, for example. In the present embodiment, the polysilicon film 4 is deposited in a film thickness larger than the total of the depth of the trench 2, the film thickness of the silicon nitride film 10, and the film thickness of the silicon oxide film 9. With this arrangement, in the present embodiment, all the trenches 2 having various trench widths are filled with the polysilicon film 4 as shown in FIG. 18. Therefore, in the present embodiment, unlike in the first embodiment, space is not formed without the filling of the polysilicon film 4 in the approximate center of the trench 2. The polysilicon film 4 is formed on the entire bottom surface of the trench 2 over the total trench width.

After the polysilicon film 4 is deposited, the surface of the polysilicon film 4 is polished by the CMP method to remove the polysilicon film 4 on the silicon nitride film 10 as shown in FIG. 17.

Figure 20:
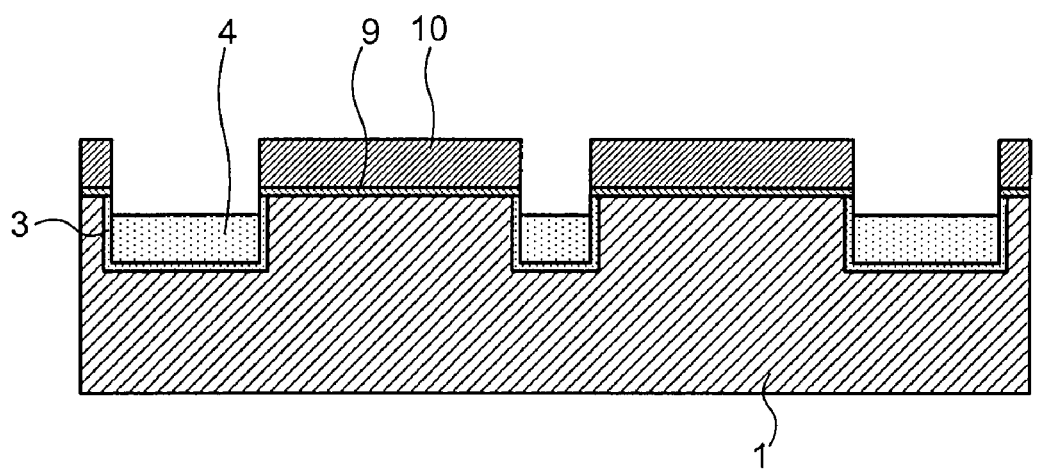
FIG. 20 is a cross-sectional view for explaining a process of manufacturing the semiconductor device according to the second embodiment.
Figure 21:
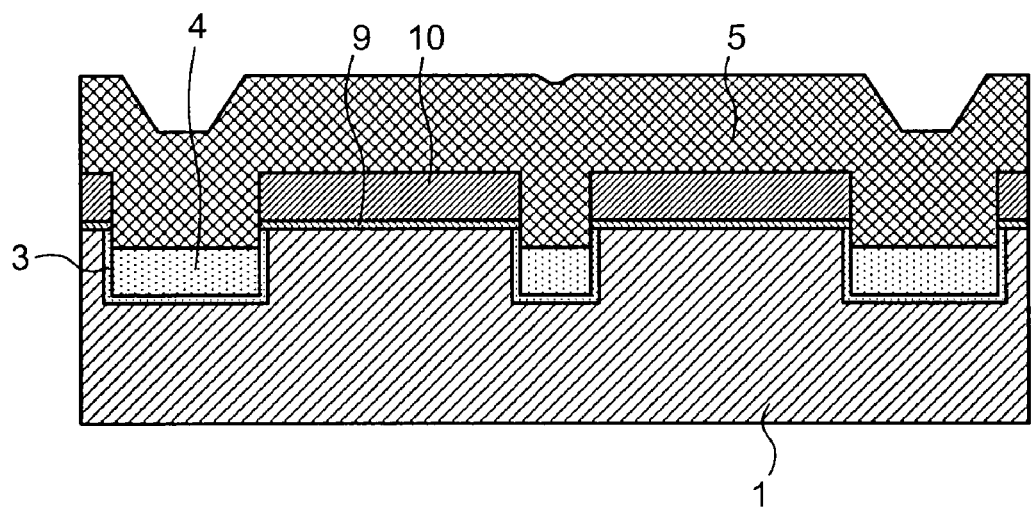
FIG. 21 is a cross-sectional view for explaining a process of manufacturing the semiconductor device according to the second embodiment.

Next, the polysilicon film 4 is etched back by the anisotropic etching to adjust the height of the surface of the polysilicon film 4 to be lower than the height of the surface of the silicon substrate 1 as shown in FIG. 20. The silicon oxide film 5 is deposited to fill the trench 2 by the CVD method, as shown in FIG. 21. For the CVD method, the HDP CVP method can be used.

Figure 22:
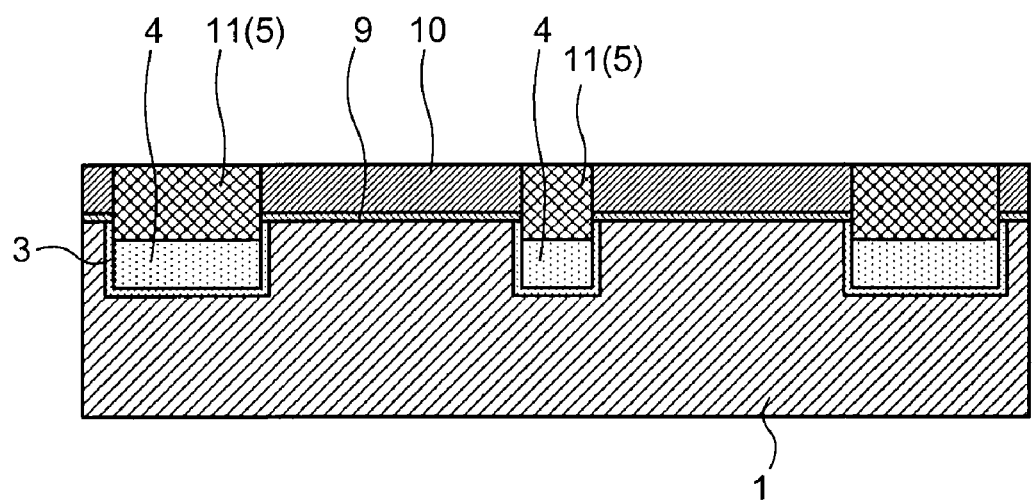
FIG. 22 is a cross-sectional view for explaining a process of manufacturing the semiconductor device according to the second embodiment.

After the silicon oxide film 5 is deposited, the entire surface of the silicon oxide film 5 is polished by the CMD method using the silicon nitride film 10 as a stopper. The cap oxide film 11 is formed by flattening the silicon oxide film 5 and by removing the silicon oxide film 5 formed on the silicon nitride film 10, as shown in FIG. 22.

Figure 23:
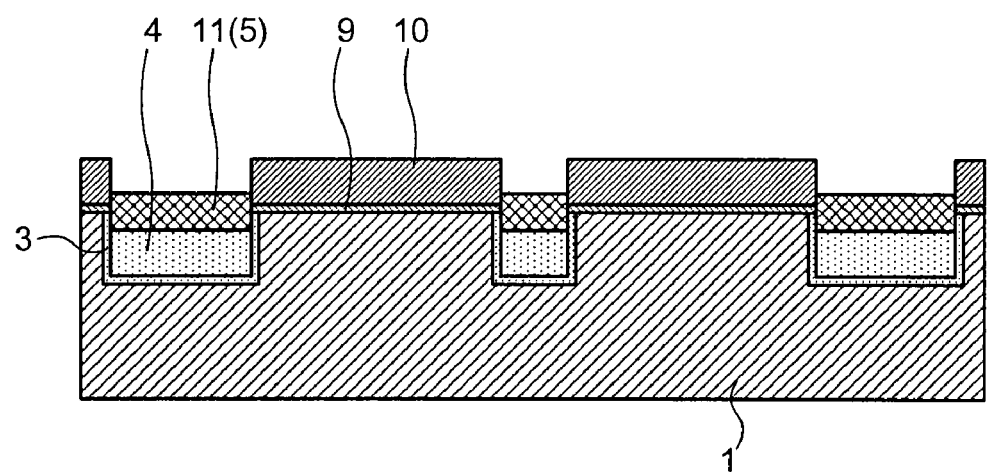
FIG. 23 is a cross-sectional view for explaining a process of manufacturing the semiconductor device according to the second embodiment.
Figure 24:
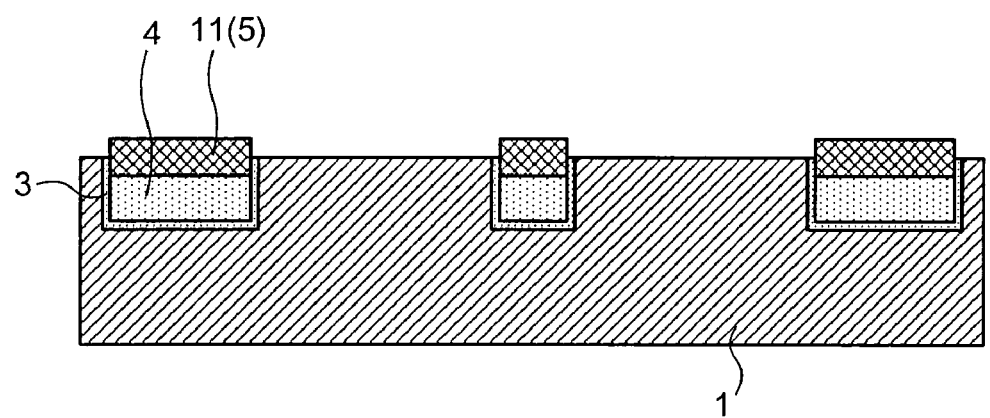
FIG. 24 is a cross-sectional view for explaining a process of manufacturing the semiconductor device according to the second embodiment.

Next, to adjust the height of the trench-type element isolation structure 40, a part of the surface of the cap oxide film 11 (the silicon oxide film 5) in the trench 2 is removed using hydrofluoric acid, so that the height of the surface of the cap oxide film 11 (the silicon oxide film 5) is adjusted as shown in FIG. 23. The silicon nitride film 10 is removed using thermal phosphoric acid, for example. Further, the silicon oxide film 9 is removed using hydrofluoric acid to complete the trench-type element isolation structure 40 as shown in FIG. 24.

After the trench-type element isolation structure 40 is completed, a well region, a channel-cut region, and a channel impurity layer to control a threshold voltage are formed by the ion implantation method, following the conventionally known MOSFET formation process. Thereafter, the gate insulating film 6 is formed on the silicon substrate 1, and a gate electrode material such as polysilicon or tungsten silicide is deposited and patterned on the gate insulating film 6 to form the gate electrode 7. An implantation amount and implantation energy are adjusted using the ion implantation method to form a low-concentration impurity diffusion layer self-aligned with the gate electrode 7. Further, the sidewall 15 is formed on the sidewall of the gate electrode 7, and a high-concentration impurity diffusion layer is formed at a position deeper than a low-concentration impurity diffusion layer to form the source/drain diffusion layer 8. In the present embodiment, the lower end of the source/drain region is adjusted to become lower than the height of the surface of the polysilicon film 4 filled in the trench on the sidewall of the trench. As a result, the semiconductor device as shown in FIG. 13 can be manufactured.

In the method of manufacturing a semiconductor device according to the present embodiment, the cap oxide film 11 (the silicon oxide film 5) is formed on the polysilicon film 4 by the CVD method and not by thermal oxidation. With this arrangement, occurrence of a cap oxide film in a lateral direction, that is in a direction approximately parallel with the in-plane direction of the silicon substrate 1 can be avoided, unlike in the case of forming a cap oxide film using the conventional oxidation process, and a reduction in the width of the active region due to the oxidation of the cap oxide film in the lateral direction can be prevented. Accordingly, a conversion error between a preset shape pattern of a semiconductor device and an actual shape pattern of a manufactured semiconductor device becomes very small. Consequently, a reduction in the contact margin between the contact and the active region and a reduction in the driving capacity of transistors can be prevented, and the operation speed can be improved and the productivity can be improved. As a result, a semiconductor device with excellent quality and excellent productivity can be manufactured.

In the method of manufacturing a semiconductor device according to the present embodiment, oxidation process is not used to form the cap oxide film 11. Therefore, stress is not generated in the semiconductor substrate 1 and the polysilicon film 4 due to a change in their volumes, and stress is not generated in the semiconductor substrate 1 and the polysilicon film 4 due to oxidation. In the method of manufacturing a semiconductor device according to the present embodiment, a crystal defect does not occur in the semiconductor substrate 1 and the polysilicon film 4 due to the occurrence of stress, and the occurrence of a junction leak current due to a change in the band gap attributable to the occurrence of stress can be prevented. Therefore, in the method of manufacturing a semiconductor device according to the present embodiment, the occurrence of a crystal defect can be suppressed, and the occurrence of a junction leak can be decreased, resulting in an improvement in the productivity of semiconductor elements. In other words, a semiconductor with excellent quality and excellent productivity can be manufactured.

In the method of manufacturing a semiconductor device according to the present embodiment, an oxide film is deposited by the CVD method to form the cap oxide film 11. Therefore, it is possible to prevent thinning or loss of a polysilicon film that is present on the inner wall of the trench having a large trench width. Consequently, reduction in the element isolation capacity attributable to the thinning or loss of the polysilicon film in the trench can be securely prevented. Accordingly, a high-quality semiconductor device capable of stably and effectively performing element isolation can be manufactured.

In the method of manufacturing a semiconductor device according to the present embodiment, an oxide film is deposited by the CVD method, and a flattening technique according to the CMP method is used, to form the cap oxide film 11. Therefore, the surface of the cap oxide film 11 is securely flattened without generating a gap. Accordingly, occurrence of an etching residual attributable to a surface shape of the cap oxide film 11 can be securely prevented at the time of forming a gate electrode at a later stage, which effectively prevents the short-circuiting of the gate electrode. Consequently, a constraint of the layout of the trench 2 is not necessary to prevent the short-circuiting of the gate electrode, and a semiconductor device having a large degree of flexibility in the layout of the trench 2 can be realized.

In the method of manufacturing a semiconductor device according to the present embodiment, the CMP method and the anisotropic etching are used in combination to remove the polysilicon film 4. Accordingly, a removal amount of the anisotropic etching can be decreased from that achieved by the conventional method, which decreases damage due to the etching of the bottom surface of the trench 2. As a result, a highly reliable semiconductor device can be manufactured.

Further, in the method of manufacturing a semiconductor device according to the present embodiment, the polysilicon film 4 is formed on the entire bottom surface of the trench 2 over the total trench width. Therefore, thinning and loss of a polysilicon film present on the inner wall of the trench can be prevented.

Further, in the method of manufacturing a semiconductor device according to the present embodiment, the lower end of the high-concentration source/drain diffusion layer 8 is formed to be lower than the height of the surface of the polysilicon film 4 filled in the trench on the sidewall of the trench. Therefore, when potentials of adjacent high-concentration source/drain diffusion layers are different, it is possible to effectively suppress the electric field of one diffusion layer from changing the potential of the other diffusion layer.

Third Embodiment

Figure 25:
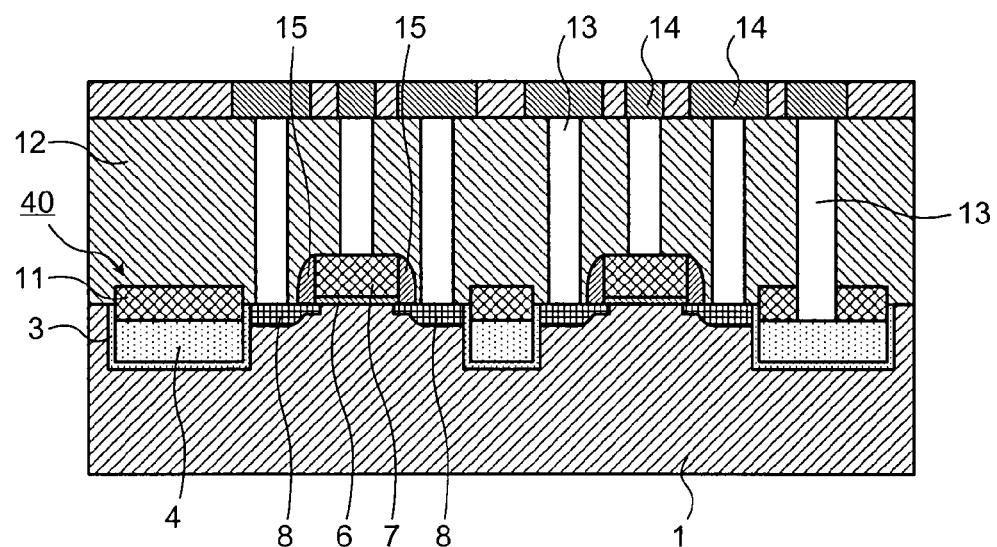
FIG. 25 is a cross-sectional view of a schematic configuration of a semiconductor device according to a third embodiment.

FIG. 25 is a cross-sectional view of a schematic configuration of a semiconductor device according to a third embodiment of the present invention. This semiconductor device includes the thin trench-type element isolation structure 40 having the polysilicon film 4 as a conductive film disposed, via the silicon oxide film 3, in the trench 2 formed in the silicon substrate 1 as a semiconductor substrate. The trench-type element isolation structure 40 includes the polysilicon film 4 formed in the trench 2 on the entire bottom surface of the trench 2 over the total trench width.

In the trench-type element isolation structure 40, the height of the polysilicon film 4 is lower than the surface of the silicon substrate 1. In the trench-type element isolation structure 40, a film thickness of the polysilicon film 4 is substantially constant, regardless of the width of the trench-type element isolation structure, that is, regardless of the trench width of the trench 2. However, the height of the remaining polysilicon film 4 usually varies by about ±10% due to a variation in a manufacturing method such as a film formation, CMP, and etching described later.

In the trench-type element isolation structures 40, the cap oxide film 11 including a silicon oxide film formed by the CVD method is formed on the polysilicon film 4. Therefore, in the trench-type element isolation structures 40, a bird's beak is not present in the cap oxide film 11.

In the active region of elements, the gate electrode 7 is formed on the silicon substrate 1 via the gate insulating film 6. In the active region, there is also formed the source/drain diffusion layer 8 via a channel region beneath the gate electrode 7. An interlayer insulating film 12 is formed on the trench-type element isolation structure 40, on the gate electrode 7, and on the source/drain diffusion layer 8, and these interlayer insulating films 12 are connected to wiring layers 14 via contact holes 13 formed in the interlayer insulating films 12. In the subsequent drawings including FIG. 25, members that are the same as those of the semiconductor device shown in FIG. 13 explained in the first embodiment are denoted with like reference numerals and their detailed explanations will be omitted to facilitate the understanding.

The semiconductor device according to the present embodiment has effects similar to those of the semiconductor device according to the second embodiment. In this semiconductor device, the polysilicon film 4 is formed on the entire bottom surface of the trench 2 over the total trench width. Therefore, there is also an advantage in that the wiring layer 14 can be easily connected to the polysilicon film 4. Accordingly, potential of the polysilicon film 4 as a conductive film can be securely fixed. For this potential, application of potential in a negative direction from 0 volt is preferable to improve isolation characteristic of a fine N-channel MOS. Because there is a risk of a leakage between the substrate and the conductive film via the silicon oxide film 3 in the trench 2, application of potential up to about −1 volt is preferable. More preferably, an absolute value is equivalent to a power supply voltage (1.0 volt or 1.2 volts) requiring no boosting.

The height of the surface of the polysilicon film 4 as a conductive film is constant in all the trench-type element isolation structures 40 regardless of the width of the trench-type element isolation structure, that is, the trench width of the trench 2. Therefore, a connection hole (the contact hole 13) to the conductive film can be formed in a region of any isolation width. Capacitance generated parasitically in the source/drain diffusion layer 8 connected to the isolation region does not depend on the width of the trench-type element isolation structure. Therefore, variation in the operation speed can be decreased.

A method of manufacturing a semiconductor device according to the present embodiment is explained with reference to the drawings.

Figure 26:
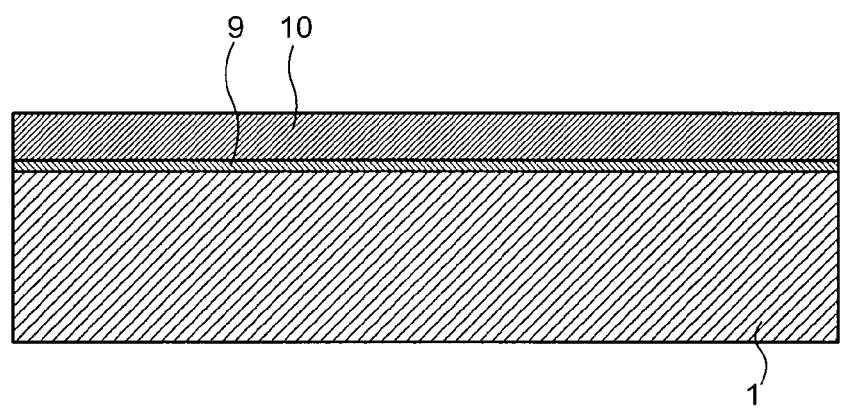
FIG. 26 is a cross-sectional view for explaining a process of manufacturing the semiconductor device according to the third embodiment.
Figure 27:
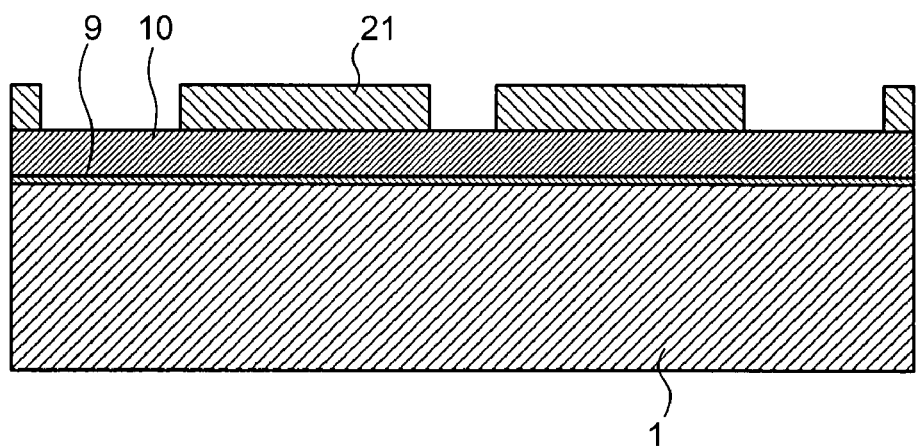
FIG. 27 is a cross-sectional view for explaining a process of manufacturing the semiconductor device according to the third embodiment.
Figure 28:
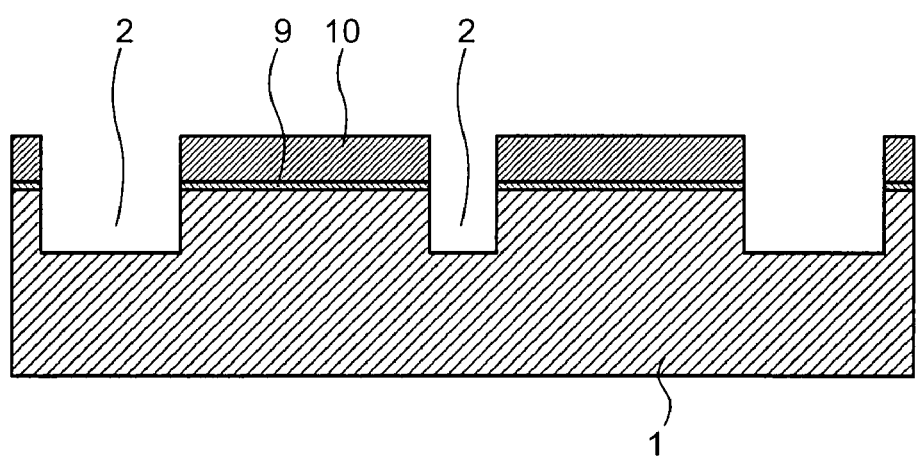
FIG. 28 is a cross-sectional view for explaining a process of manufacturing the semiconductor device according to the third embodiment.

First, as shown in FIG. 26, the upper surface of the silicon substrate 1 is thermal oxidized to form the silicon oxide film 9 in a film thickness of about 5 nanometers to 30 nanometers. Next, as shown in FIG. 26, the silicon nitride film 10 is formed in a film thickness of about 50 nanometers to 200 nanometers, on the silicon oxide film 9. The photoresist 21 is patterned to form an opening in which a trench is to be formed, using a photoengraving technique and a dry etching technique, as shown in FIG. 27. The silicon nitride film 10, the silicon oxide film 9, and the silicon substrate 1 are anisotropically etched to form the trench 2, using the photoresist 21 as a mask, and the photoresist 21 is removed. FIG. 28 depicts a state after the photoresist 21 is removed. The trench 2 has a depth of about 150 nanometers to 500 nanometers from the substrate surface.

Figure 29:
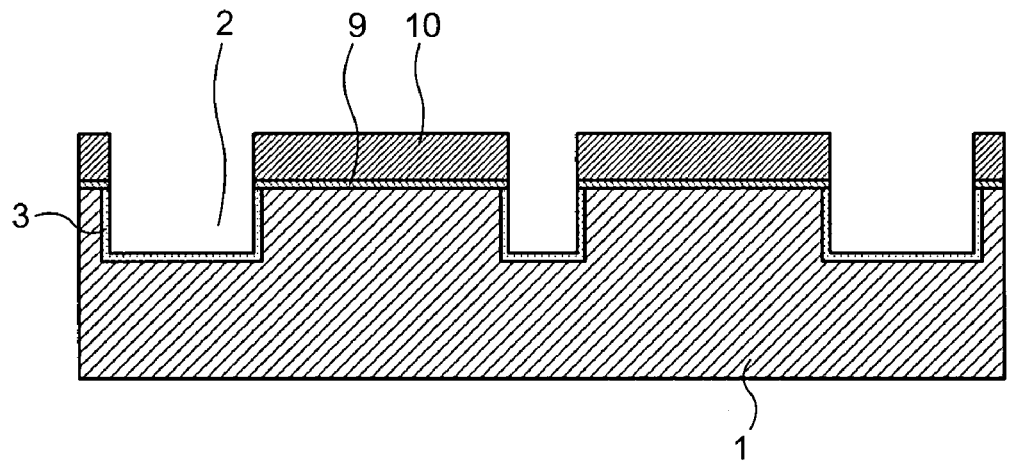
FIG. 29 is a cross-sectional view for explaining a process of manufacturing the semiconductor device according to the third embodiment.

After the trench 2 is formed, the surface of the inner wall of the trench 2 is thermal oxidized to remove damaged parts of the inner wall of the trench 2, that is, the inner surface and the bottom surface of the trench 2. At the same time, as shown in FIG. 29, the silicon oxide film 3 as an inner wall oxide film or as a protection film is formed on the inner wall of the trench 2. This silicon oxide film 3 is formed in a thickness of about 5 nanometers to 30 nanometers.

Figure 30:
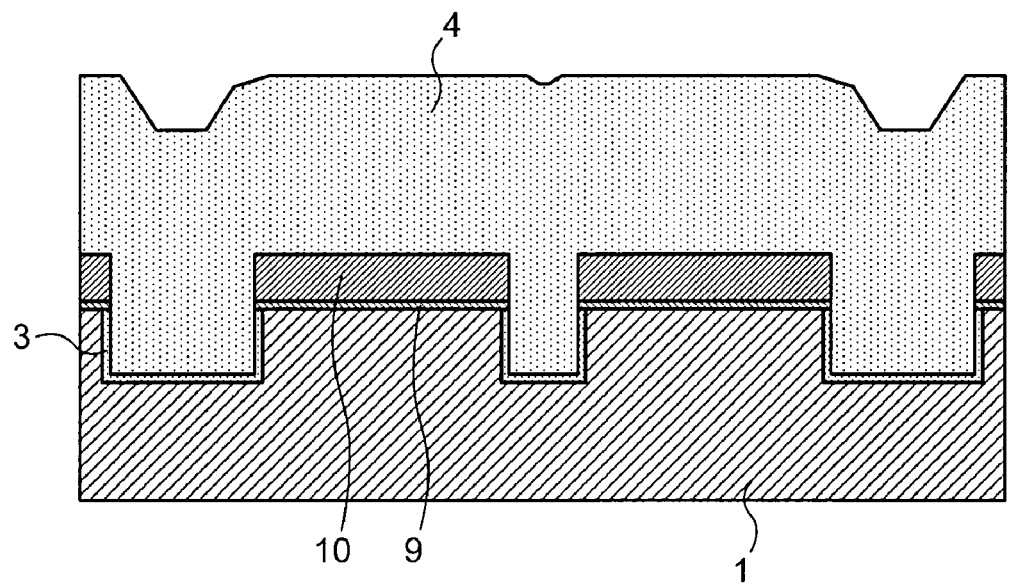
FIG. 30 is a cross-sectional view for explaining a process of manufacturing the semiconductor device according to the third embodiment.

The polysilicon film 4 doped with phosphor is deposited on the inner wall of the trench 2 and on the silicon nitride film 10, by the CVD method, for example. In the present embodiment, the polysilicon film 4 is deposited in a film thickness larger than the total of the depth of the trench 2, the film thickness of the silicon nitride film 10, and the film thickness of the silicon oxide film 9. With this arrangement, in the present embodiment, all the trenches 2 having various trench widths are filled with the polysilicon film 4 as shown in FIG. 30.

Figure 31:
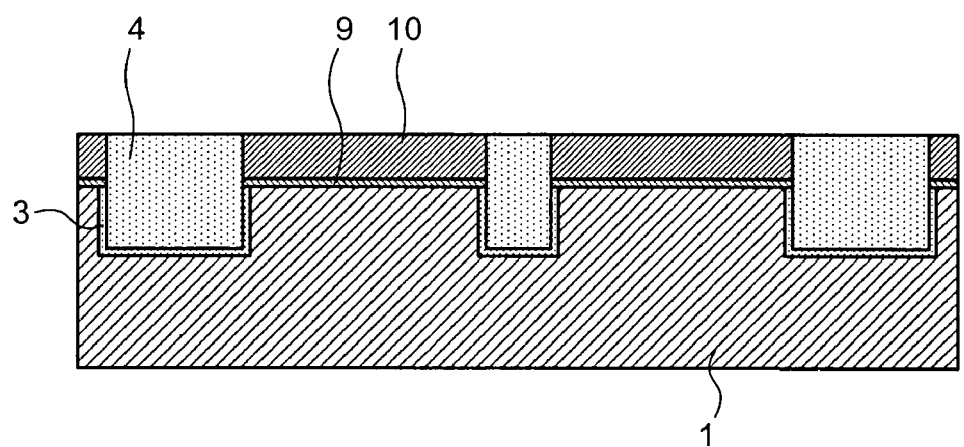
FIG. 31 is a cross-sectional view for explaining a process of manufacturing the semiconductor device according to the third embodiment.

After the polysilicon film 4 is deposited, the surface of the polysilicon film 4 is polished by the CMP method to remove the polysilicon film 4 on the silicon nitride film 10 as shown in FIG. 31.

Figure 32:
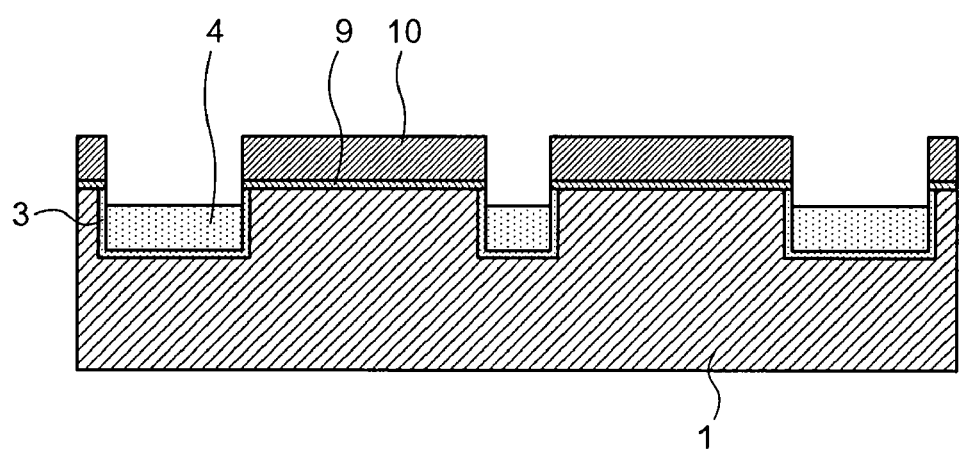
FIG. 32 is a cross-sectional view for explaining a process of manufacturing the semiconductor device according to the third embodiment.
Figure 33:
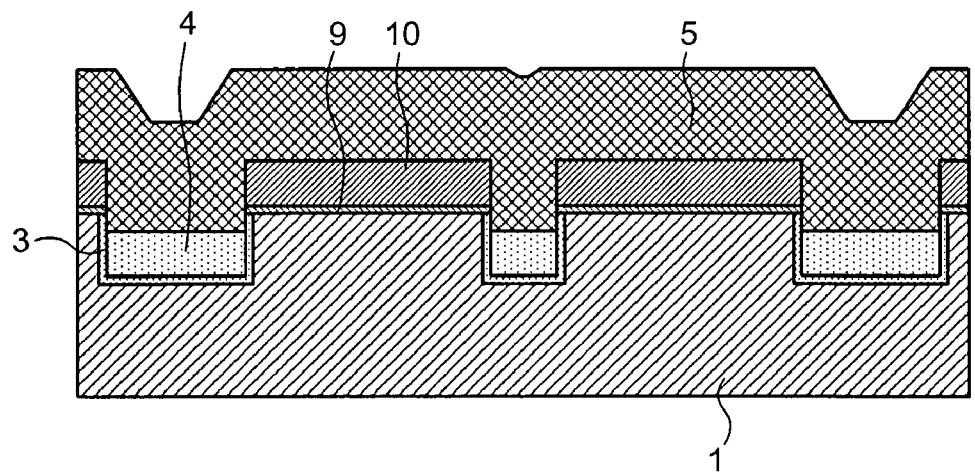
FIG. 33 is a cross-sectional view for explaining a process of manufacturing the semiconductor device according to the third embodiment.

Next, the polysilicon film 4 is etched back by the anisotropic etching to adjust the height of the surface of the polysilicon film 4 to be lower than the height of the surface of the silicon substrate 1 as shown in FIG. 32. The silicon oxide film 5 is deposited to fill the trench 2 by the CVD method as shown in FIG. 33. For the CVD method, the HDP CVP method can be used.

Figure 34:
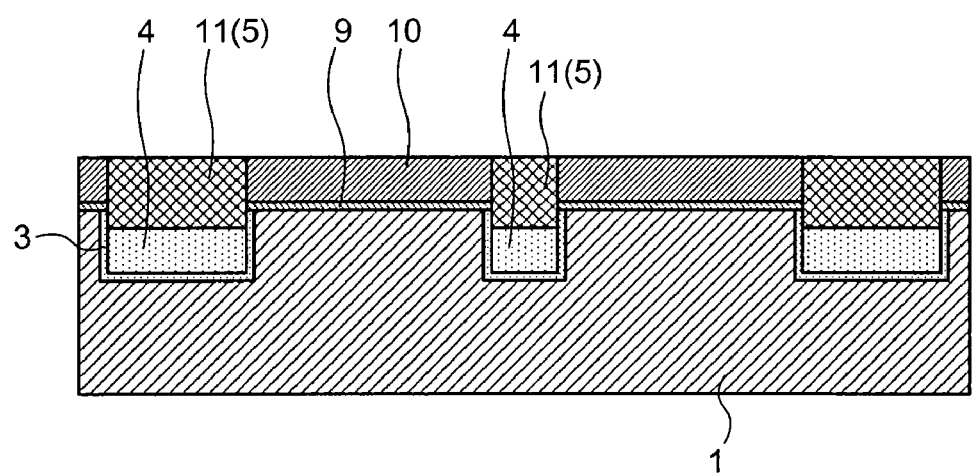
FIG. 34 is a cross-sectional view for explaining a process of manufacturing the semiconductor device according to the third embodiment.

After the silicon oxide film 5 is deposited, the entire surface of the silicon oxide film 5 is polished by the CMD method using the silicon nitride film 10 as a stopper. The cap oxide film 11 is formed by flattening the silicon oxide film 5 and by removing the silicon oxide film 5 formed on the silicon nitride film 10, as shown in FIG. 34.

Figure 35:
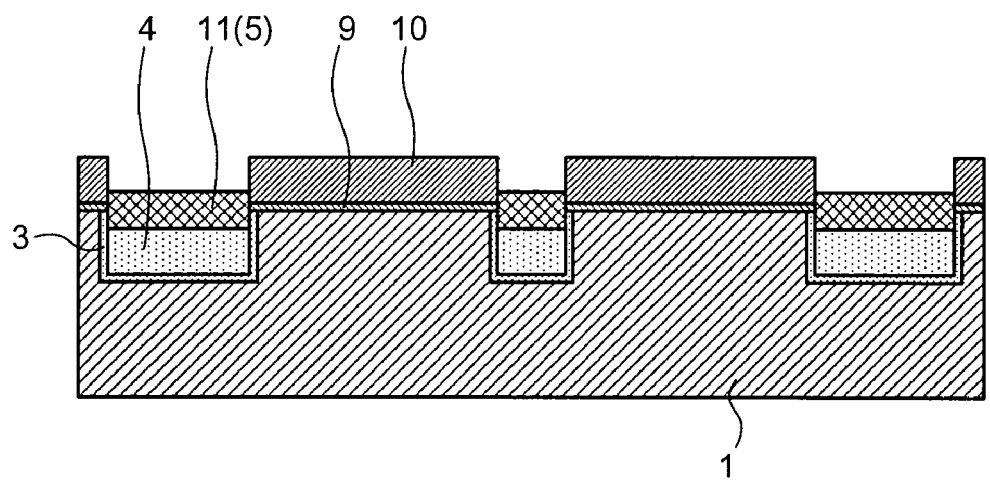
FIG. 35 is a cross-sectional view for explaining a process of manufacturing the semiconductor device according to the third embodiment.
Figure 36:
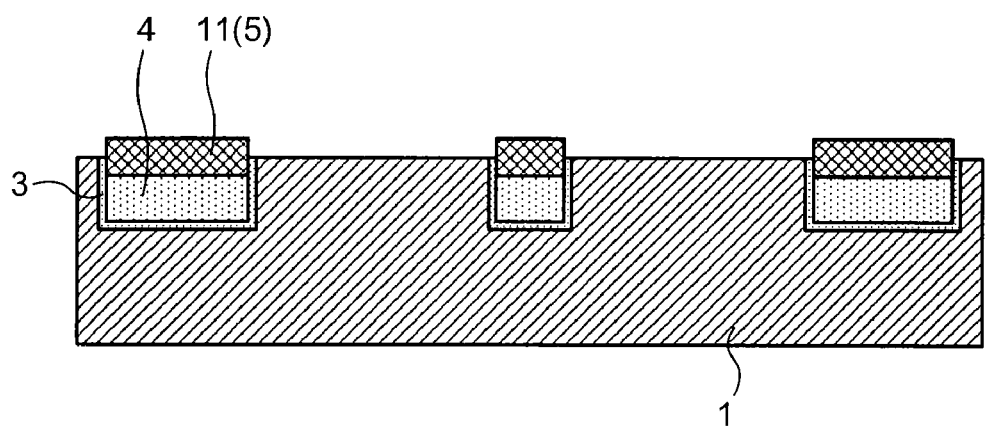
FIG. 36 is a cross-sectional view for explaining a process of manufacturing the semiconductor device according to the third embodiment.

Next, to adjust the height of the trench-type element isolation structure 40, a part of the surface of the cap oxide film 11 (the silicon oxide film 5) in the trench 2 is removed using hydrofluoric acid, so that the height of the surface of the cap oxide film 11 (the silicon oxide film 5) is adjusted as shown in FIG. 35. The silicon nitride film 10 is removed using thermal phosphoric acid, for example. Further, the silicon oxide film 9 is removed using hydrofluoric acid to complete the trench-type element isolation structure 40 as shown in FIG. 36.

Figure 37:
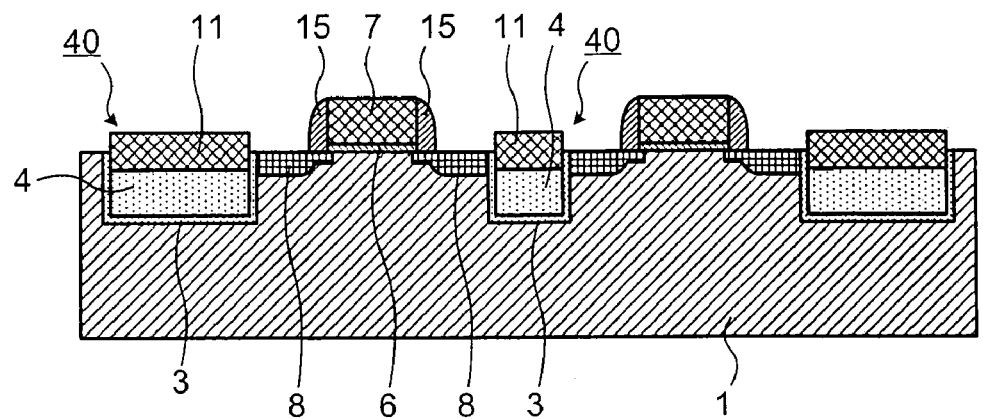
FIG. 37 is a cross-sectional view for explaining a process of manufacturing the semiconductor device according to the third embodiment.

After the trench-type element isolation structure 40 is completed, a well region, a channel-cut region, and a channel impurity layer to control a threshold voltage are formed by the ion implantation method, following the conventionally known MOSFET formation process. Thereafter, the gate insulating film 6 is formed on the silicon substrate 1, and a gate electrode material such as polysilicon or tungsten silicide is deposited and patterned on the gate insulating film 6 to form the gate electrode 7. An implantation amount and implantation energy are adjusted using the ion implantation method to form a low-concentration impurity diffusion layer self-aligned with the gate electrode 7. Further, the source/drain diffusion layer 8 is formed by the ion implantation method, and the sidewall 15 is formed as shown in FIG. 37.

Figure 38:
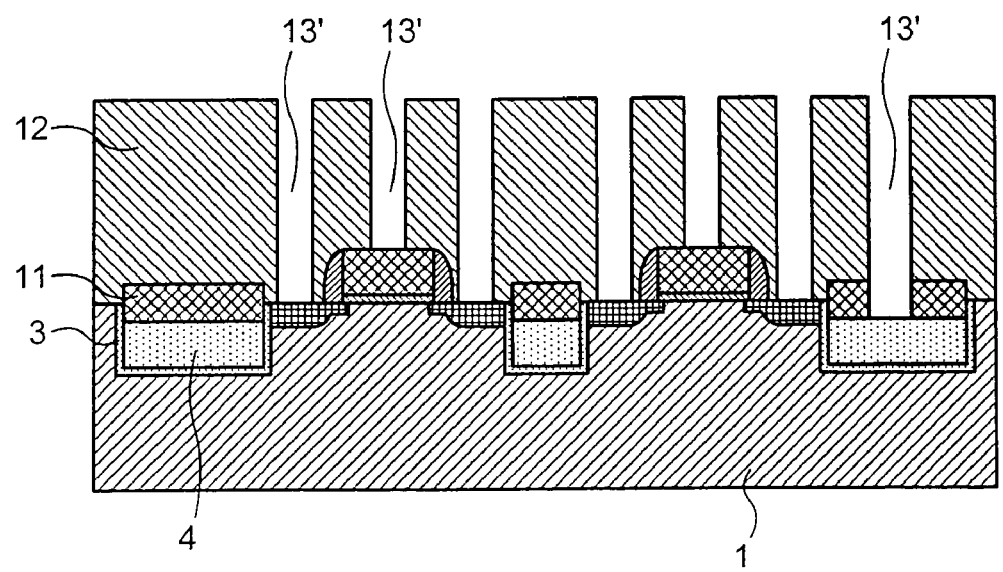
FIG. 38 is a cross-sectional view for explaining a process of manufacturing the semiconductor device according to the third embodiment.

The interlayer insulating film 12 including a silicon oxide film or a lamination film of a silicon oxide film and a silicon nitride film is formed on the silicon substrate 1. Contact holes 13 reaching the gate electrode 7, the source/drain diffusion layer 8, and the polysilicon film 4 filled in the trench-type element isolation structure 40 are formed as shown in FIG. 38. Tungsten is filled as a plug material into the contact holes 13, and the wiring layer 14 is formed by the damascene method. Thus, the semiconductor device as shown in FIG. 25 is manufactured.

The method of manufacturing a semiconductor device according to the present embodiment has effects similar to those of the method of manufacturing a semiconductor device according to the second embodiment. In this semiconductor device, the polysilicon film 4 is formed on the entire bottom surface of the trench 2 over the total trench width. Therefore, there is also an advantage in that the wiring layer 14 can be easily connected to the polysilicon film 4. Accordingly, potential of the conductive film can be fixed easily. The height of the surface of the polysilicon film 4 as a conductive film is constant in all the trench-type element isolation structures 40 regardless of the width of the trench-type element isolation structure, that is, the trench width of the trench 2. Therefore, the connection hole (the contact hole 13) to the conductive film can be formed in a region of any isolation width.

It has been explained above that the conductive film is provided in the entire region on the bottom surface of the trench. However, a substantially similar effect can be also obtained when the conductive film is not provided in the entire region on the bottom surface of the trench as explained in the first embodiment.

Fourth Embodiment

Figure 39:
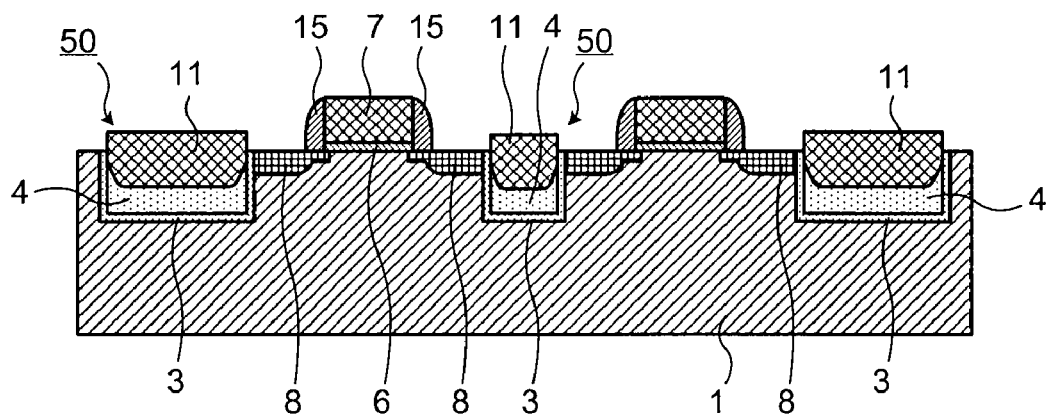
FIG. 39 is a cross-sectional view of a schematic configuration of a semiconductor device according to a fourth embodiment.

FIG. 39 is a cross-sectional view of a schematic configuration of a semiconductor device according to a fourth embodiment of the present invention. This semiconductor device includes a thin trench-type element isolation structure 50 having the polysilicon film 4 as a conductive film disposed, via the silicon oxide film 3, in the trench 2 formed in the silicon substrate 1 as a semiconductor substrate. The trench-type element isolation structure 40 includes the polysilicon film 4 formed in the trench 2 on the entire bottom surface of the trench 2 over the total trench width.

In the trench-type element isolation structures 50, the cap oxide film 11 including a silicon oxide film formed by the CVD method is formed on the polysilicon film 4. Therefore, in the trench-type element isolation structures 50, a bird's beak is not present in the cap oxide film 11.

In the active region of elements, the gate electrode 7 is formed on the silicon substrate 1 via the gate insulating film 6. In the active region, there is also formed the source/drain diffusion layer 8 including a low-concentration impurity diffusion layer self-aligned with the gate electrode 7 via a channel region beneath the gate electrode 7, and a high-concentration impurity diffusion layer formed at a deeper position self-aligned with the gate electrode and the sidewall.

In FIG. 39, members that are the same as those of the semiconductor device shown in FIG. 1 explained in the first embodiment are denoted with like reference numerals and their detailed explanations will be omitted to facilitate the understanding.

In the trench-type element isolation structure 50, the polysilicon film 4 filled in the trench 2 is formed in a recess shape on the sidewall of the trench 2. The height of the surface of the polysilicon film 4 present along the sidewall of the trench 2 is lower than the surface of the silicon substrate 1, and is higher than the lower end of the source/drain diffusion layer 8. The height of the flat part of the polysilicon film 4 in the trench-type element isolation structure 50 is substantially constant in the entire trench-type element isolation structure 50, regardless of the width of the trench-type element isolation structure 50, which is the trench width of the trench 2. However, the height of the remaining polysilicon film 4 usually varies by about ±10% due to a variation in a manufacturing method such as a film formation, CMP, and etching.

The semiconductor device according to the present embodiment can be basically manufactured following the method of manufacturing a semiconductor device explained in the second embodiment. However, in the process of etching back the polysilicon film 4 by the anisotropic etching to make the height of the surface of the polysilicon film 4 lower than the height of the surface of the silicon substrate 1 as shown in FIG. 20, anisotropy of the etching is slightly decreased, and isotropy is increased to carry out the etching. Specifically, the polysilicon film 4 is etched using etching gas doped with fluorine. As a result, a semiconductor device according to the present embodiment shown in FIG. 39 can be manufactured.

In the semiconductor device according to the present embodiment, the cap oxide film 11 having a larger film thickness than that of the upper part of the polysilicon film 4 present along the sidewall of the trench 2 is present on the flat part of the polysilicon film as a conductive film in the trench 2. With this arrangement, in the semiconductor device according to the present embodiment, in addition to the above-explained effects, the effect is obtained that parasitic capacitance can be decreased at the time of forming a wiring layer on the trench-type element isolation structure 50, as compared with the parasitic capacitance when the height of the polysilicon film 4 in the trench 2 is constant like in the second embodiment. As a result, higher-speed operation becomes possible. Therefore, according to the semiconductor device of the present embodiment, a high-quality semiconductor device with improved operation speed can be provided.

In the method of manufacturing a semiconductor device according to the present embodiment, the cap oxide film 11 having a larger film thickness than that of the upper part of the polysilicon film 4 present along the sidewall of the trench 2 is present on the flat part of the polysilicon film as a conductive film in the trench 2. With this arrangement, in the method of manufacturing a semiconductor device according to the present embodiment, in addition to the above-explained effects, the effect is obtained that parasitic capacitance can be decreased at the time of forming a wiring layer on the trench-type element isolation structure 50, as compared with the parasitic capacitance when the height of the polysilicon film 4 in the trench 2 is constant like in the second embodiment. As a result, a semiconductor device that can carry out a higher-speed operation can be manufactured. Therefore, according to the semiconductor device of the present embodiment, a high-quality semiconductor device with improved operation speed can be provided.

Fifth Embodiment

Figure 40:
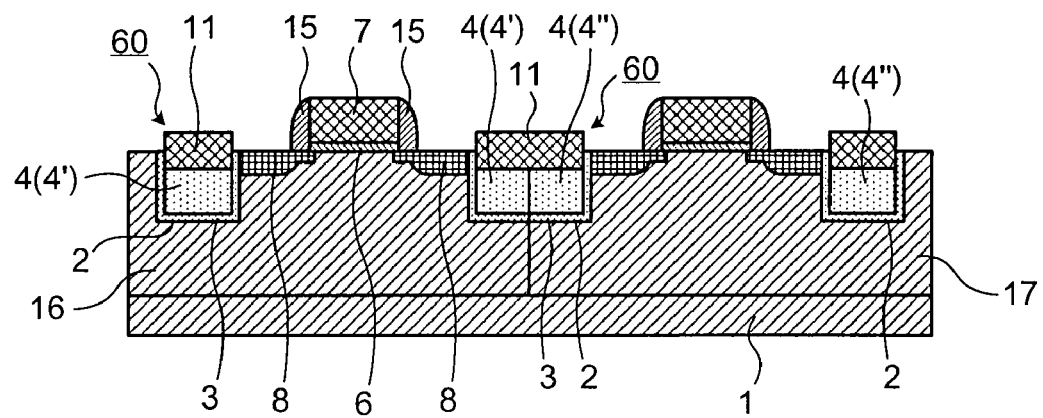
FIG. 40 is a cross-sectional view of a schematic configuration of a semiconductor device according to a fifth embodiment.

FIG. 40 is a cross-sectional view of a schematic configuration of a semiconductor device according to a fifth embodiment of the present invention. In this semiconductor device, a p-well region 16 doped with a p-type impurity and an n-well region 17 doped with an n-type impurity are formed. A thin trench-type element isolation structure 60 in which the polysilicon film 4 as a conductive film is formed is disposed, via the silicon oxide film 3, in the trench 2 provided in the p-well region 16 and the n-well region 17. The trench-type element isolation structure 60 is formed in the trench 2 on the entire bottom surface over the total trench width.

In the trench-type element isolation structures 60, the cap oxide film 11 including a silicon oxide film formed by the CVD method is formed on the polysilicon film 4. Therefore, in the trench-type element isolation structures 60, a bird's beak is not present in the cap oxide film 11.

In the active region of elements, the gate electrode 7 is formed on the silicon substrate 1 via the gate insulating film 6. In the active region, there is also formed the source/drain diffusion layer 8 including a low-concentration impurity diffusion layer self-aligned with the gate electrode 7 via a channel region beneath the gate electrode 7, and a high-concentration impurity diffusion layer formed at a deeper position self-aligned with the gate electrode and the sidewall. In the above structure, an NMOS transistor is formed in the p-well region 16, and a PMOS transistor is formed in the n-well region 17.

In FIG. 40, members that are the same as those of the semiconductor device shown in FIG. 1 explained in the first embodiment are denoted with like reference numerals and their detailed explanations will be omitted to facilitate the understanding.

In the trench-type element isolation structure 60, the height of the surface of the polysilicon film 4 filled in the trench 2 is lower than the surface of the silicon substrate 1, and is higher than the lower end of the high-concentration source/drain diffusion layer 8 on the sidewall of the trench 2. The height of the polysilicon film 4 in the trench-type element isolation structure 60 (film thickness of the polysilicon film 4 in the lateral direction) is substantially constant in the entire trench-type element isolation structure 60, regardless of the width of the trench-type element isolation structure 60, which is the trench width of the trench 2. However, the height of the remaining polysilicon film 4 usually varies by about ±10% due to a variation in a manufacturing method such as a film formation, CMP, and etching. The polysilicon film 4 formed in the trench 2 of the p-well region 16 is a p-type polysilicon film 4' as a p-type conductive film, and the polysilicon film 4 formed in the trench 2 of the n-well region 17 is an n-type polysilicon film 4" as an n-type conductive film.

In the trench-type element isolation structure 60, the height of the surface of the polysilicon film 4 filled in the trench 2 is lower than the surface of the silicon substrate 1, and is also lower than the lower end of the high-concentration source/drain diffusion layer 8 on the sidewall of the trench 2. With this arrangement, the semiconductor device according to the present embodiment achieves an effect that the bottom and the sidewall of the trench 2 in the semiconductor substrate 1 is not easily inverted, and the element isolation capacity can be improved, in addition to the effects explained in the second embodiment. Therefore, according to the semiconductor device of the present embodiment, a high-quality semiconductor device with excellent element isolation capacity can be obtained.

A method of manufacturing a semiconductor device according to the present embodiment is explained with reference to the drawings.

Figure 41:
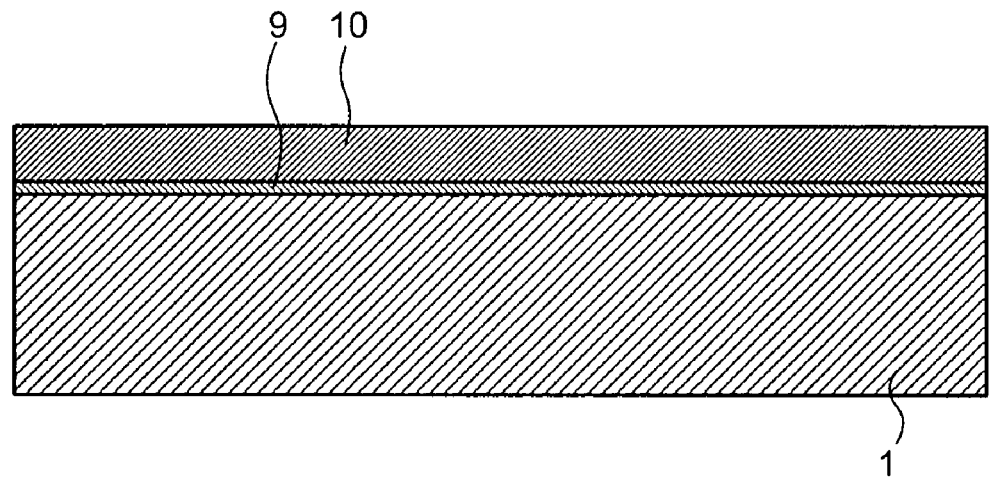
FIG. 41 is a cross-sectional view for explaining a process of manufacturing the semiconductor device according to the fifth embodiment.
Figure 42:
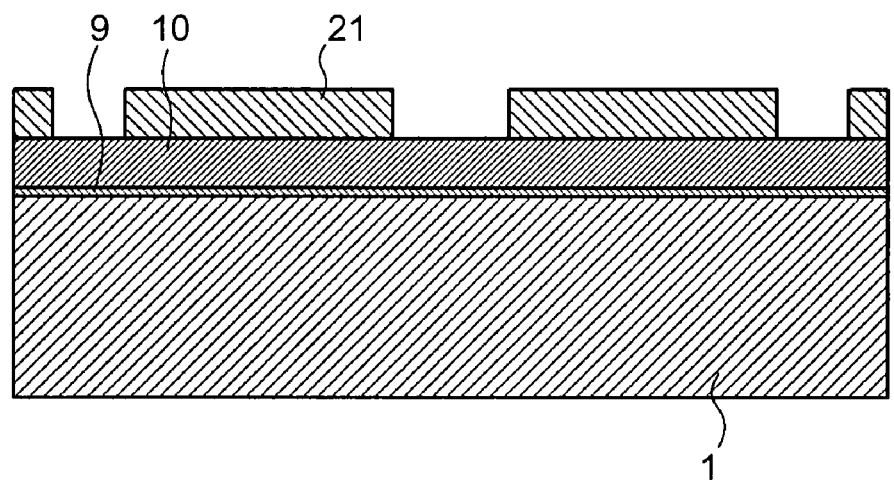
FIG. 42 is a cross-sectional view for explaining a process of manufacturing the semiconductor device according to the fifth embodiment.
Figure 43:
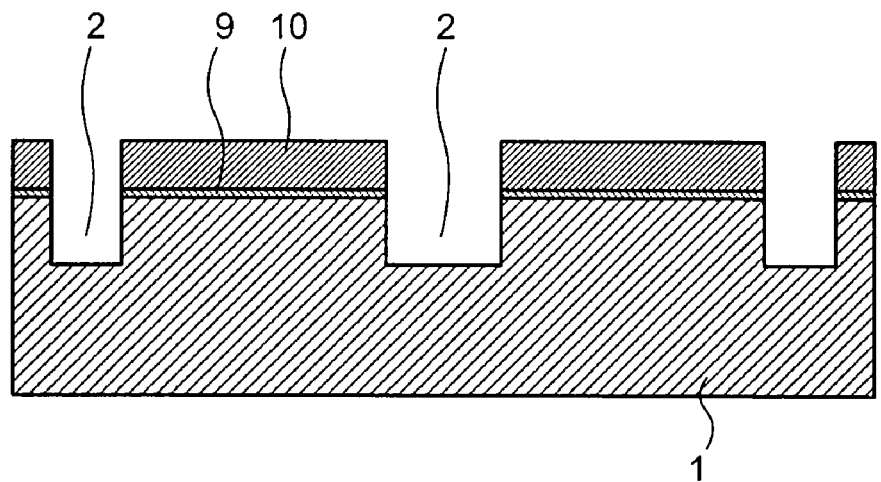
FIG. 43 is a cross-sectional view for explaining a process of manufacturing the semiconductor device according to the fifth embodiment.

First, as shown in FIG. 41, the upper surface of the silicon substrate 1 is thermal oxidized to form the silicon oxide film 9 in a film thickness of about 5 nanometers to 30 nanometers. Next, as shown in FIG. 41, the silicon nitride film 10 is formed in a film thickness of about 50 nanometers to 200 nanometers, on the silicon oxide film 9. The photoresist 21 is patterned to form an opening in which a trench is to be formed, using a photoengraving technique and a dry etching technique, as shown in FIG. 42. The silicon nitride film 10, the silicon oxide film 9, and the silicon substrate 1 are anisotropically etched to form the trench 2, using the photoresist 21 as a mask, and the photoresist 21 is removed. FIG. 43 depicts a state after the photoresist 21 is removed. The trench 2 has a depth of about 150 nanometers to 500 nanometers from the substrate surface.

Figure 44:
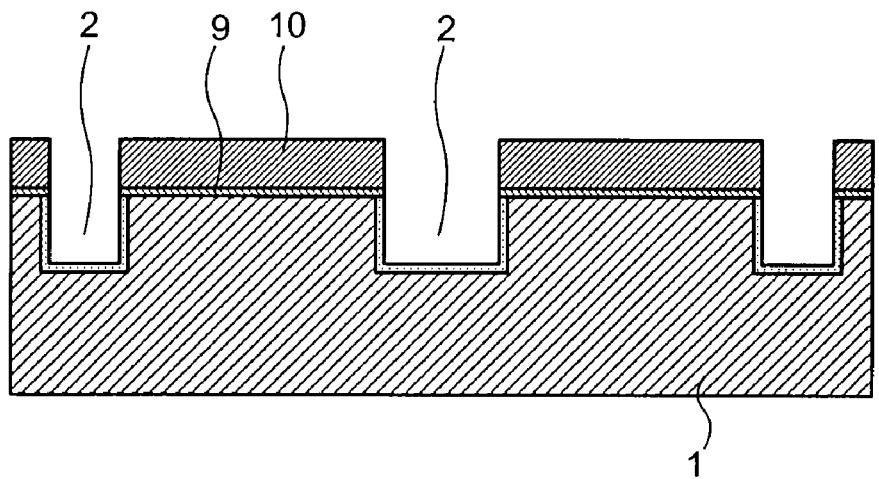
FIG. 44 is a cross-sectional view for explaining a process of manufacturing the semiconductor device according to the fifth embodiment.

After the trench 2 is formed, the surface of the inner wall of the trench 2 is thermal oxidized to remove damaged parts of the inner wall of the trench 2, that is, the inner surface and the bottom surface of the trench 2. At the same time, as shown in FIG. 44, the silicon oxide film 3 as an inner wall oxide film or as a protection film is formed on the inner wall of the trench 2. This silicon oxide film 3 is formed in a thickness of about 5 nanometers to 30 nanometers.

Figure 45:
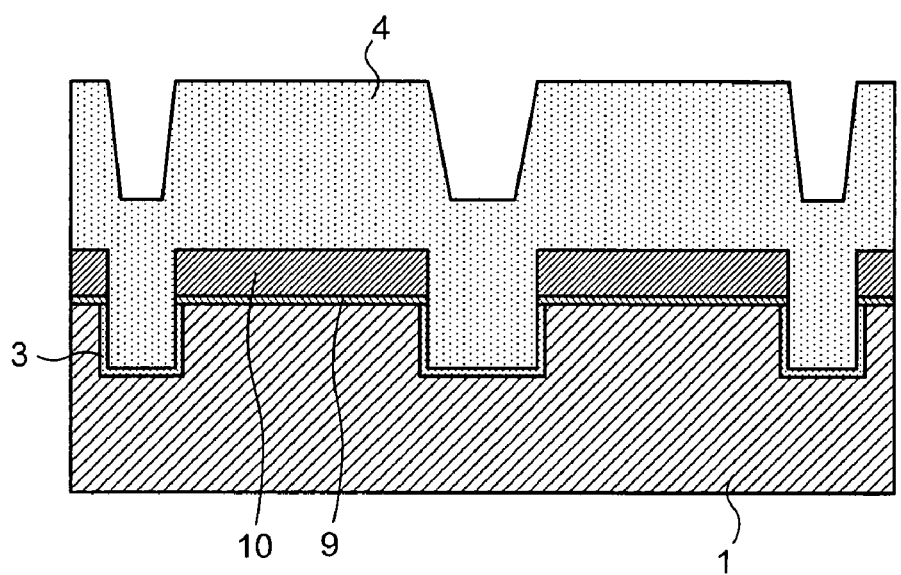
FIG. 45 is a cross-sectional view for explaining a process of manufacturing the semiconductor device according to the fifth embodiment.

As shown in FIG. 45, the polysilicon film 4 doped with phosphor is deposited on the inner wall of the trench 2 and on the silicon nitride film 10, by the CVD method, for example. The polysilicon film 4 not doped with an impurity is deposited in a film thickness larger than the total of the depth of the trench 2, the film thickness of the silicon nitride film 10, and the film thickness of the silicon oxide film 9. With this arrangement, a polysilicon film is completely filled in the total trench width of the trench 2.

Figure 46:
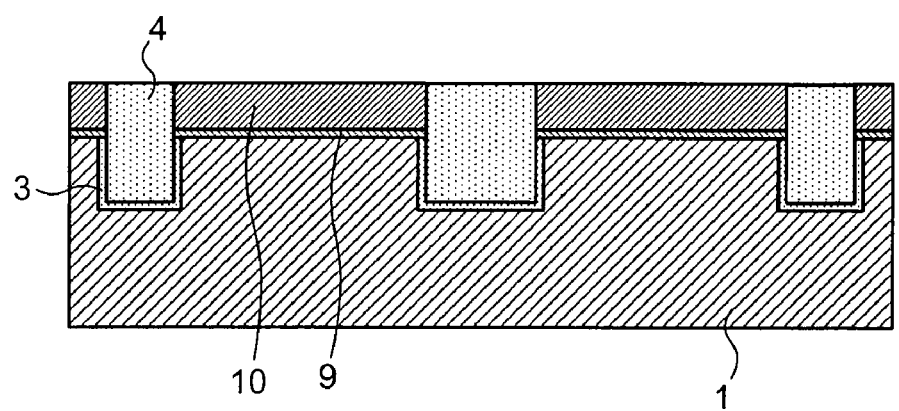
FIG. 46 is a cross-sectional view for explaining a process of manufacturing the semiconductor device according to the fifth embodiment.

After the polysilicon film 4 is deposited, the surface of the polysilicon film 4 is polished by the CMP method to remove the polysilicon film 4 on the silicon nitride film 10 as shown in FIG. 46.

Figure 47:
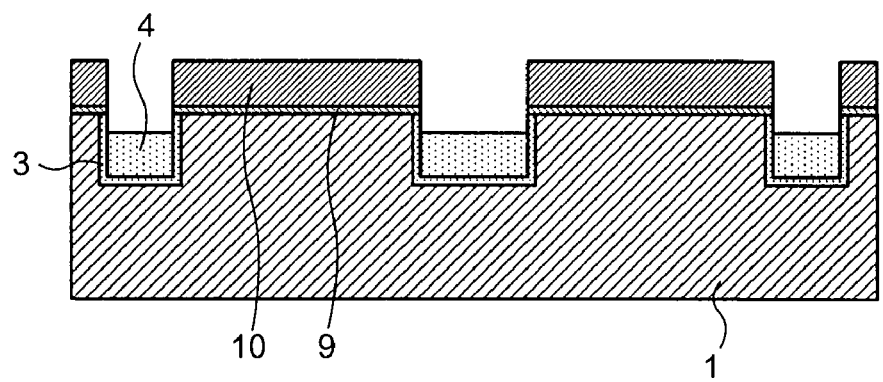
FIG. 47 is a cross-sectional view for explaining a process of manufacturing the semiconductor device according to the fifth embodiment.
Figure 48:
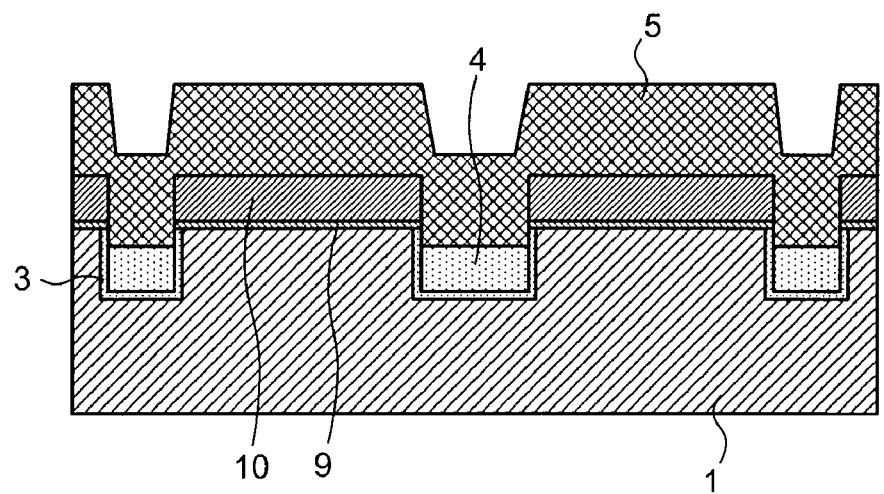
FIG. 48 is a cross-sectional view for explaining a process of manufacturing the semiconductor device according to the fifth embodiment.

Next, the polysilicon film 4 is etched back by the anisotropic etching to adjust the height of the surface of the polysilicon film 4 to be lower than the height of the surface of the silicon substrate 1 as shown in FIG. 47. The silicon oxide film 5 is deposited to fill the trench 2 by the CVD (chemical vapor deposition) method, as shown in FIG. 48. For the CVD method, the high-density plasma CVD (chemical vapor deposition) method (hereinafter, "HDP CVD method") can be used.

Figure 49:
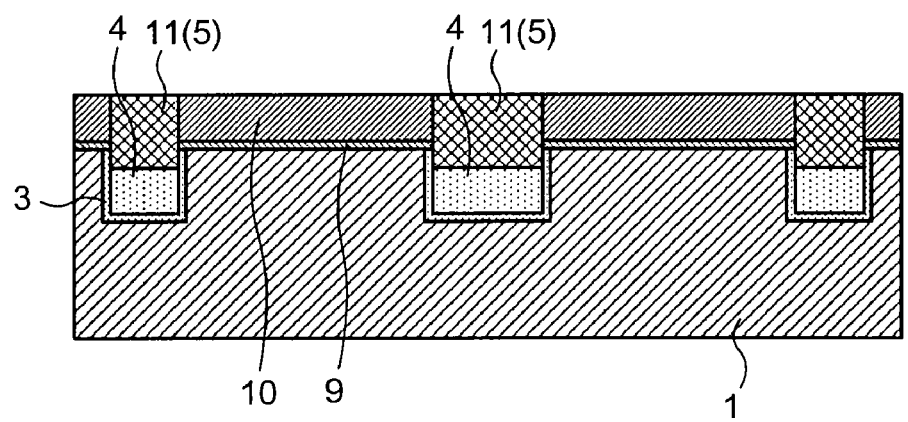
FIG. 49 is a cross-sectional view for explaining a process of manufacturing the semiconductor device according to the fifth embodiment.

After the silicon oxide film 5 is deposited, the entire surface of the silicon oxide film 5 is polished by the CMD method using the silicon nitride film 10 as a stopper. The cap oxide film 11 is formed by flattening the silicon oxide film 5 and by removing the silicon oxide film 5 formed on the silicon nitride film 10, as shown in FIG. 49.

Figure 50:
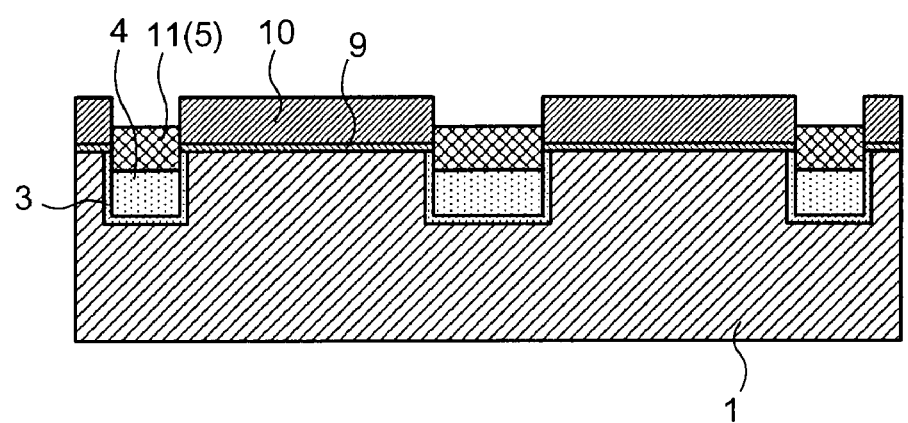
FIG. 50 is a cross-sectional view for explaining a process of manufacturing the semiconductor device according to the fifth embodiment.
Figure 51:
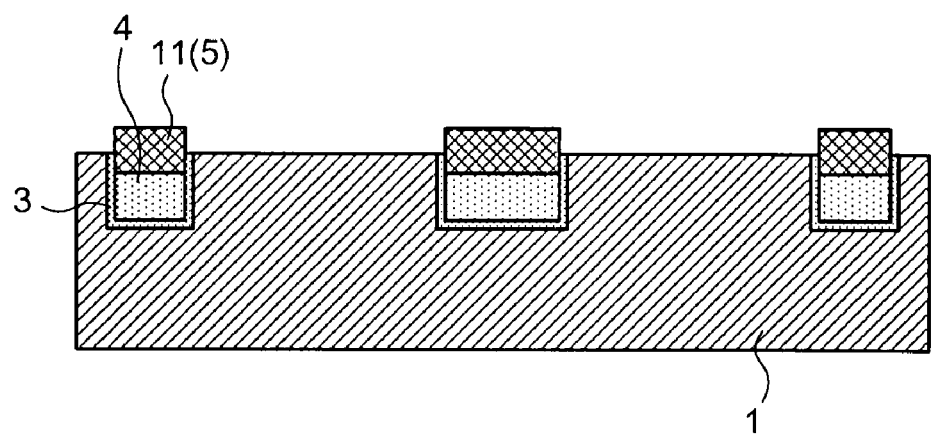
FIG. 51 is a cross-sectional view for explaining a process of manufacturing the semiconductor device according to the fifth embodiment.

Next, to adjust the height of the trench-type element isolation structure 60, a part of the surface of the cap oxide film 11 (the silicon oxide film 5) in the trench 2 is removed using hydrofluoric acid, so that the height of the surface of the cap oxide film 11 (the silicon oxide film 5) is adjusted as shown in FIG. 50. The silicon nitride film 10 is removed using thermal phosphoric acid, for example. Further, the silicon oxide film 9 is removed using hydrofluoric acid to complete the trench-type element isolation structure 60 as shown in FIG. 51.

Figure 52:
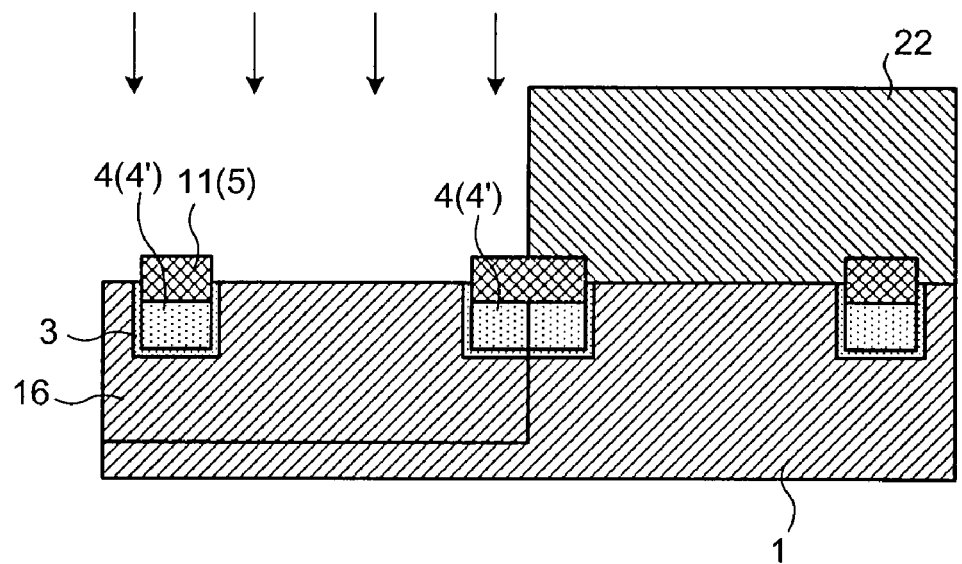
FIG. 52 is a cross-sectional view for explaining a process of manufacturing the semiconductor device according to the fifth embodiment.

Next, using a photoengraving technique, a resist 22 having an opening that becomes a region of the p-well region 16 is formed as shown in FIG. 52. Boron (B) ion is implanted at multiple stages by changing energy using the resist as a mask. As one example of the implanting condition, the following condition is set, that is, $1 \times 10^{13}/cm^2$ at 300 kiloelectron volts, $6 \times 10^{12}/cm^2$ at 100 kiloelectron volts, and $1 \times 10^{13}/cm^2$ at 10 kiloelectron volts. Based on this implantation, the lower end is formed in the p-well region 16 deeper than the lower surface of the trench 2. At the same time, boron (B) ion is also implanted into the polysilicon film 4 of the p-well region 16 to form a polysilicon film 4'.

Figure 53:
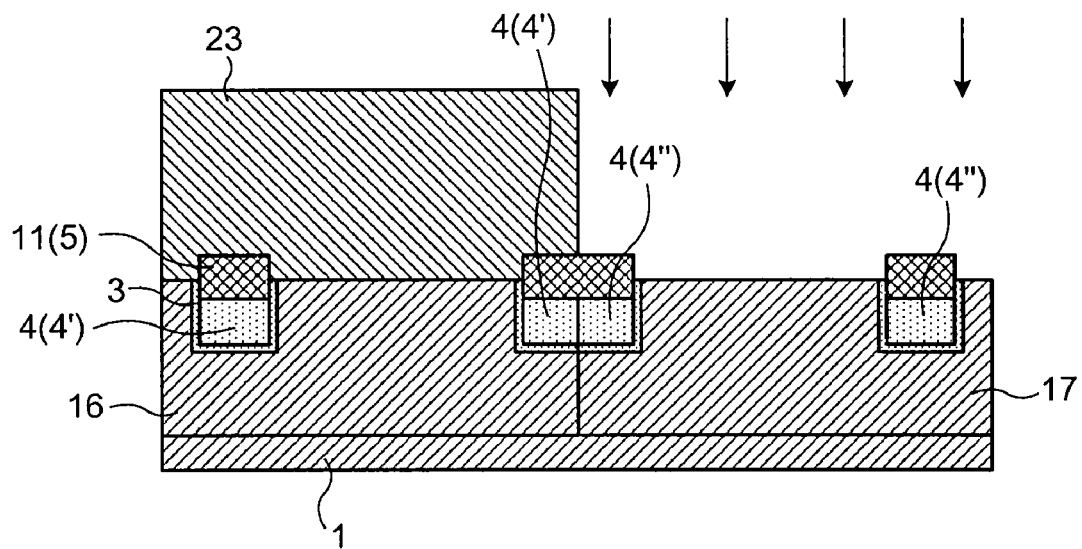
FIG. 53 is a cross-sectional view for explaining a process of manufacturing the semiconductor device according to the fifth embodiment.

Next, using a photoengraving technique, a resist 23 having an opening that becomes a region of the n-well region 17 is formed as shown in FIG. 53. Phosphor (P) ion is implanted at multiple stages by changing energy using the resist as a mask. As one example of the implanting condition, the following condition is set, that is, $1 \times 10^{13}/cm^2$ at 600 kiloelectron volts, $6 \times 10^{12}/cm^2$ at 300 kiloelectron volts, and $1 \times 10^{13}/cm^2$ at 30 kiloelectron volts. Based on this implantation, the lower end is formed in the n-well region 17 deeper than the lower surface of the trench 2. At the same time, phosphor (P) ion is also implanted into the polysilicon film 4" of the n-well region 17 to form a polysilicon film 4".

After the p-well region 16 and the n-well region 17 are completed, the gate insulating film 6 is formed on the silicon substrate 1, and a gate electrode material such as polysilicon and tungsten silicide is deposited on the gate insulating film 6, and a patterning is carried out to form the gate electrode 7, following the conventionally-known MOSFET (Metal Oxide Semiconductor Field Effect Transistor) formation process.

By using the ion implantation method and by adjusting an implantation amount and implantation energy, a low-concentration impurity diffusion layer is formed on the gate electrode 7 in a self-aligned manner, and the sidewall 15 is formed on the sidewall of the gate electrode 7. Thereafter, a high-concentration impurity diffusion layer is formed at a position deeper than the low-concentration impurity diffusion layer, and the source/drain diffusion layer 8 is formed. In the present embodiment, the lower end of the source/drain region is adjusted to become lower than the height of the surface of the polysilicon film 4 filled in the trench 2 on the sidewall of the trench 2. In this case, using a photoengraving technique, an NMOS transistor is formed in the p-well region 16, and a PMOS transistor is formed in the n-well region 17, by separating conductivity of the impurities to be introduced. As a result, a semiconductor device as shown in FIG. 40 can be manufactured.

In the method of manufacturing a semiconductor device according to the present embodiment, polysilicon in the trench 2 of the p-well region 16 is formed as a p-type polysilicon film 4' doped in the p-type, and polysilicon in the trench 2 of the n-well region 17 is formed as the n-type polysilicon film 4" doped in the n-type. With this arrangement, the method of manufacturing a semiconductor device according to the present embodiment achieves an effect that the bottom surface and the sidewall of the trench 2 in the semiconductor substrate 1 are not easily inverted, in addition to the effects explained in the second embodiment, thereby improving the element isolation capacity. Therefore, in the method of manufacturing a semiconductor device according to the present embodiment, a high-quality semiconductor device having excellent element isolation capacity can be manufactured. Further, in the method of manufacturing a semiconductor device according to the present embodiment, plural different impurities are introduced into the polysilicon film in the trench, in the same process as the well formation process. Therefore, the number of manufacturing processes does not increase.

Sixth Embodiment

Figure 54:
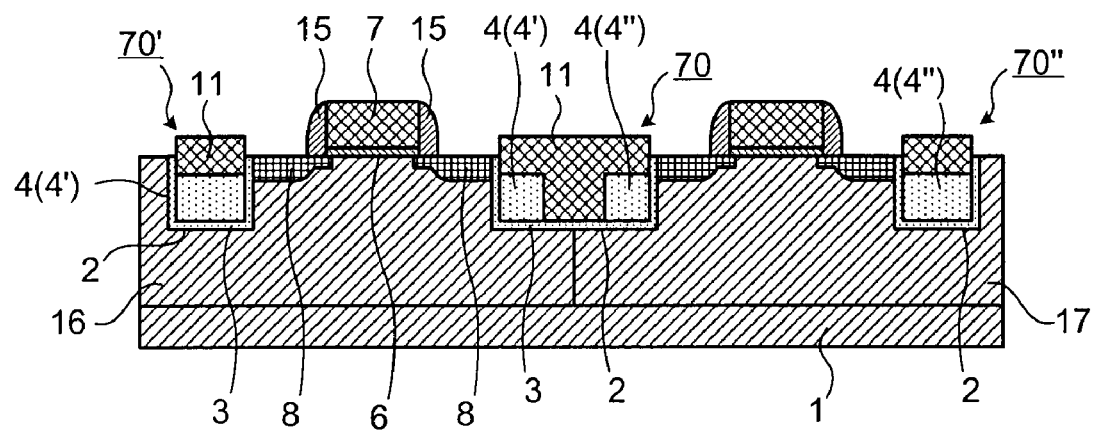
FIG. 54 is a cross-sectional view of a schematic configuration of a semiconductor device according to a sixth embodiment.

FIG. 54 is a cross-sectional view of a schematic configuration of a semiconductor device according to a sixth embodiment of the present invention. In this semiconductor device, the p-well region 16 doped with a p-type impurity and the n-well region 17 doped with an n-type impurity are formed. The trench 2 provided in the p-well region 16 and the n-well region 17 includes within thin trench-type element isolation structures 70, 70', 70" in which the polysilicon film 4 as a conductive film is disposed via the silicon oxide film 3. The trench-type element isolation structures 70', 70" are disposed on the entire bottom surface of the trench 2 over the total trench width. In the trench-type element isolation structure 70, the polysilicon film 4 (4', 4") in the trench 2 is formed only on the sidewall sides on the bottom surface of the trench 2, and is not present near the approximate center of the bottom surface of the trench 2.

In the trench-type element isolation structures 70, 70', 70", the cap oxide film 11 including a silicon oxide film formed by the CVD method is formed on the polysilicon film 4. Therefore, in the trench-type element isolation structures 70, 70', 70", a bird's beak is not present in the cap oxide film 11.

In the active region of elements, the gate electrode 7 is formed on the silicon substrate 1 via the gate insulating film 6. In the active region, there is also formed the source/drain diffusion layer 8 including a low-concentration impurity diffusion layer self-aligned with the gate electrode 7 via a channel region beneath the gate electrode 7, and a high-concentration impurity diffusion layer formed at a deeper position self-aligned with the gate electrode and the sidewall. In the above structure, an NMOS transistor is formed in the p-well region 16, and a PMOS transistor is formed in the n-well region 17.

In the drawings of FIG. 54 and after, members that are the same as those of the semiconductor device shown in FIG. 1 explained in the first embodiment are denoted with like reference numerals and their detailed explanations will be omitted to facilitate the understanding.

In the trench-type element isolation structures 70, 70', 70", the height of the surface of the polysilicon film 4 filled in the trench 2 is lower than the surface of the silicon substrate 1, and is higher than the lower end of the high-concentration source/drain diffusion layer 8 on the sidewall of the trench. The height of the polysilicon film 4 in the trench-type element isolation structures 70, 70', 70" is substantially constant in the entire trench-type element isolation structures 70, 70', 70", regardless of the width of the trench-type element isolation structures 70, 70', 70", that is the trench width of the trench 2. However, the height of the remaining polysilicon film 4 usually varies by about ±10% due to a variation in a manufacturing method such as a film formation, CMP, and etching. The polysilicon film 4 formed in the trench 2 of the p-well region 16 is the p-type polysilicon film 4' as a p-type conductive film, and the polysilicon film 4 formed in the trench 2 of the n-well region 17 is the n-type polysilicon film 4" as an n-type conductive film.

According to the semiconductor device of the present embodiment, polysilicon in the trench 2 of the p-well region 16 is formed as the p-type polysilicon film 4' doped in the p-type, and polysilicon in the trench 2 of the n-well region 17 is formed as the n-type polysilicon film 4" doped in the n-type. In the trench-type element isolation structure 70, the polysilicon film 4' and the polysilicon film 4" having different conductivities are completely separated from each other. With this arrangement, the semiconductor device according to the present embodiment achieves an effect that interference between conductive films, that is, between the polysilicon film 4' and the polysilicon film 4", can be prevented, in addition to the effects explained in the third and fifth embodiments, thereby improving stability of transistor elements. Therefore, according to the semiconductor device of the present embodiment, a high-quality semiconductor device with excellent stability of operation is realized.

A method of manufacturing the semiconductor device according to the present embodiment is explained with reference to the drawings.

Figure 55:
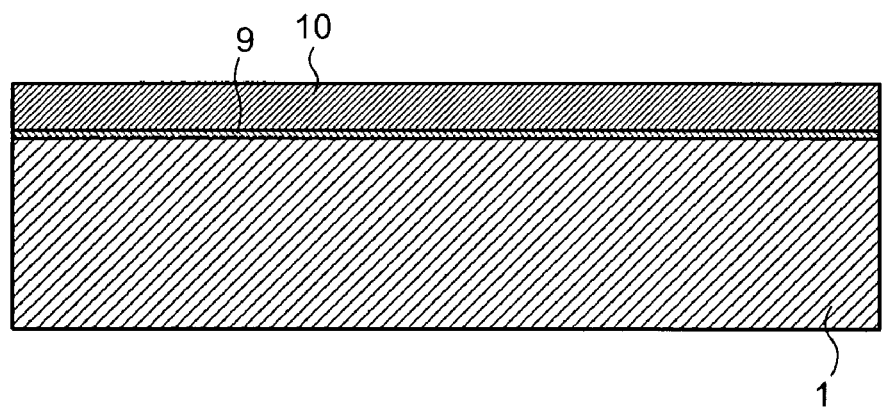
FIG. 55 is a cross-sectional view for explaining a process of manufacturing the semiconductor device according to the sixth embodiment.
Figure 56:
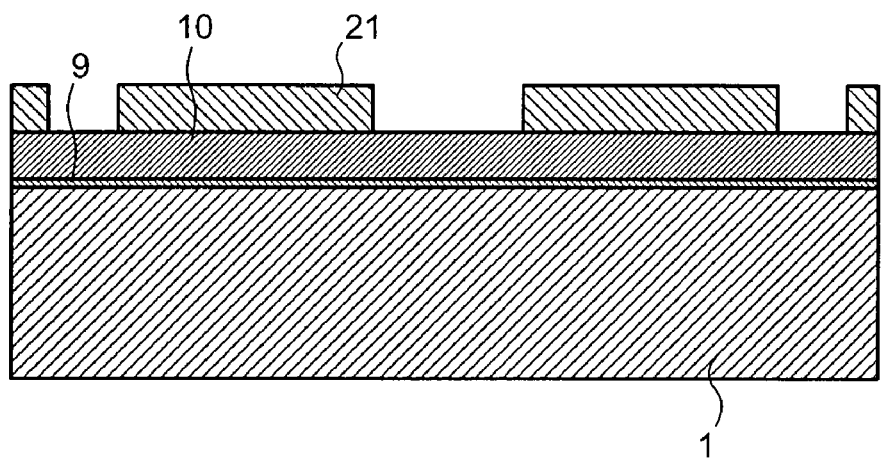
FIG. 56 is a cross-sectional view for explaining a process of manufacturing the semiconductor device according to the sixth embodiment.
Figure 57:
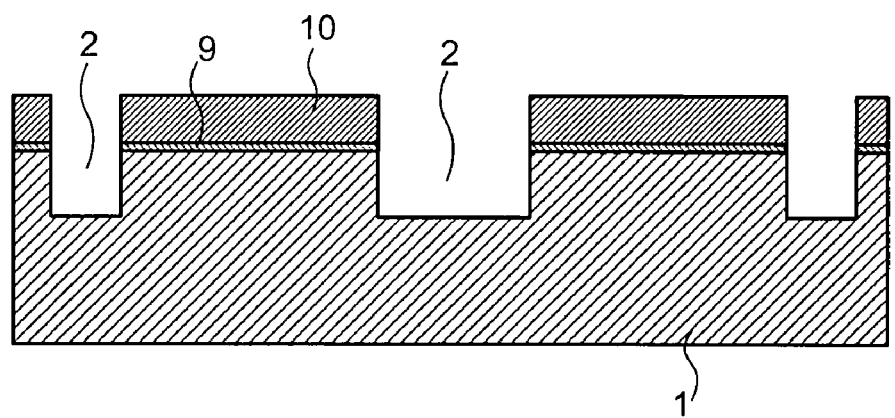
FIG. 57 is a cross-sectional view for explaining a process of manufacturing the semiconductor device according to the sixth embodiment.

First, as shown in FIG. 55, the upper surface of the silicon substrate 1 is thermal oxidized to form the silicon oxide film 9 in a film thickness of about 5 nanometers to 30 nanometers. Next, as shown in FIG. 55, the silicon nitride film 10 is formed in a film thickness of about 50 nanometers to 200 nanometers, on the silicon oxide film 9. The photoresist 21 is patterned to form an opening in which a trench is to be formed, using a photoengraving technique and a dry etching technique, as shown in FIG. 56. The silicon nitride film 10, the silicon oxide film 9, and the silicon substrate 1 are anisotropically etched to form the trench 2, using the photoresist 21 as a mask, and the photoresist 21 is removed. FIG. 57 depicts a state after the photoresist 21 is removed. The trench 2 has a depth of about 150 nanometers to 500 nanometers from the substrate surface.

Figure 58:
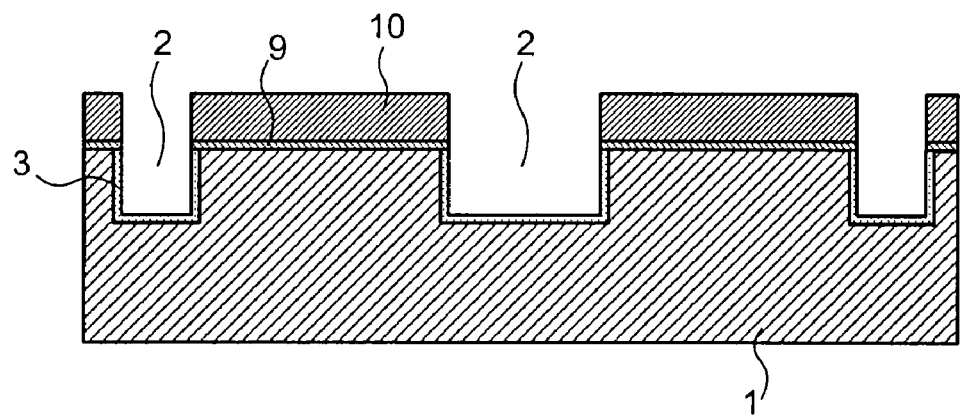
FIG. 58 is a cross-sectional view for explaining a process of manufacturing the semiconductor device according to the sixth embodiment.

After the trench 2 is formed, the surface of the inner wall of the trench 2 is thermal oxidized to remove damaged parts of the inner wall of the trench 2, that is, the inner surface and the bottom surface of the trench 2. At the same time, as shown in FIG. 58, the silicon oxide film 3 as an inner wall oxide film or as a protection film is formed on the inner wall of the trench 2. This silicon oxide film 3 is formed in a thickness of about 5 nanometers to 30 nanometers.

Figure 59:
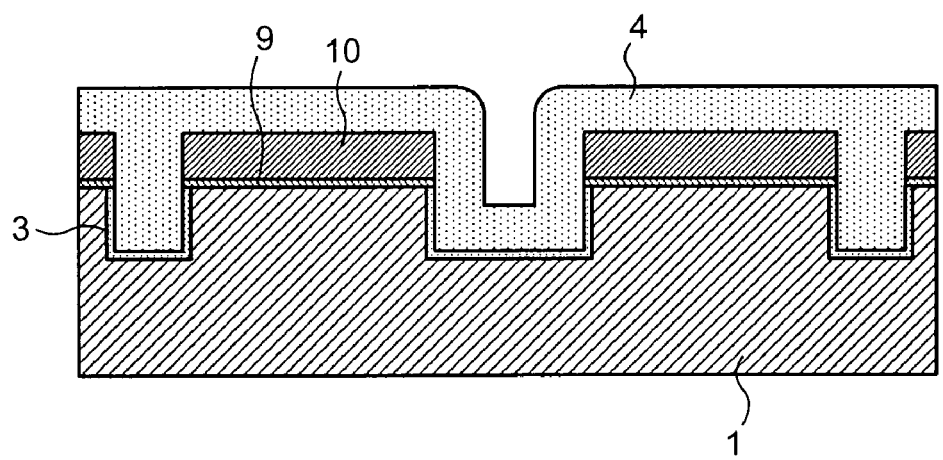
FIG. 59 is a cross-sectional view for explaining a process of manufacturing the semiconductor device according to the sixth embodiment.

As shown in FIG. 59, the polysilicon film 4 not doped with an impurity is deposited on the inner wall of the trench 2 and on the silicon nitride film 10, in a film thickness of equal to or larger than one half of the minimum trench width of the trench 2, by the CVD method, for example. When the film thickness of the polysilicon film 4 is equal to or larger than one half of the minimum trench width of the trench 2, the polysilicon film 4 is completely filled in the region of the element isolation structures 70', 70" in which the trench width of the trench is small as shown in FIG. 59. On the other hand, in the region of the element isolation structure 70 in which the trench width of the trench is larger than two times the film thickness of polysilicon, the polysilicon film 4 is deposited on the bottom surface and the sidewall of the trench as shown in FIG. 59. In the present embodiment, the polysilicon film 4 is deposited in a film thickness smaller than a total of the depth of the trench 2, the film thickness of the silicon nitride film 10, and the film thickness of the silicon oxide film 9. In this case, the polysilicon film 4 is not filled in the approximate center of the trench 2, and a space is formed.

When the minimum trench width of the trench 2 is 200 nanometers, for example, the polysilicon film 4 doped with phosphor is deposited in a film thickness of about 120 nanometers to 200 nanometers. When a film thickness of the deposited polysilicon film 4 is 150 nanometers, the polysilicon film 4 is completely filled in a trench area of the trench 2 having a trench width equal to or smaller than 300 nanometers. On the other hand, when a film thickness of the polysilicon film 4 is 150 nanometers, the polysilicon film 4 is deposited on the bottom and the sidewall of the trench part in the trench 2 having a trench width equal to or larger than 300 nanometers. In this case, the polysilicon film 4 is not filled in the approximate center of the trench 2, and a space is formed at the center.

Figure 60:
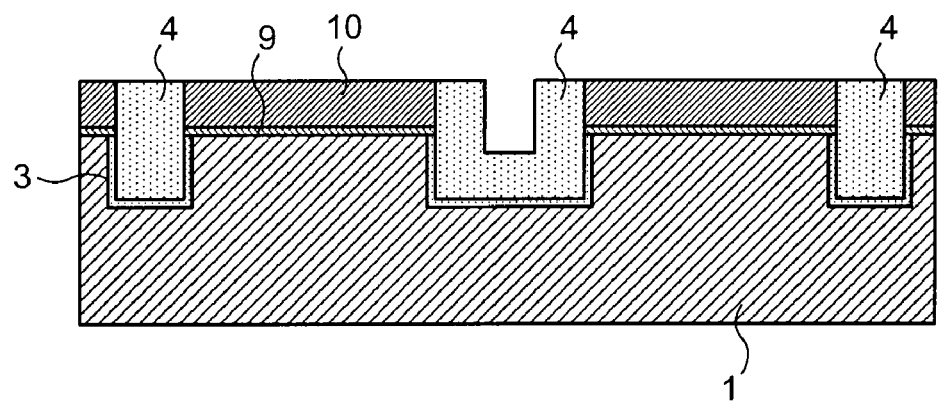
FIG. 60 is a cross-sectional view for explaining a process of manufacturing the semiconductor device according to the sixth embodiment.

After the polysilicon film 4 is deposited, the surface of the polysilicon film 4 is polished by the CMP method to remove the polysilicon film 4 on the silicon nitride film 10 as shown in FIG. 60.

Figure 61:
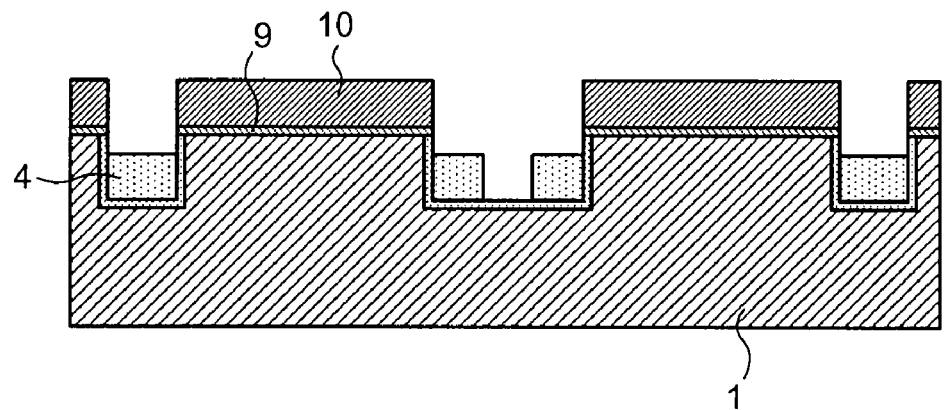
FIG. 61 is a cross-sectional view for explaining a process of manufacturing the semiconductor device according to the sixth embodiment.

Next, the polysilicon film 4 is etched back by the anisotropic etching to adjust the height of the surface of the polysilicon film 4 to be lower than the height of the surface of the silicon substrate 1 as shown in FIG. 61. In this case, the polysilicon film 4 at the center of the bottom of the trench having a large trench width is also removed. Therefore, the polysilicon film 4 remains on only the sidewall of the trench. In other words, in the present embodiment, the polysilicon film 4 is deposited in a film thickness smaller than a total of the depth of the trench 2, the film thickness of the silicon nitride film 10, and the film thickness of the silicon oxide film 9. With this arrangement, in the present embodiment, the polysilicon film 4 is not filled in the approximate center of the trench 2, and the silicon oxide film 3 on the trench bottom surface is exposed, in the region of the element isolation structure 70 in which a trench width of the trench is larger than two times the film thickness of polysilicon, as shown in FIG. 61.

Figure 62:
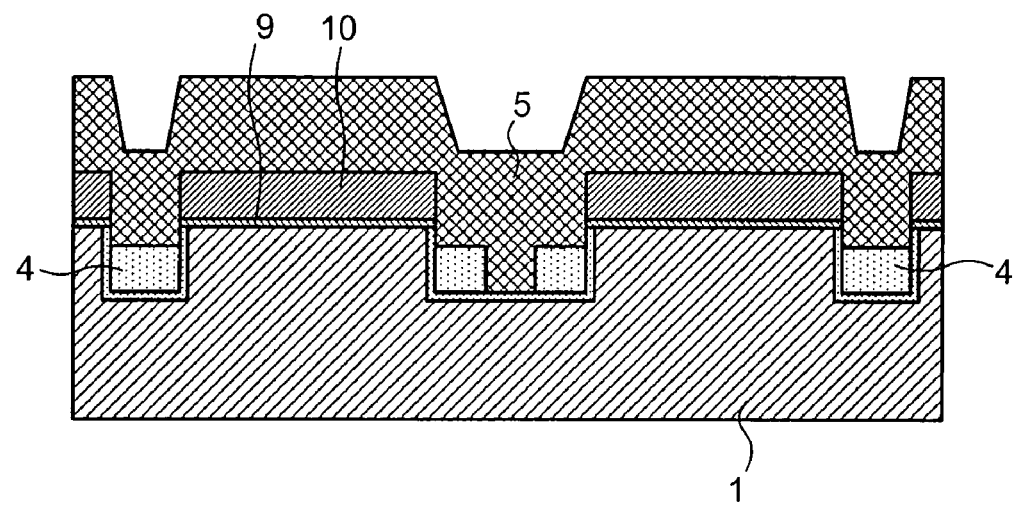
FIG. 62 is a cross-sectional view for explaining a process of manufacturing the semiconductor device according to the sixth embodiment.

The silicon oxide film 5 is deposited to embed the trench 2 by the CVD (chemical vapor deposition) method, as shown in FIG. 62. For the CVD method, the high-density plasma CVD (chemical vapor deposition) method (hereinafter, "HDP CVP method") can be used.

Figure 63:
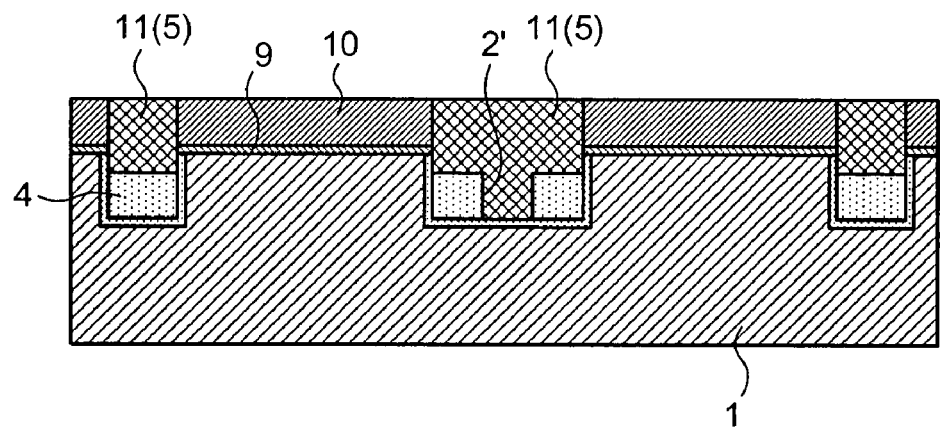
FIG. 63 is a cross-sectional view for explaining a process of manufacturing the semiconductor device according to the sixth embodiment.

After the silicon oxide film 5 is deposited, the entire surface of the silicon oxide film 5 is polished by the CMD method using the silicon nitride film 10 as a stopper. The cap oxide film 11 is formed by flattening the silicon oxide film 5 and by removing the silicon oxide film 5 formed on the silicon nitride film 10, as shown in FIG. 63. In this case, the cap oxide film 11 is also filled in the trench 2' formed by the polysilicon film 4 present on the inner wall of the trench 2, in the region of the element isolation structure 70 in which the trench width of the trench 2 is larger than two times the polysilicon film 4. In other words, the silicon oxide film 5 and the silicon oxide film 3 are brought into contact with each other at the approximate center of the bottom surface of the trench 2.

Figure 64:
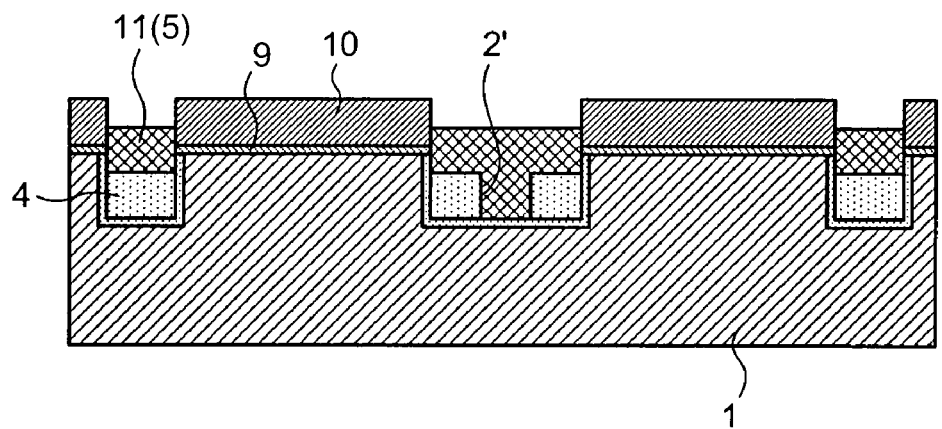
FIG. 64 is a cross-sectional view for explaining a process of manufacturing the semiconductor device according to the sixth embodiment.
Figure 65:
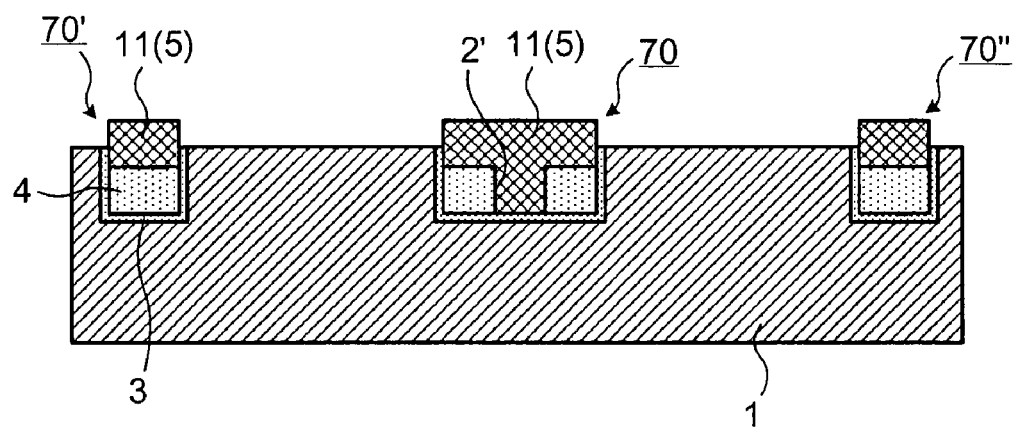
FIG. 65 is a cross-sectional view for explaining a process of manufacturing the semiconductor device according to the sixth embodiment.

Next, to adjust the height of the trench-type element isolation structures, a part of the surface of the cap oxide film 11 (the silicon oxide film 5) in the trench 2 is removed using hydrofluoric acid to adjust the height of the surface of the cap oxide film 11 (the silicon oxide film 5) as shown in FIG. 64. The silicon nitride film 10 is removed using thermal phosphoric acid, for example. Further, the silicon oxide film 9 is removed using hydrofluoric acid to complete the trench-type element isolation structures 70, 70', 70'' as shown in FIG. 65.

Figure 66:
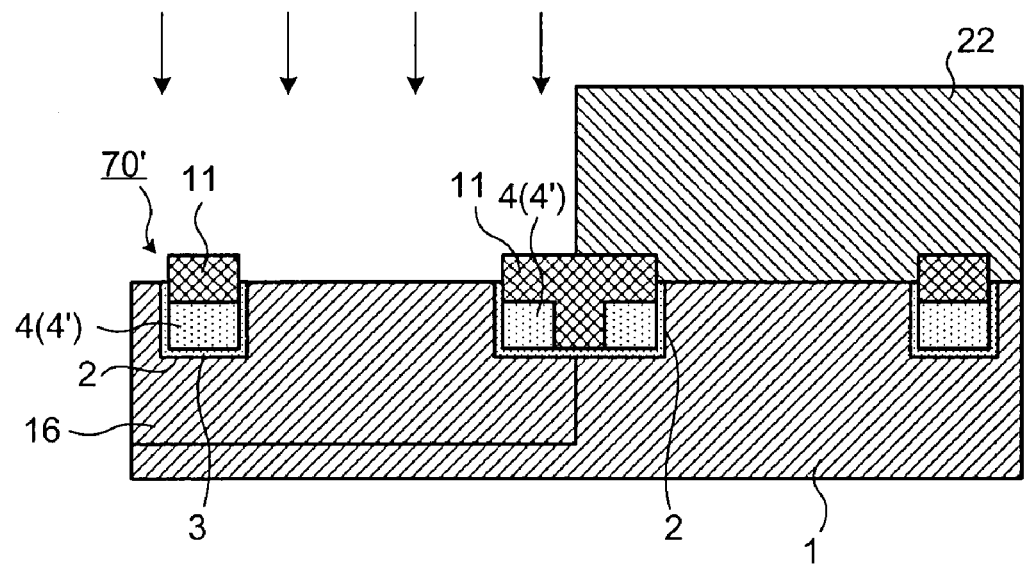
FIG. 66 is a cross-sectional view for explaining a process of manufacturing the semiconductor device according to the sixth embodiment.

Next, using a photoengraving technique, the resist 22 having an opening that becomes a region of the p-well region 16 is formed as shown in FIG. 66. Boron (B) ion is implanted at multiple stages by changing energy using the resist as a mask. As one example of the implanting condition, the following condition is set, that is $1\times10^{13}/cm^2$ at 300 kiloelectron volts, $6\times10^{12}/cm^2$ at 100 kiloelectron volts, and $1\times10^{13}/cm^2$ at 10 kiloelectron volts. Based on this implantation, the lower end is formed in the p-well region 16 deeper than the lower surface of the trench 2. At the same time, boron (B) ion is also implanted into the polysilicon film 4 of the p-well region 16 to form the polysilicon film 4'.

Figure 67:
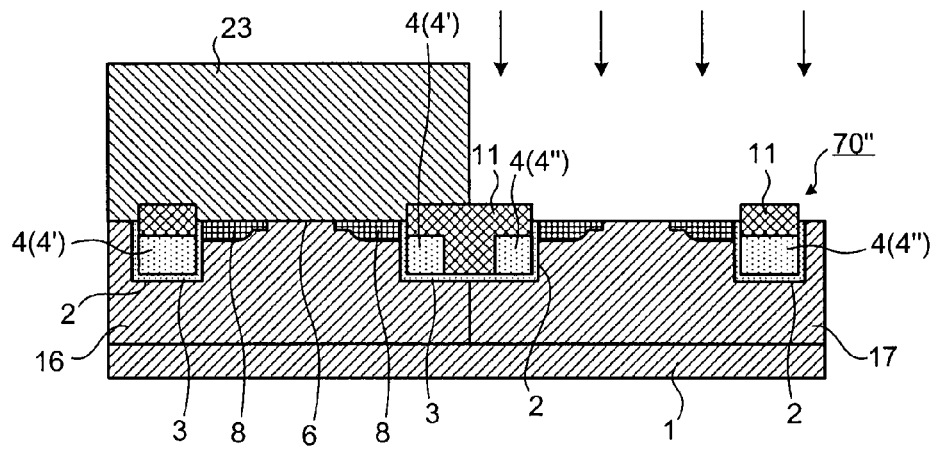
FIG. 67 is a cross-sectional view for explaining a process of manufacturing the semiconductor device according to the sixth embodiment.

Next, using a photoengraving technique, the resist 23 having an opening that becomes a region of the n-well region 17 is formed as shown in FIG. 67. Phosphor (P) ion is implanted at multiple stages by changing energy using the resist as a mask. As one example of the implanting condition, the following condition is set, that is, $1\times10^{13}/cm^2$ at 600 kiloelectron volts, $6\times10^{12}/cm^2$ at 300 kiloelectron volts, and $1\times10^{13}/cm^2$ at 30 kiloelectron volts. Based on this implantation, the lower end is formed in the n-well region 17 deeper than the lower surface of the trench 2. At the same time, phosphor (P) ion is also implanted into the polysilicon film 4'' of the n-well region 17 to form the polysilicon film 4''.

After the p-well region 16 and the n-well region 17 are completed, the gate insulating film 6 is formed on the silicon substrate 1, and a gate electrode material such as polysilicon and tungsten silicide is deposited on the gate insulating film 6, and a patterning is carried out to form the gate electrode 7, following the conventionally-known MOSFET (Metal Oxide Semiconductor Field Effect Transistor) formation process.

By using the ion implantation method and by adjusting an implantation amount and implantation energy, a low-concentration impurity diffusion layer is formed on the gate electrode 7 in a self-aligned manner, and the sidewall 15 is formed on the sidewall of the gate electrode 7. Thereafter, a high-concentration impurity diffusion layer is formed at a position deeper than the low-concentration impurity diffusion layer to form the source/drain diffusion layer 8. In the present embodiment, the lower end of the source/drain region is adjusted to become lower than the height of the surface of the polysilicon film 4 filled in the trench 2 on the sidewall of the trench 2. In this case, using a photoengraving technique, an NMOS transistor is formed in the p-well region 16, and a PMOS transistor is formed in the n-well region 17, by separating conductivity of the impurities to be introduced. As a result, a semiconductor device as shown in FIG. 54 can be manufactured.

In the method of manufacturing a semiconductor device according to the present embodiment, polysilicon in the trench 2 of the p-well region 16 is formed as the p-type polysilicon film 4' doped in the p-type, and polysilicon in the trench 2 of the n-well region 17 is formed as the n-type polysilicon film 4'' doped in the n-type. In the trench-type element isolation structure 70, the polysilicon film 4' and the polysilicon film 4'' having different conductivities are completely separated from each other. With this arrangement, the semiconductor device according to the present embodiment achieves an effect that interference between conductive films, that is, between the polysilicon film 4' and the polysilicon film 4'', can be prevented, in addition to the effects explained in the third and fifth embodiments, thereby improving stability of transistor elements. Therefore, in the method of manufacturing a semiconductor device according to the present embodiment, a high-quality semiconductor device with excellent stability of operation is realized.

Seventh Embodiment

Figure 68:
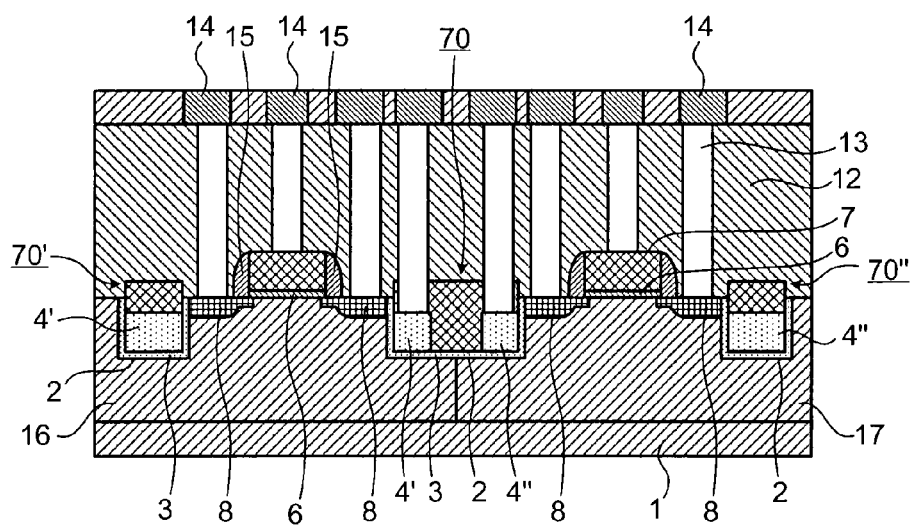
FIG. 68 is a cross-sectional view of a schematic configuration of a semiconductor device according to a seventh embodiment.

FIG. 68 is a cross-sectional view of a schematic configuration of a semiconductor device according to a seventh embodiment of the present invention. In this semiconductor device, the p-well region 16 doped with a p-type impurity and the n-well region 17 doped with an n-type impurity are formed. The trench 2 provided in the p-well region 16 and the n-well region 17 includes in this trench the thin trench-type element isolation structures 70, 70', 70" in which the polysilicon film 4 as a conductive film is disposed via the silicon oxide film 3. The trench-type element isolation structures 70', 70" are formed on the entire bottom surface of the trench 2 over the total trench width. In the trench-type element isolation structure 70, the polysilicon film 4 (4', 4") in the trench 2 is formed only on the sidewall sides on the bottom surface of the trench 2, and is not present near the approximate center of the bottom surface of the trench 2.

In the trench-type element isolation structures 70, 70', 70", the cap oxide film 11 including a silicon oxide film formed by the CVD method is formed on the polysilicon film 4. Therefore, in the trench-type element isolation structures 70, 70', 70", a bird's beak is not present in the cap oxide film 11.

In the active region of elements, the gate electrode 7 is formed on the silicon substrate 1 via the gate insulating film 6. In the active region, there is also formed the source/drain diffusion layer 8 including a low-concentration impurity diffusion layer self-aligned with the gate electrode 7 via a channel region beneath the gate electrode 7, and a high-concentration impurity diffusion layer formed at a deeper position self-aligned with the gate electrode and the sidewall. In the above structure, an NMOS transistor is formed in the p-well region 16, and a PMOS transistor is formed in the n-well region 17.

The interlayer insulating film 12 is formed on the trench-type element isolation structures 70, 70', 70", on the gate electrode 7, and on the source/drain diffusion layer 8, and these interlayer insulating films 12 are connected to the wiring layer 14 via the contact holes 13 formed in the interlayer insulating films 12.

In the drawings of FIG. 68 and after, members that are the same as those of the semiconductor device shown in FIG. 54 explained in the sixth embodiment are denoted with like reference numerals and their detailed explanations will be omitted to facilitate the understanding.

In the trench-type element isolation structures 70, 70', 70", the height of the surface of the polysilicon film 4 filled in the trench 2 is lower than the surface of the silicon substrate 1, and is higher than the lower end of the high-concentration source/drain diffusion layer 8 on the sidewall of the trench. The height of the polysilicon film 4 in the trench-type element isolation structures 70, 70', 70" is substantially constant in the entire trench-type element isolation structures 70, 70', 70", regardless of the width of the trench-type element isolation structures 70, 70', 70", that is the trench width of the trench 2. However, the height of the remaining polysilicon film 4 usually varies by about ±10% due to a variation in a manufacturing method such as a film formation, CMP, and etching. The polysilicon film 4 formed in the trench 2 of the p-well region 16 is the p-type polysilicon film 4' as a p-type conductive film, and the polysilicon film 4 formed in the trench 2 of the n-well region 17 is the n-type polysilicon film 4" as an n-type conductive film.

According to the semiconductor device of the present embodiment, polysilicon in the trench 2 of the p-well region 16 is formed as the p-type polysilicon film 4' doped in the p-type, and polysilicon in the trench 2 of the n-well region 17 is formed as the n-type polysilicon film 4" doped in the n-type. In the trench-type element isolation structure 70, the polysilicon film 4' and the polysilicon film 4" having different conductivities are completely separated from each other. These polysilicon films 4 (4', 4") are connected to the wiring layer 14 via the contact 13, and can be fixed at different potentials.

With this arrangement, the semiconductor device according to the present embodiment achieves an effect that an optimum voltage can be applied to each of the trench-type element isolation structure in the p-well region 16 and the trench-type element isolation structure in the n-well region 17, in addition to the effects explained in the third, fifth, and sixth embodiments, thereby improving the isolation characteristics by the trench-type element isolation. Therefore, according to the semiconductor device of the present embodiment, a high-quality semiconductor device with excellent stability of operation is realized.

For the application voltage, about 0 volt to −1 volt is preferable for the NMOS transistor, and about 0 volt to 1 volt is preferable for the PMOS transistor. As described in the third embodiment, it is preferable that the absolute value is equivalent to or lower than the power supply voltage.

A method of manufacturing the semiconductor device according to the present embodiment is explained with reference to the drawings.

Figure 69:
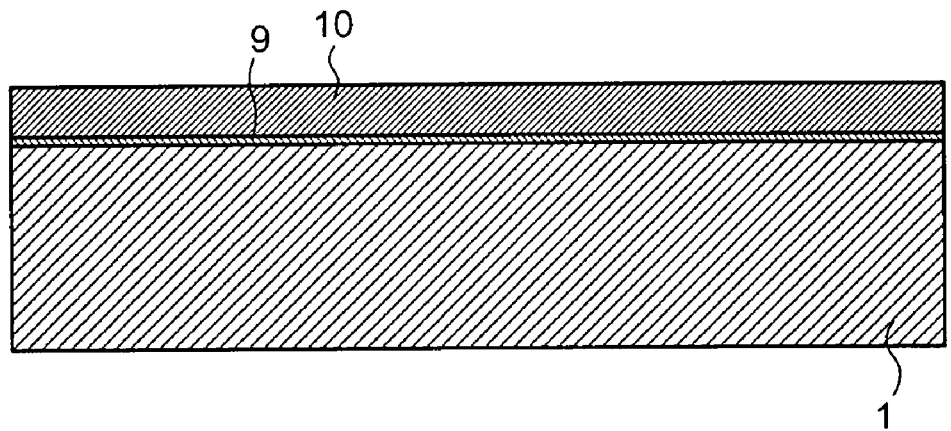
FIG. 69 is a cross-sectional view for explaining a process of manufacturing the semiconductor device according to the seventh embodiment.
Figure 70:
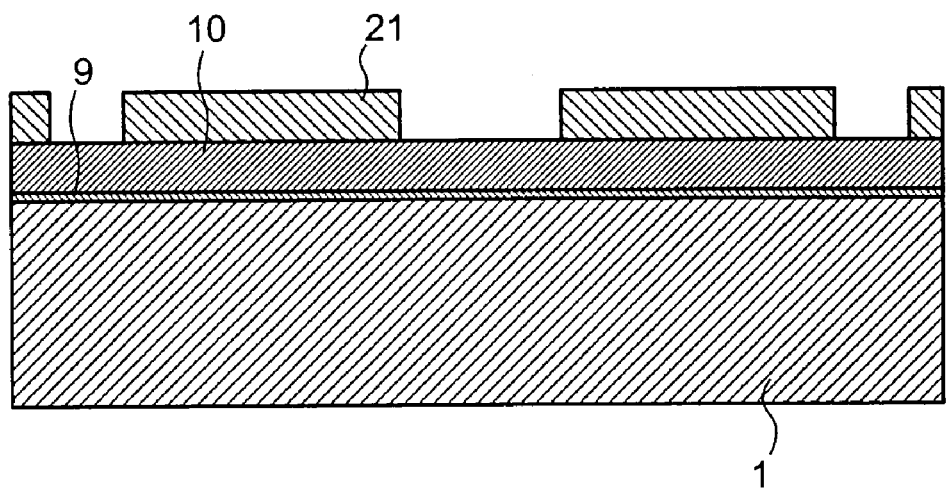
FIG. 70 is a cross-sectional view for explaining a process of manufacturing the semiconductor device according to the seventh embodiment.
Figure 71:
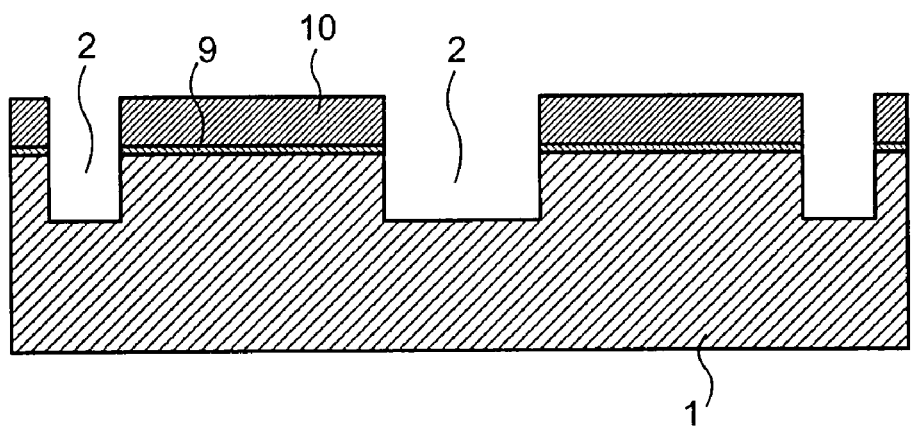
FIG. 71 is a cross-sectional view for explaining a process of manufacturing the semiconductor device according to the seventh embodiment.

First, as shown in FIG. 69, the upper surface of the silicon substrate 1 is thermal oxidized to form the silicon oxide film 9 in a film thickness of about 5 nanometers to 30 nanometers. Next, as shown in FIG. 69, the silicon nitride film 10 is formed in a film thickness of about 50 nanometers to 200 nanometers, on the silicon oxide film 9. The photoresist 21 is patterned to form an opening in which a trench is to be formed, using a photoengraving technique and a dry etching technique, as shown in FIG. 70. The silicon nitride film 10, the silicon oxide film 9, and the silicon substrate 1 are anisotropically etched to form the trench 2, using the photoresist 21 as a mask, and the photoresist 21 is removed. FIG. 71 depicts a state after the photoresist 21 is removed. The trench 2 has a depth of about 150 nanometers to 500 nanometers from the substrate surface.

Figure 72:
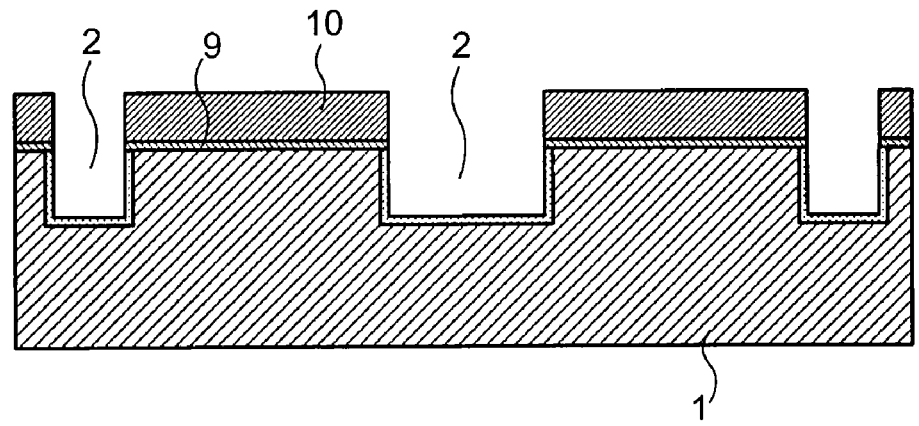
FIG. 72 is a cross-sectional view for explaining a process of manufacturing the semiconductor device according to the seventh embodiment.

After the trench 2 is formed, the surface of the inner wall of the trench 2 is thermal oxidized to remove damaged parts of the inner wall of the trench 2, that is, the inner surface and the bottom surface of the trench 2. At the same time, as shown in FIG. 72, the silicon oxide film 3 as an inner wall oxide film or as a protection film is formed on the inner wall of the trench 2. This silicon oxide film 3 is formed in a thickness of about 5 nanometers to 30 nanometers.

Figure 73:
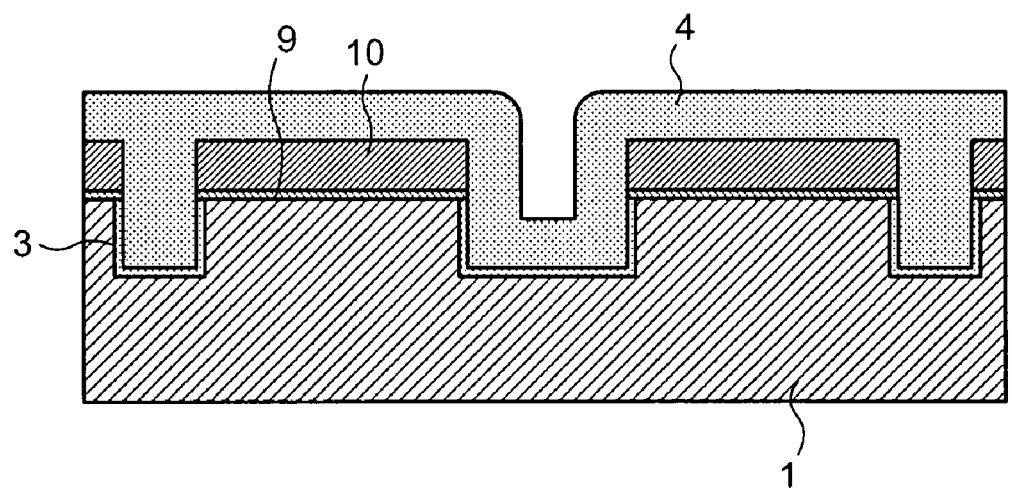
FIG. 73 is a cross-sectional view for explaining a process of manufacturing the semiconductor device according to the seventh embodiment.

As shown in FIG. 73, the polysilicon film 4 not doped with an impurity is deposited on the inner wall of the trench 2 and on the silicon nitride film 10, in a film thickness of equal to or larger than one half of the minimum trench width of the trench 2, by the CVD method, for example. When the film thickness of the polysilicon film 4 is equal to or larger than one half of the minimum trench width of the trench 2, the polysilicon film 4 is completely filled in the region of the element isolation structures 70', 70" in which the trench width of the trench is small as shown in FIG. 73. On the other hand, in the region of the element isolation structure 70 in which the trench width of the trench is larger than two times the film thickness of polysilicon, the polysilicon film 4 is deposited on the bottom surface and the sidewall of the trench as shown in FIG. 73. In the present embodiment, the polysilicon film 4 is deposited in a film thickness smaller than a total of the depth of the trench 2, the film thickness of the silicon nitride film 10, and the film thickness of the silicon oxide film 9. In this case, the polysilicon film 4 is not filled in the approximate center of the trench 2, and a space is formed.

When the minimum trench width of the trench 2 is 200 nanometers, for example, the polysilicon film 4 doped with phosphor is deposited in a film thickness of about 120 nanometers to 200 nanometers. When a film thickness of the deposited polysilicon film 4 is 150 nanometers, the polysilicon film 4 is completely filled in a trench area of the trench 2 having a trench width equal to or smaller than 300 nanometers. On the other hand, when a film thickness of the polysilicon film 4 is 150 nanometers, the polysilicon film 4 is deposited on the bottom and the sidewall of the trench part in the trench 2 having a trench width equal to or larger than 300 nanometers. In this case, the polysilicon film 4 is not filled in the approximate center of the trench 2, and a space is formed at the center.

Figure 74:
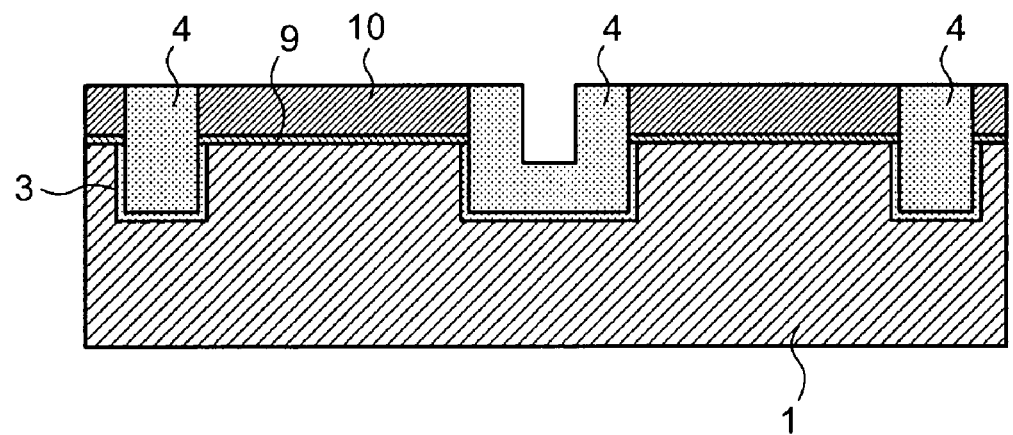
FIG. 74 is a cross-sectional view for explaining a process of manufacturing the semiconductor device according to the seventh embodiment.

After the polysilicon film 4 is deposited, the surface of the polysilicon film 4 is polished by the CMP method to remove the polysilicon film 4 on the silicon nitride film 10 as shown in FIG. 74.

Figure 75:
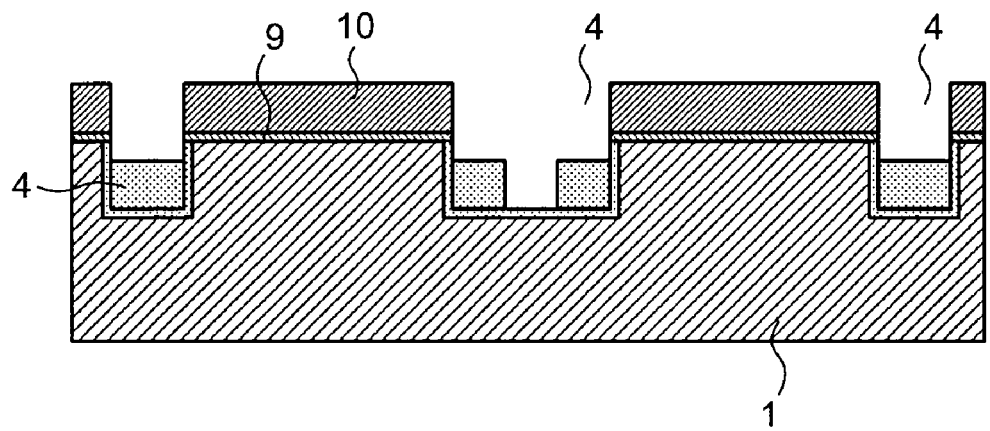
FIG. 75 is a cross-sectional view for explaining a process of manufacturing the semiconductor device according to the seventh embodiment.

Next, the polysilicon film 4 is etched back by the anisotropic etching to adjust the height of the surface of the polysilicon film 4 to be lower than the height of the surface of the silicon substrate 1 as shown in FIG. 75. In this case, the polysilicon film 4 at the center of the bottom of the trench having a large trench width is also removed. Therefore, the polysilicon film 4 remains on only the sidewall of the trench. In other words, in the present embodiment, the polysilicon film 4 is deposited in a film thickness smaller than a total of the depth of the trench 2, the film thickness of the silicon nitride film 10, and the film thickness of the silicon oxide film 9. With this arrangement, in the present embodiment, the polysilicon film 4 is not filled in the approximate center of the trench 2, and the silicon oxide film 3 on the trench bottom surface is exposed, in the region of the element isolation structure 70 in which a trench width of the trench is larger than two times the film thickness of polysilicon, as shown in FIG. 75.

Figure 76:
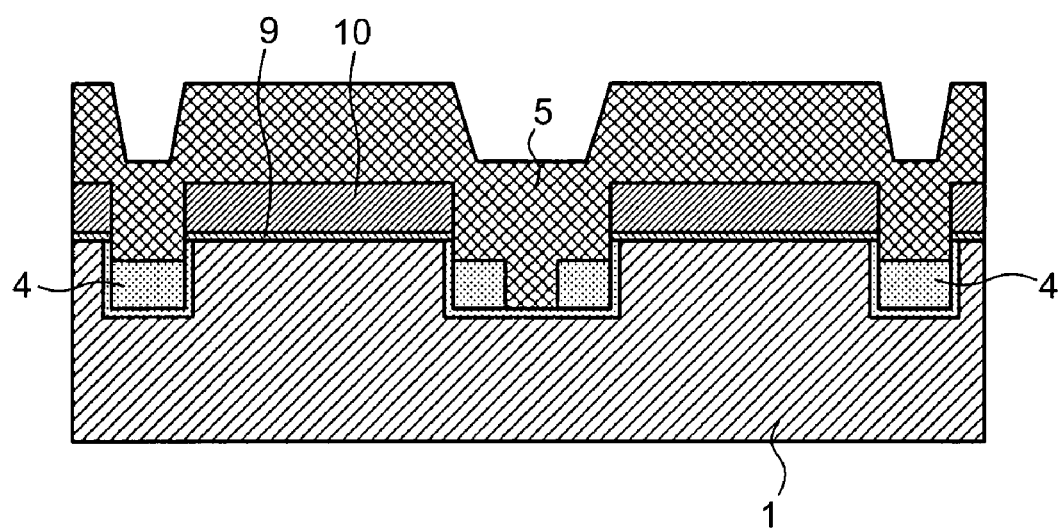
FIG. 76 is a cross-sectional view for explaining a process of manufacturing the semiconductor device according to the seventh embodiment.

The silicon oxide film 5 is deposited to fill the trench 2 by the CVD (chemical vapor deposition) method, as shown in FIG. 76. For the CVD method, the high-density plasma CVD (chemical vapor deposition) method (hereinafter, "the HDP CVP method") can be used.

Figure 77:
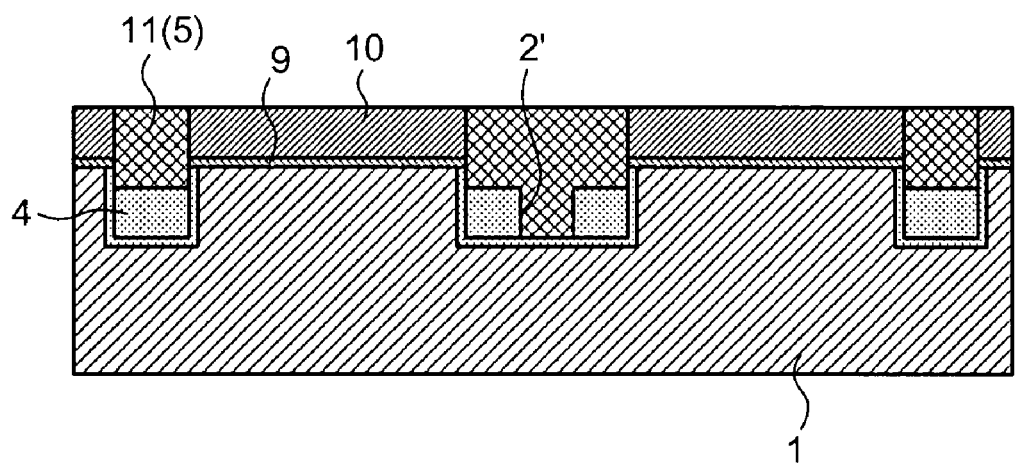
FIG. 77 is a cross-sectional view for explaining a process of manufacturing the semiconductor device according to the seventh embodiment.

After the silicon oxide film 5 is deposited, the entire surface of the silicon oxide film 5 is polished by the CMD method using the silicon nitride film 10 as a stopper. The cap oxide film 11 is formed by flattening the silicon oxide film 5 and by removing the silicon oxide film 5 formed on the silicon nitride film 10, as shown in FIG. 77. In this case, the cap oxide film 11 is also filled in the trench 2' formed by the polysilicon film 4 present on the inner wall of the trench 2, in the region of the element isolation structure 70 in which the trench width of the trench 2 is larger than two times the polysilicon film 4. In other words, the silicon oxide film 5 and the silicon oxide film 3 are brought into contact with each other at the approximate center of the bottom surface of the trench 2.

Figure 78:
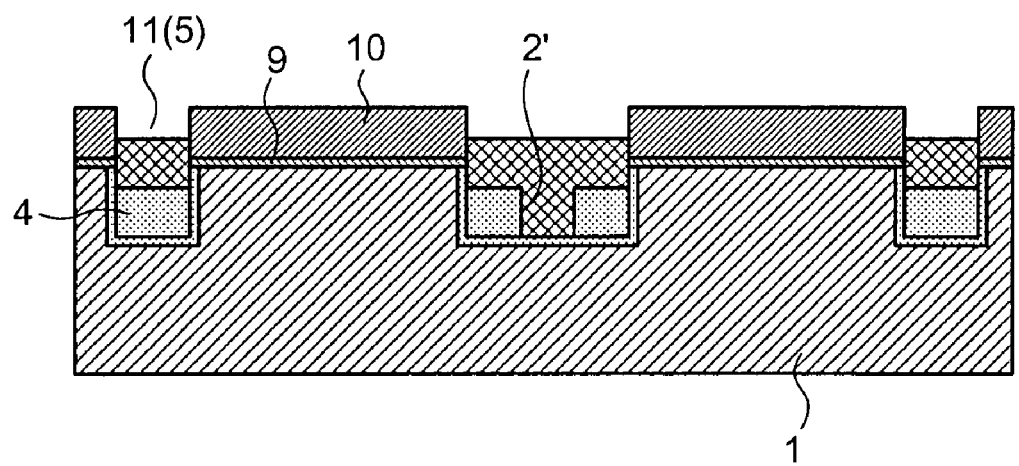
FIG. 78 is a cross-sectional view for explaining a process of manufacturing the semiconductor device according to the seventh embodiment.
Figure 79:
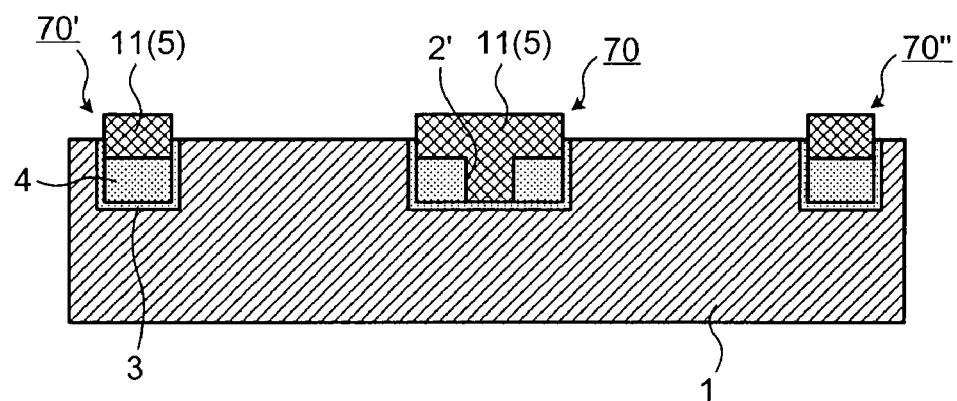
FIG. 79 is a cross-sectional view for explaining a process of manufacturing the semiconductor device according to the seventh embodiment.

Next, to adjust the height of the trench-type element isolation structures, a part of the surface of the cap oxide film 11 (the silicon oxide film 5) in the trench 2 is removed using hydrofluoric acid, so that the height of the surface of the cap oxide film 11 (the silicon oxide film 5) is adjusted as shown in FIG. 78. The silicon nitride film 10 is removed using thermal phosphoric acid, for example. Further, the silicon oxide film 9 is removed using hydrofluoric acid to complete the trench-type element isolation structures 70, 70', 70" as shown in FIG. 79.

Figure 80:
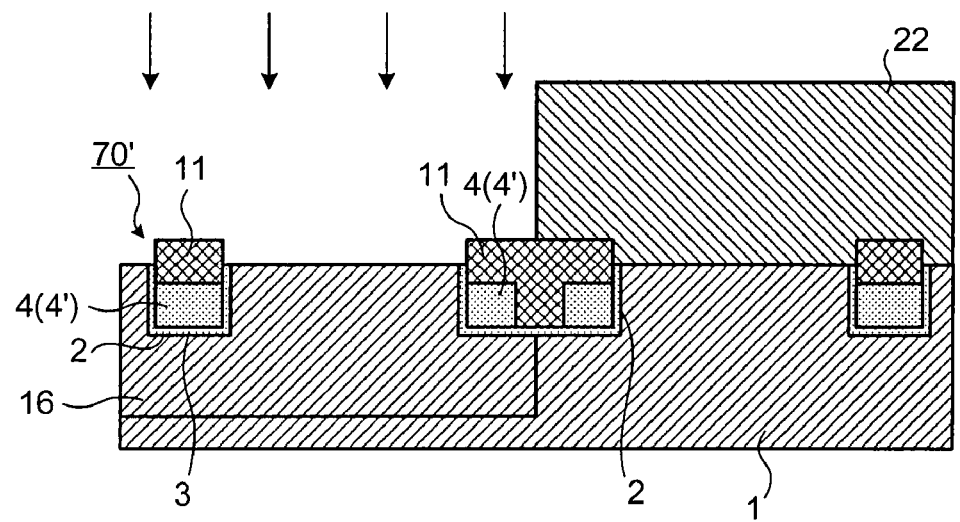
FIG. 80 is a cross-sectional view for explaining a process of manufacturing the semiconductor device according to the seventh embodiment.

Next, using a photoengraving technique, the resist 22 having an opening that becomes a region of the p-well region 16 is formed as shown in FIG. 80. Boron (B) ion is implanted at multiple stages by changing energy using the resist as a mask. As one example of the implanting condition, the following condition is set, that is, $1 \times 10^{13}/cm^2$ at 300 kiloelectron volts, $6 \times 10^{12}/cm^2$ at 100 kiloelectron volts, and $1 \times 10^{13}/cm^2$ at 10 kiloelectron volts. Based on this implantation, the lower end is formed in the p-well region 16 deeper than the lower surface of the trench 2. At the same time, boron (B) ion is also implanted into the polysilicon film 4 of the p-well region 16 to form the polysilicon film 4'.

Figure 81:
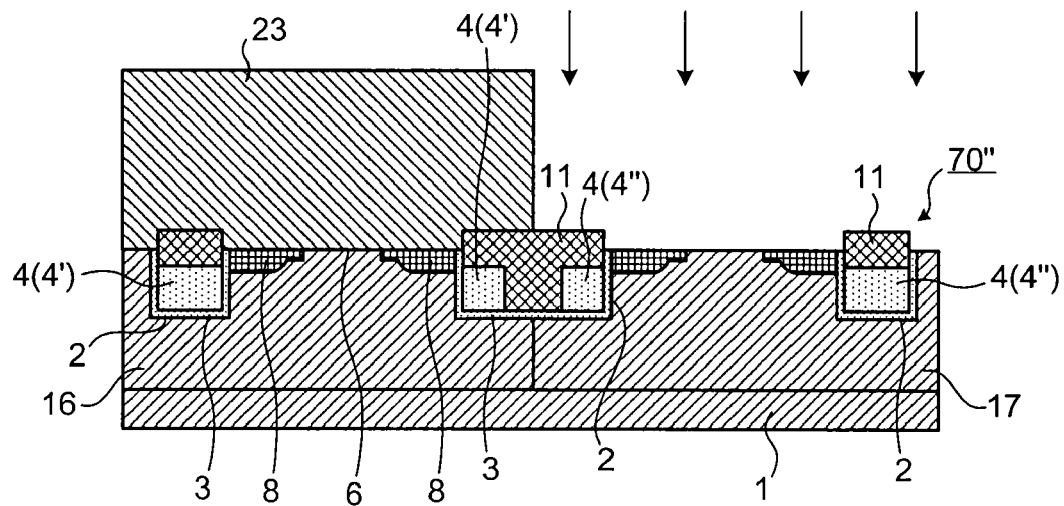
FIG. 81 is a cross-sectional view for explaining a process of manufacturing the semiconductor device according to the seventh embodiment.

Next, using a photoengraving technique, the resist 23 having an opening that becomes a region of the n-well region 17 is formed as shown in FIG. 81. Phosphor (P) ion is implanted at multiple stages by changing energy using the resist as a mask. As one example of the implanting condition, the following condition is set, that is, $1 \times 10^{13}/cm^2$ at 600 kiloelectron volts, $6 \times 10^{12}/cm^2$ at 300 kiloelectron volts, and $1 \times 10^{13}/cm^2$ at 30 kiloelectron volts. Based on this implantation, the lower end is formed in the n-well region 17 deeper than the lower surface of the trench 2. At the same time, phosphor (P) ion is also implanted into the polysilicon film 4" of the n-well region 17 to form the polysilicon film 4".

After the p-well region 16 and the n-well region 17 are completed, the gate insulating film 6 is formed on the silicon substrate 1, and a gate electrode material such as polysilicon and tungsten silicide is deposited on the gate insulating film 6, and a patterning is carried out to form the gate electrode 7, following the conventionally-known MOSFET (Metal Oxide Semiconductor Field Effect Transistor) formation process.

Figure 82:
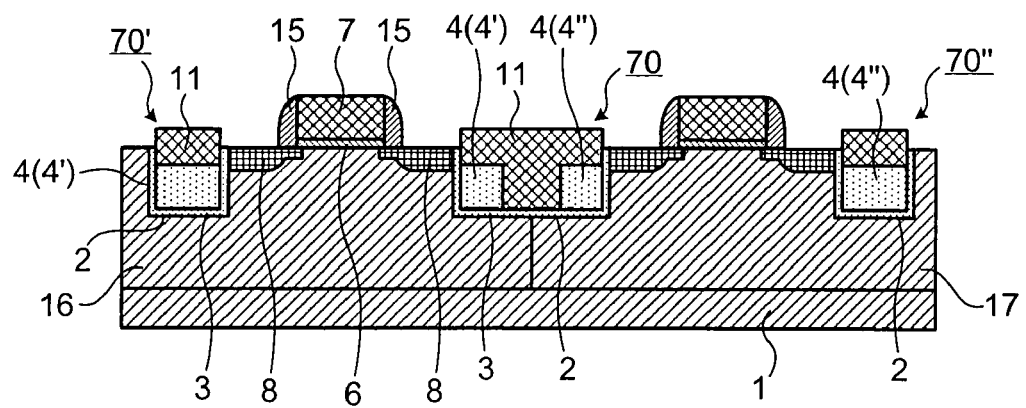
FIG. 82 is a cross-sectional view for explaining a process of manufacturing the semiconductor device according to the seventh embodiment.

By using the ion implantation method and by adjusting an implantation amount and implantation energy, a low-concentration impurity diffusion layer is formed on the gate electrode 7 in a self-aligned manner, and the sidewall 15 is formed on the sidewall of the gate electrode 7. Thereafter, a high-concentration impurity diffusion layer is formed at a position deeper than the low-concentration impurity diffusion layer to form the source/drain diffusion layer 8. In the present embodiment, the lower end of the source/drain region is adjusted to become lower than the height of the surface of the polysilicon film 4 filled in the trench 2 on the sidewall of the trench. The sidewall 15 is formed as shown in FIG. 82. In this case, using a photoengraving technique, an NMOS transistor is formed in the p-well region 16, and a PMOS transistor is formed in the n-well region 17, by separating conductivity of the impurities to be introduced.

Figure 83:
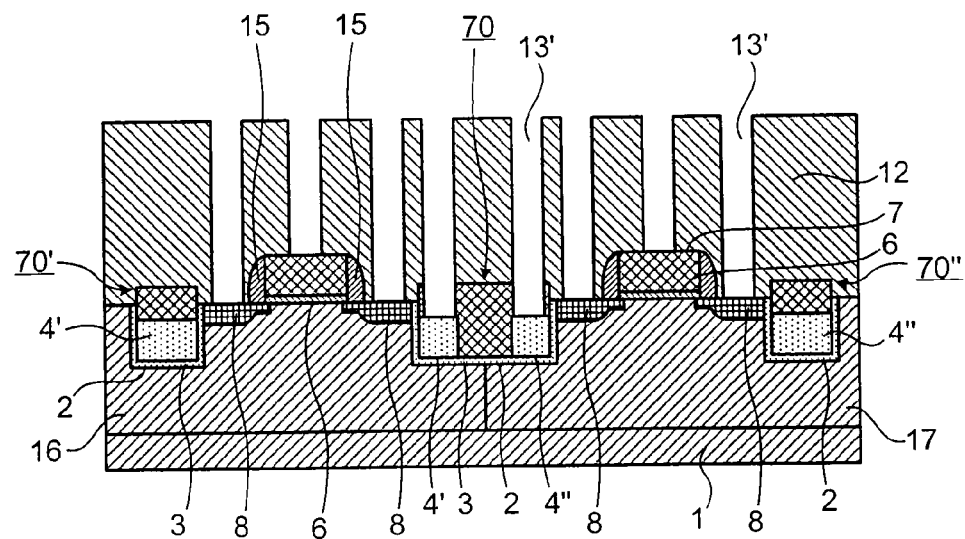
FIG. 83 is a cross-sectional view for explaining a process of manufacturing the semiconductor device according to the seventh embodiment.

The interlayer insulating film 12 including a silicon oxide film or a lamination film of a silicon oxide film and a silicon nitride film is formed on the silicon substrate 1. The contact holes 13 reaching the gate electrode 7, the source/drain diffusion layer 8, and the polysilicon film 4 filled in the trench-type element isolation structures 70, 70', 70" are formed as shown in FIG. 83. Tungsten is filled as a plug material into the contact holes 13, and the wiring layer 14 is formed by the damascene method. Thus, the semiconductor device as shown in FIG. 68 is manufactured.

In the method of manufacturing a semiconductor device according to the present embodiment, polysilicon in the trench 2 of the p-well region 16 is formed as the p-type polysilicon film 4' doped in the p-type, and polysilicon in the trench 2 of the n-well region 17 is formed as the n-type polysilicon film 4" doped in the n-type. In the trench-type element isolation structure 70, the polysilicon film 4' and the polysilicon film 4" having different conductivities are completely separated from each other. These polysilicon films 4 (4', 4") are connected to the wiring layer 14 via the contact 13, and can be fixed at different potentials.

With this arrangement, the semiconductor device according to the present embodiment achieves an effect that an optimum voltage can be applied to each of the trench-type element isolation structure in the p-well region 16 and the trench-type element isolation structure in the n-well region 17, in addition to the effects explained in the third, fifth, and sixth embodiments, thereby improving the isolation characteristics by the trench-type element isolation. Therefore, in the method of manufacturing a semiconductor device according to the present embodiment, a high-quality semiconductor device with excellent isolation characteristic can be manufactured.

Regarding the potential fixing region in the conductive layer, potential can be fixed for only one of the conductive layer in the region of the p-well region 16 and the conductive layer in the region of the n-well region 17. Regarding the potential fixing region in the conductive layer, a region in which potential is fixed and a floating region can be mixed in the same chip. In a fine isolation region of a peripheral circuit, for example, potential can be fixed, and a memory region having no space to form a contact can be set as a floating region.

Figure 84:
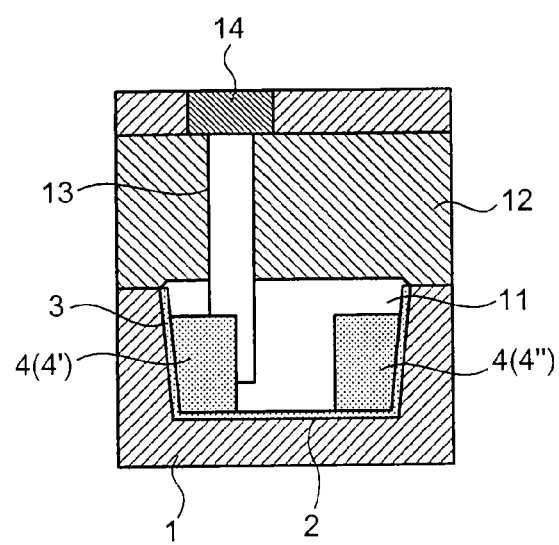
FIG. 84 is a cross-sectional view for explaining a process of manufacturing the semiconductor device according to the seventh embodiment.

FIG. 84 is a cross-sectional view of a modification of a connection between a conductive film and a wiring in the trench 2. In FIG. 84, the contact 13 for connecting between the polysilicon film 4 as a conductive layer and the wiring layer 14 is formed on at least a part of the upper part of the polysilicon film 4 as a conductive film in the trench 2 and a part of the sidewall of the polysilicon film 4. With this arrangement, a contact area between a plug material (conductive film) constituting the contact 13 and the polysilicon film 4 as a conductive film in the trench 2 becomes large, which enables a stable electric connection. As compared with the case of connecting between the plug material (conductive film) of the contact 13 and the polysilicon film 4 in the trench 2 on only the upper surface of the polysilicon film 4, a region in which the contact 13 overlaps the polysilicon film 4 in the trench 2 can be decreased, which enables less area of semiconductor chips and smaller semiconductor chips.

Figure 85:
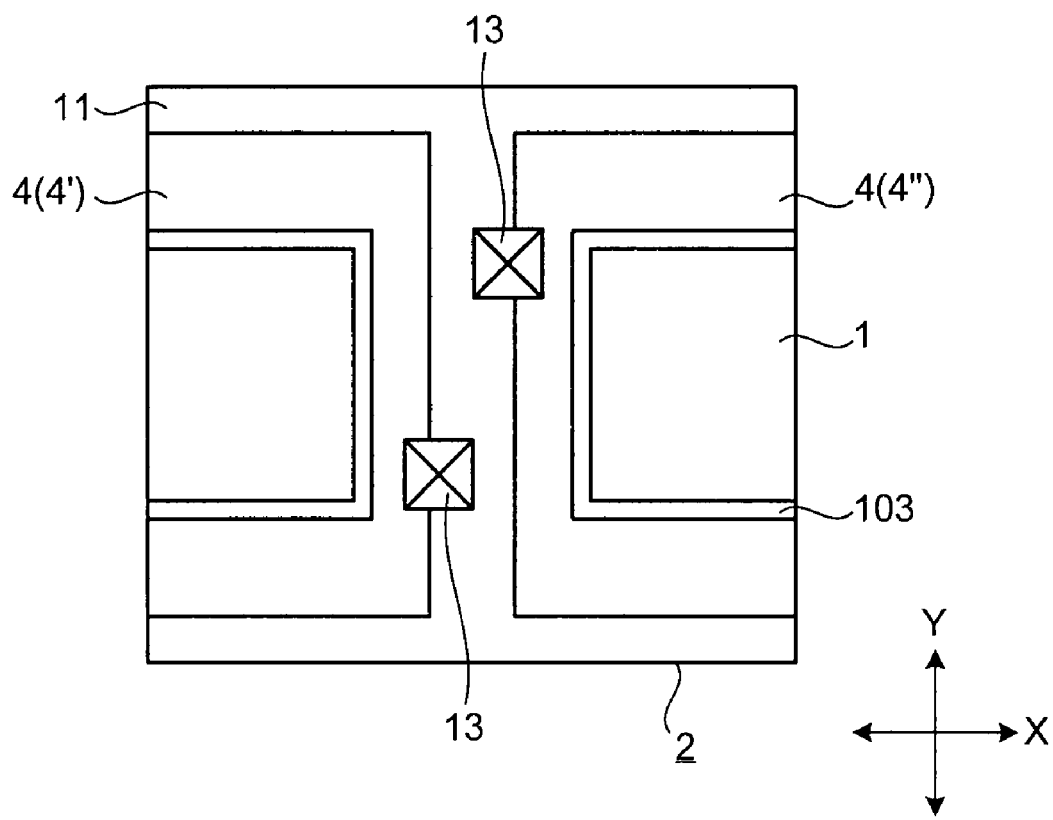
FIG. 85 is a cross-sectional view for explaining a process of manufacturing the semiconductor device according to the seventh embodiment.
Figure 86:
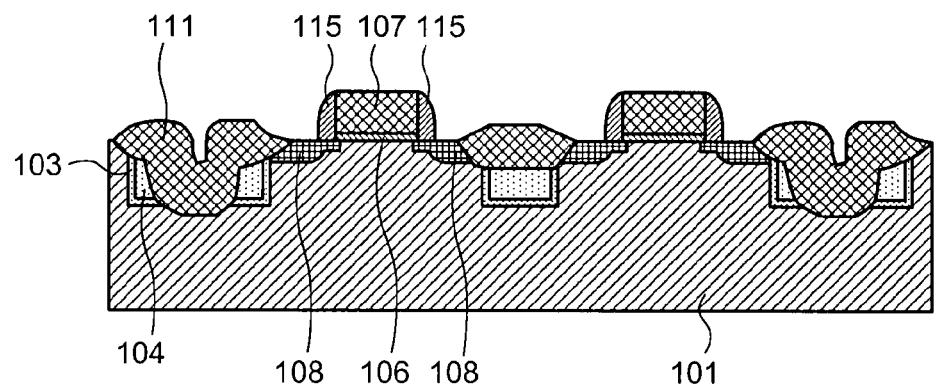
FIG. 86 is a cross-sectional view of a schematic configuration of a conventional semiconductor device.
Figure 87:
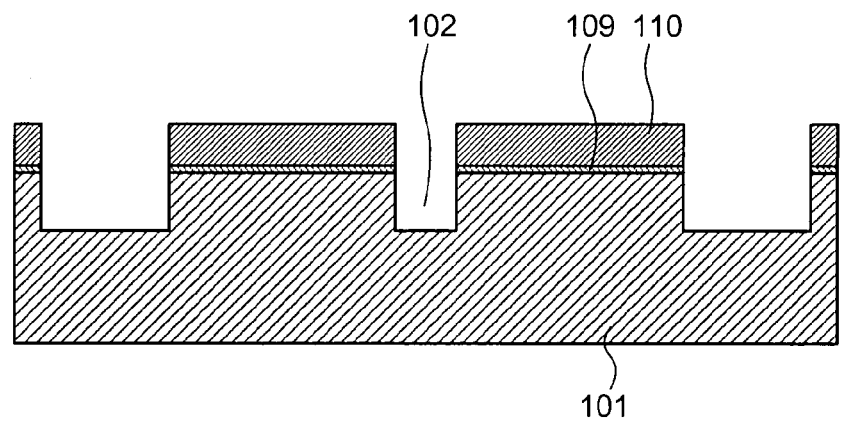
FIG. 87 is a cross-sectional view for explaining a process of manufacturing the conventional semiconductor device.
Figure 88:
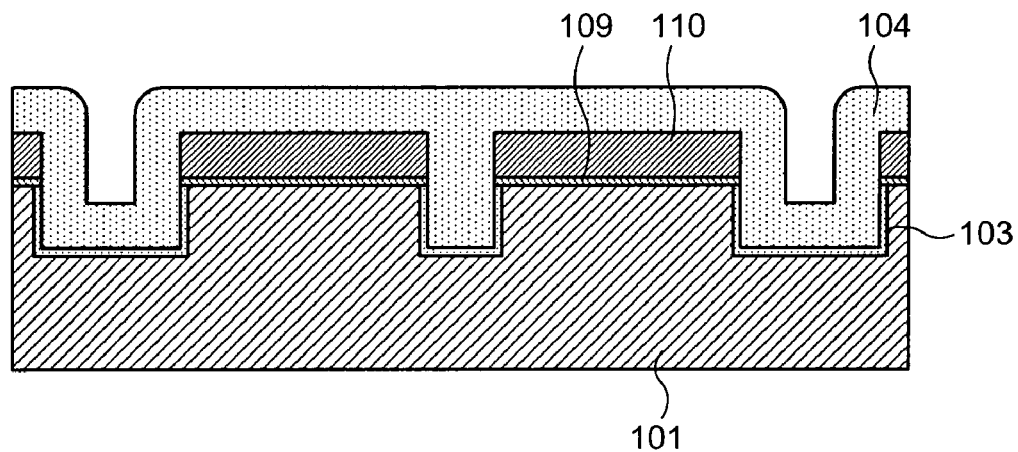
FIG. 88 is a cross-sectional view for explaining a process of manufacturing the conventional semiconductor device.
Figure 89:
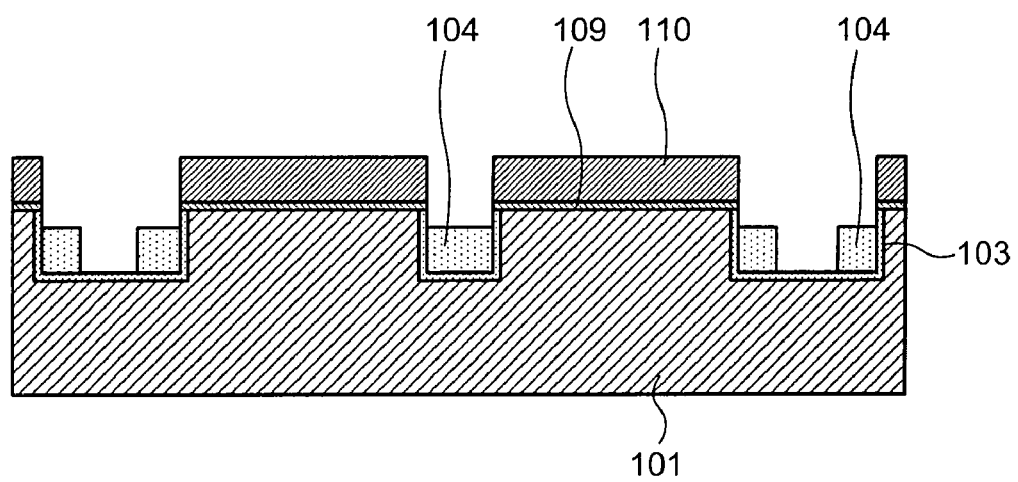
FIG. 89 is a cross-sectional view for explaining a process of manufacturing the conventional semiconductor device.
Figure 90:
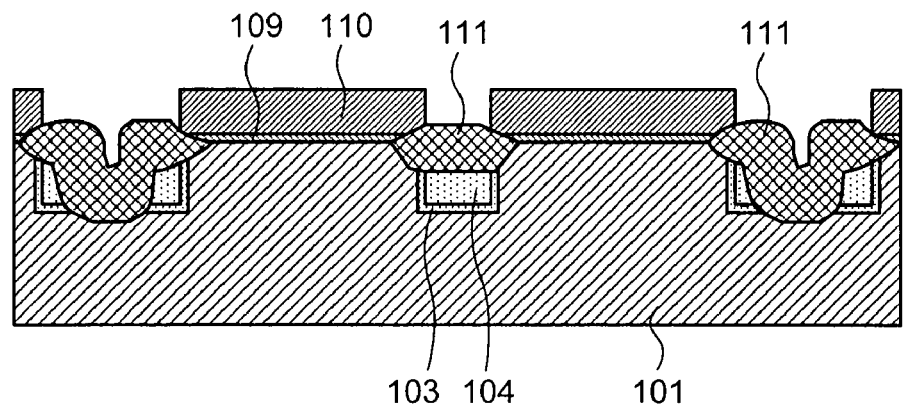
FIG. 90 is a cross-sectional view for explaining a process of manufacturing the conventional semiconductor device.
Figure 91:
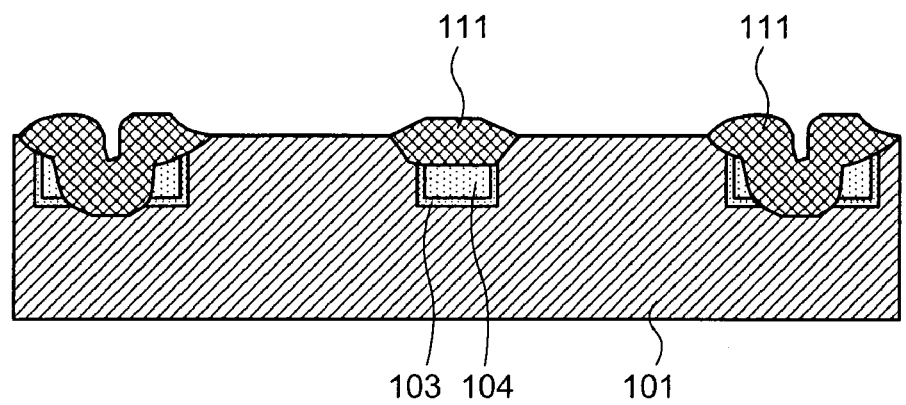
FIG. 91 is a cross-sectional view for explaining a process of manufacturing the conventional semiconductor device.

FIG. 85 is a top plan view of an example of a layout of the contact 13. In FIG. 85, as in the case shown in FIG. 84, the contact 13 for connecting between the polysilicon films 4 (4', 4") as conductive layers in the trench 2 and the wiring layer 14 is formed on at least a part of the upper part of the polysilicon films 4 (4', 4") and a part of the sidewall of the polysilicon films 4 (4', 4"). In this example, the contacts 13 are not on the same line in the side direction of the trench 2. In other words, the fact that the contacts 13 are not on the same line in a direction of a long side of the trench 2 (the X direction in FIG. 85) means that the contacts 13 are not positioned on the same line in a direction of a short side of the trench 2 (the Y direction in FIG. 85). Based on this structure, occurrence of penalty due to the formation of the contact 13 can be decreased. FIG. 85 is a view that a part of the wiring layer 14, the interlayer insulating film 12, and the cap oxide film 11 is transparent.

INDUSTRIAL APPLICABILITY

As described above, the method of manufacturing a semiconductor device according to the present invention is useful to manufacture a semiconductor device having a trench-type element isolation structure. Particularly, the method of manufacturing a semiconductor device is suitable for the manufacturing of a semiconductor device having a conductive film embedded in an element isolation trench to prevent potentials of adjacent elements from affecting other nodes via the embedded oxide film.

The invention claimed is:

1. A method of manufacturing a semiconductor device that includes an element isolation trench, the method comprising:
    forming a first layer on a substrate;
    etching the first layer and the substrate to form a trench in the substrate;
    thermally oxidizing an inner wall of the trench;
    depositing a first conductive film having a thickness equal to or larger than one half of width of the trench on the substrate including inside the trench;
    removing the first conductive film on the first layer by chemical mechanical polishing such that the first conductive film remains in only the trench;
    adjusting height of the first conductive film in the trench to be lower than a surface of the substrate by anisotropically etching the first conductive film;
    depositing an insulating film on the substrate by chemical vapor deposition to cover an upper surface of the first conductive film in the trench;
    flattening the insulating film by chemical mechanical polishing; and
    removing the first layer;
    oxidizing the substrate to form an oxide-semiconductor insulating film;
    forming a second conductive film on the oxide-semiconductor insulating film;
    patterning the second conductive film and the oxide-semiconductor insulating film;
    forming a first impurity diffusion layer with a first concentration that is self-aligned with the second conductive film in a region from the surface of the substrate to a first depth;
    forming sidewalls on sides of the second conductive film; and
    forming a second impurity diffusion layer with a second concentration higher than the first concentration that is self-aligned with the second conductive film and the sidewalls in a region to a second depth deeper than the first depth from the surface of the substrate, a lower edge of the second impurity diffusion layer being lower than an upper edge of the first conductive film at a side of the trench.

2. The method of manufacturing a semiconductor device according to claim 1, further comprising:
    forming an interlayer insulating film on the substrate;
    forming a contact hole that reaches the first conductive film in the interlayer insulating film;
    embedding a third conductive film in the contact hole; and
    forming a wiring layer on the interlayer insulating film such that the wiring layer is connected to the third conductive film.

3. The method of manufacturing a semiconductor device according to claim 1, wherein the adjusting includes reducing anisotropy of anisotropic etching so that the upper surface of the first conductive film is recessed.

4. The method of manufacturing a semiconductor device according to claim 1, further comprising etching the insulating film to adjust height of the insulating film after the flattening.

5. The method of manufacturing a semiconductor device according to claim 1, wherein
    the substrate is a silicon substrate, and
    the first layer is a silicon nitride film.

6. The method of manufacturing a semiconductor device according to claim 1, wherein the first conductive film is a film selected from a group consisting of a metal film, a metal nitride film, and a non-single crystal silicon film doped with a dopant.

7. A method of manufacturing a semiconductor device that includes an element isolation trench, the method comprising:

forming a first layer on a substrate;

etching the first layer and the substrate to form a trench in the substrate;

thermally oxidizing an inner wall of the trench;

depositing a semiconductor film on the substrate to fill the trench;

removing the semiconductor film on the first layer by chemical mechanical polishing such that the semiconductor film remains in only the trench;

adjusting height of the semiconductor film in the trench to be lower than a surface of the substrate by anisotropically etching the semiconductor film;

depositing an insulating film on the substrate by chemical vapor deposition to cover an upper surface of the semiconductor film in the trench;

flattening the insulating film by chemical mechanical polishing;

removing the first layer;

forming an impurity diffusion layer in a region from the surface of the substrate to a depth deeper than a bottom of the trench; and doping an impurity into the semiconductor film to form a first conductive film.

8. The method of manufacturing a semiconductor device according to claim 7, further comprising:

oxidizing the substrate to form an oxide-semiconductor insulating film;

forming a second conductive film on the oxide-semiconductor insulating film;

patterning the second conductive film and the oxide-semiconductor insulating film;

forming a first impurity diffusion layer with a first concentration that is self-aligned with the second conductive film in a region from the surface of the substrate to a first depth;

forming sidewalls on sides of the second conductive film; and forming a second impurity diffusion layer with a second concentration higher than the first concentration that is self-aligned with the second conductive film and the sidewalls in a region to a second depth deeper than the first depth from the surface of the substrate, a lower edge of the second impurity diffusion layer being lower than an upper edge of the first conductive film at a side of the trench.

9. The method of manufacturing a semiconductor device according to claim 7, wherein the substrate includes a first region and a second region, and the forming an impurity diffusion layer includes forming an impurity diffusion layer of a first conductivity type in the first region; and forming an impurity diffusion layer of a second conductivity type in the second region.

10. The method of manufacturing a semiconductor device according to claim 7, wherein the substrate includes a first region and a second region, the adjusting includes removing the semiconductor film at a substantially center of the bottom of the trench such that the semiconductor film remains near sides of the trench, the forming an impurity diffusion layer includes forming a first impurity diffusion layer of a first conductivity type in the first region; and forming a second impurity diffusion layer of a second conductivity type in the second region, and a boundary between the first impurity diffusion layer and the second impurity diffusion layer is located between remaining semiconductor films near the sides of the trench.

11. The method of manufacturing a semiconductor device according to claim 7, further comprising:

forming an interlayer insulating film on the substrate;

forming a contact hole that reaches the first conductive film in the interlayer insulating film;

embedding a second conductive film in the contact hole; and forming a wiring layer on the interlayer insulating film such that the wiring layer is connected to the second conductive film.

12. The method of manufacturing a semiconductor device according to claim 7, further comprising etching the insulating film to adjust height of the insulating film after the flattening.

13. The method of manufacturing a semiconductor device according to claim 7, wherein the substrate is a silicon substrate, and the first layer is a silicon nitride film.

14. The method of manufacturing a semiconductor device according to claim 7, wherein the semiconductor film is a non-single crystal silicon film.

15. A method of manufacturing a semiconductor device that includes an element isolation trench, the method comprising:

forming a first layer on a substrate;

etching the first layer and the substrate to form a trench in the substrate;

thermally oxidizing an inner wall of the trench;

depositing a first conductive film having a thickness equal to or larger than one half of width of the trench on the substrate including inside the trench;

removing the first conductive film on the first layer by chemical mechanical polishing such that the first conductive film remains in only the trench;

adjusting height of the first conductive film in the trench to be lower than a surface of the substrate by anisotropically etching the first conductive film;

depositing an insulating film on the substrate by chemical vapor deposition to cover an upper surface of the first conductive film in the trench;

flattening the insulating film by chemical mechanical polishing; and removing the first layer;

forming an interlayer insulating film on the substrate;

forming a contact hole that reaches the first conductive film in the interlayer insulating film;

embedding a second conductive film in the contact hole; and forming a wiring layer on the interlayer insulating film such that the wiring layer is connected to the second conductive film.

16. The method of manufacturing a semiconductor device according to claim 15, wherein the adjusting includes reducing anisotropy of anisotropic etching so that the upper surface of the first conductive film is recessed.

17. The method of manufacturing a semiconductor device according to claim 15, further comprising etching the insulating film to adjust height of the insulating film after the flattening.

18. The method of manufacturing a semiconductor device according to claim 15, wherein
the substrate is a silicon substrate, and
the first layer is a silicon nitride film.

19. The method of manufacturing a semiconductor device according to claim 15, wherein the first conductive film is a film selected from a group consisting of a metal film, a metal nitride film, and a non-single crystal silicon film doped with a dopant.

* * * * *